United States Patent [19]
Tilghman et al.

[11] Patent Number: 4,669,082
[45] Date of Patent: May 26, 1987

[54] METHOD OF TESTING AND ADDRESSING A MAGNETIC CORE MEMORY

[75] Inventors: Stephen E. Tilghman; Richard L. Duncan, both of Duncan, Okla.; Bruce A. Kaufman, Van Nuys, Calif.

[73] Assignee: Halliburton Company, Duncan, Okla.

[21] Appl. No.: 732,468

[22] Filed: May 9, 1985

[51] Int. Cl.⁴ .................. G06F 11/10; G11C 29/00
[52] U.S. Cl. .................................. 371/21; 365/201; 371/11
[58] Field of Search ............... 371/21, 20, 25, 11; 365/201; 324/73 R

[56] References Cited

U.S. PATENT DOCUMENTS

| | | | |
|---|---|---|---|
| 4,012,712 | 3/1977 | Nelligan | 340/857 |
| 4,061,908 | 12/1977 | de Jonge et al. | 371/21 |
| 4,310,901 | 1/1982 | Harding et al. | 371/21 X |
| 4,456,995 | 6/1984 | Ryan | 371/21 |
| 4,464,750 | 8/1984 | Tatematsu | 371/21 |
| 4,479,214 | 10/1984 | Ryan | 371/11 |
| 4,520,453 | 5/1985 | Chow | 371/11 X |

OTHER PUBLICATIONS

Rogers, Checking Random-Access Memory, IBM Technical Disclosure Bulletin, vol. 20, No. 10, Mar. 1978, pp. 4173–4174.

*Primary Examiner*—Charles E. Atkinson
*Attorney, Agent, or Firm*—Joseph A. Walkowski; E. Harrison Gilbert, III

[57] ABSTRACT

A method of testing a magnetic core memory includes writing a test bit to each storage location addressed by each X-drive/X-sink transistor pair and each Y-drive/Y-sink transistor pair to determine which transistor or transistors of each pair is or are inoperable. Once this determination is made, a memory status map is created designating the inoperable transistors. Thereafter, the map contents are converted into an address field for matching against a selected memory address. If the selected memory address calls for an inoperable transistor, as indicated by a comparison with the address field, this is detected and the address changed until only operable transistors are accessed.

4 Claims, 45 Drawing Figures

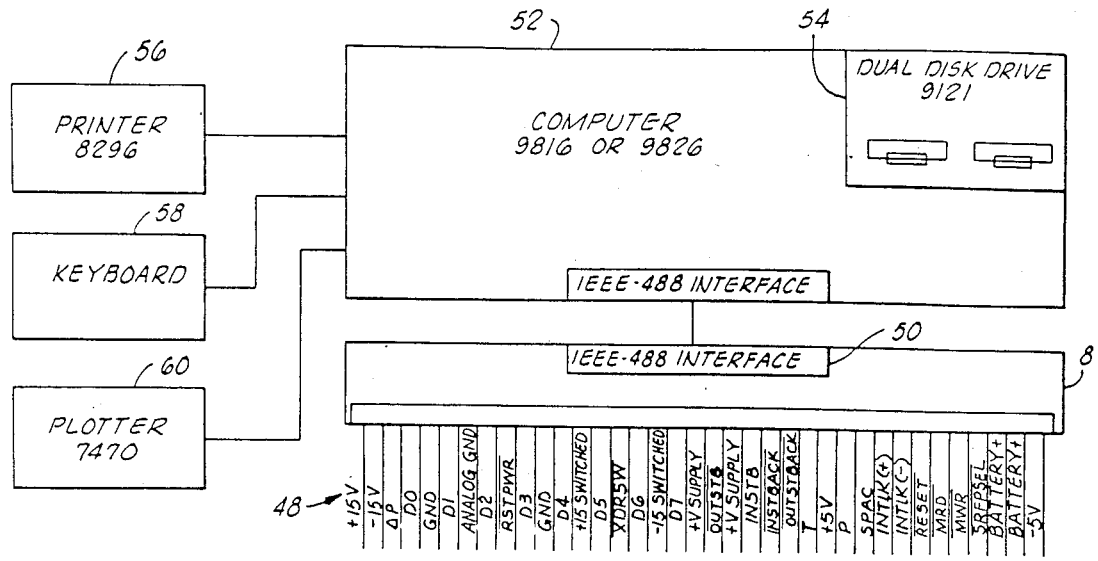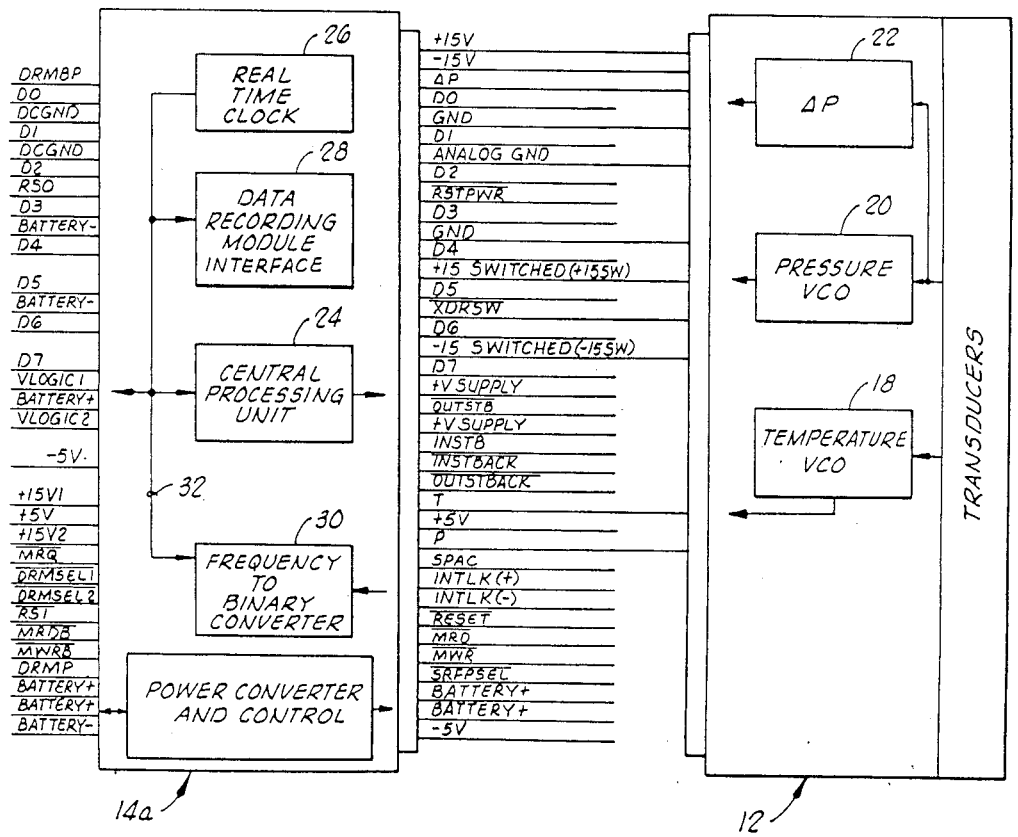
FIG. 2B

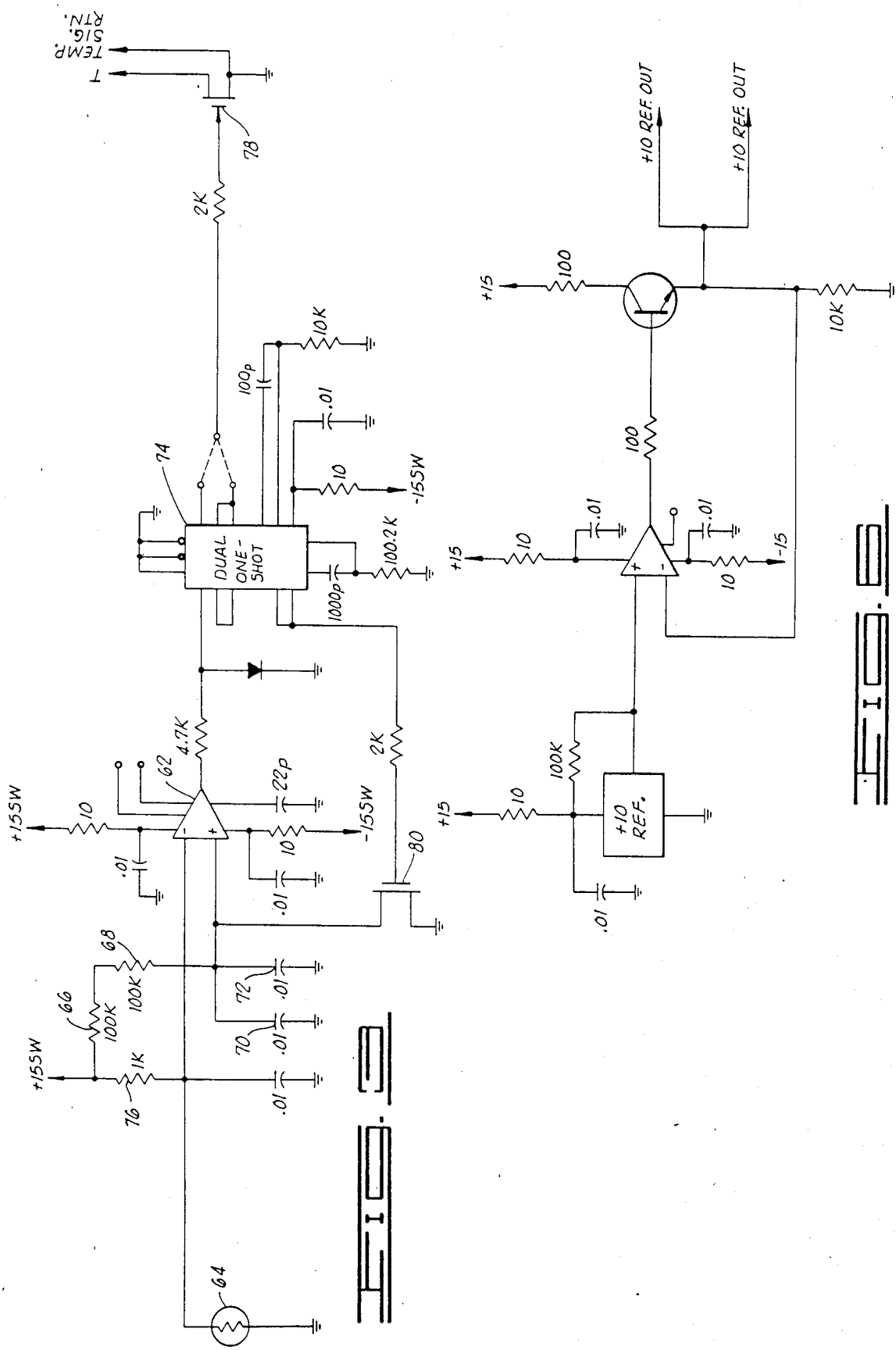

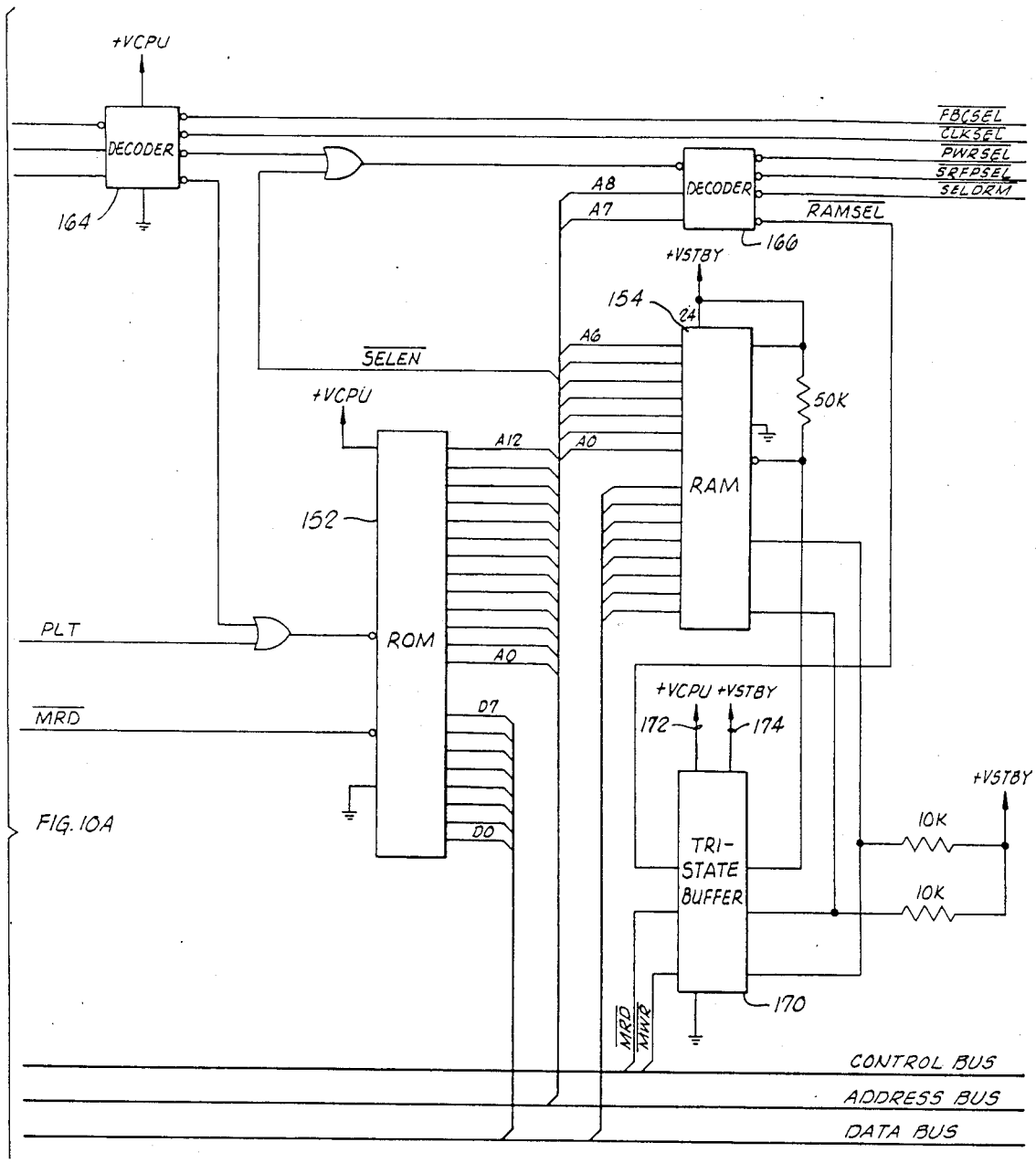

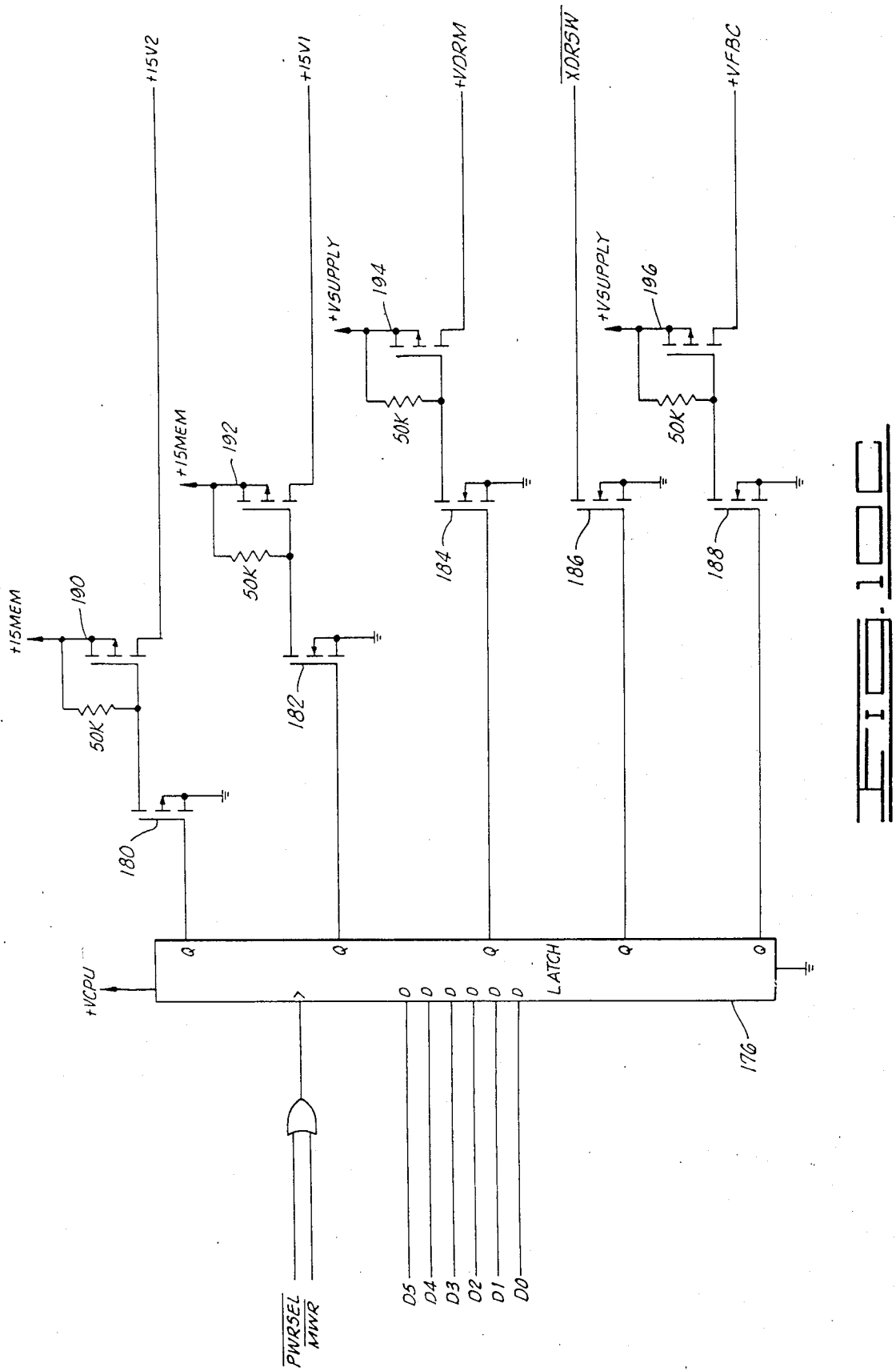

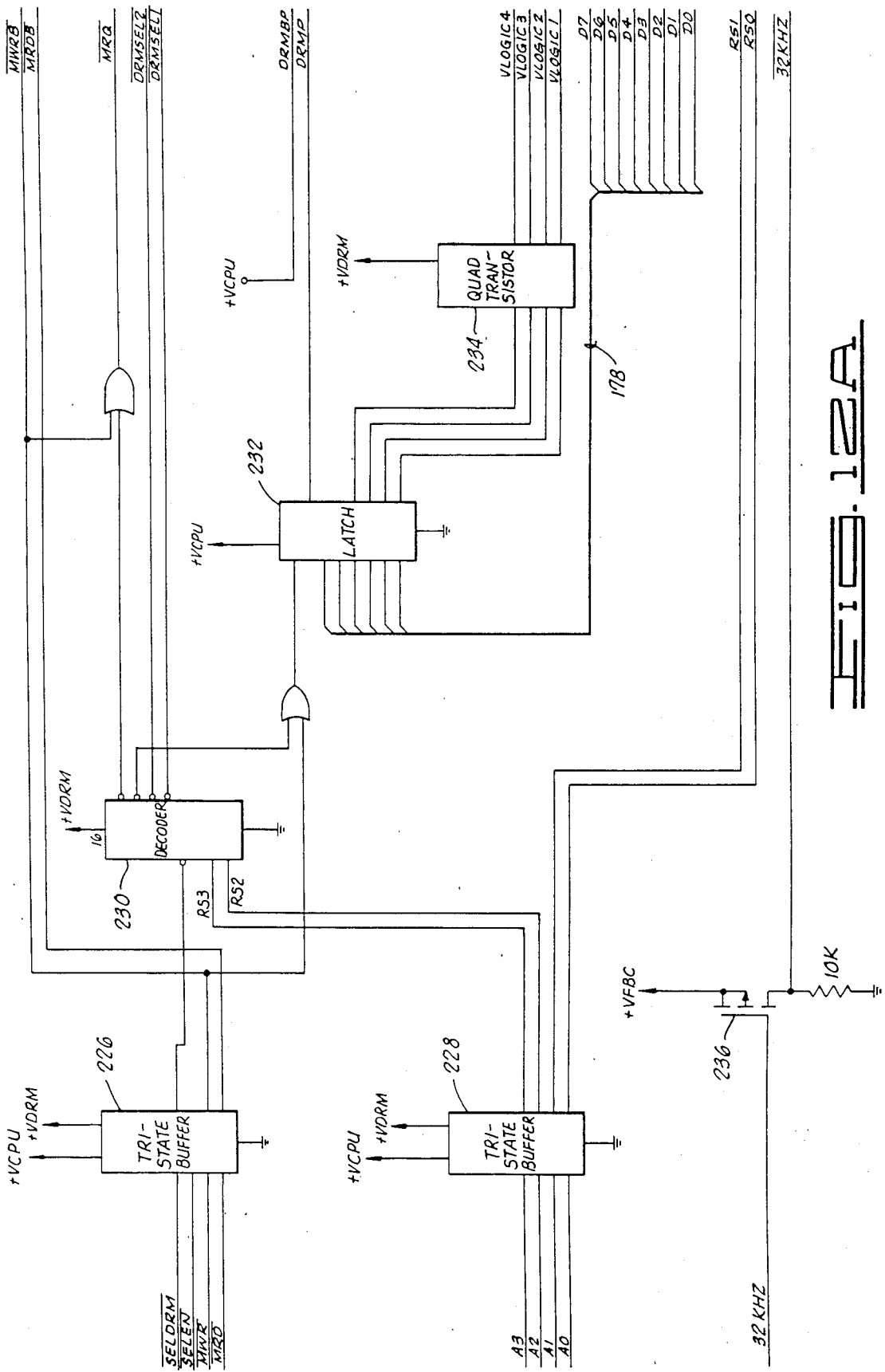

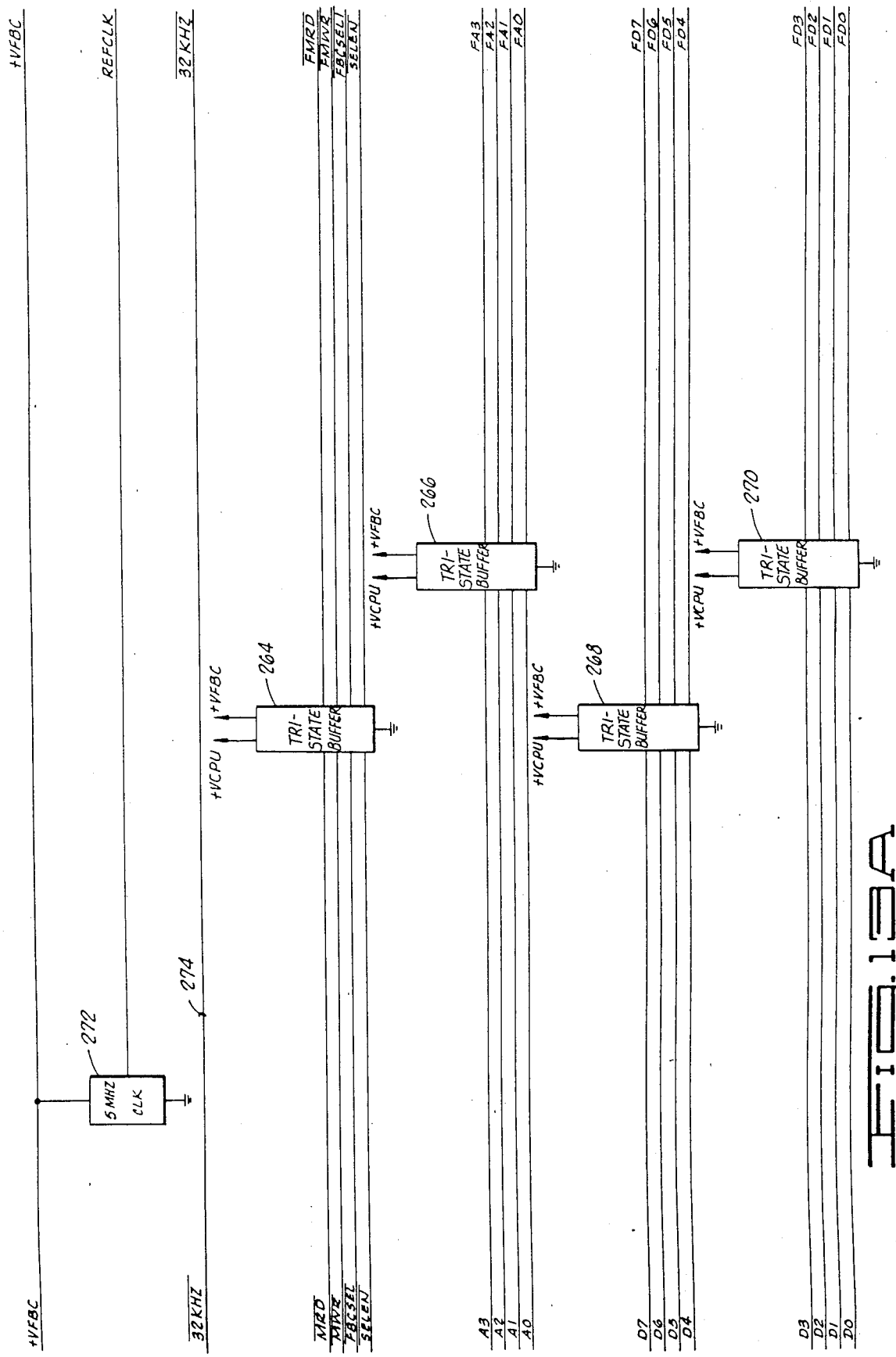

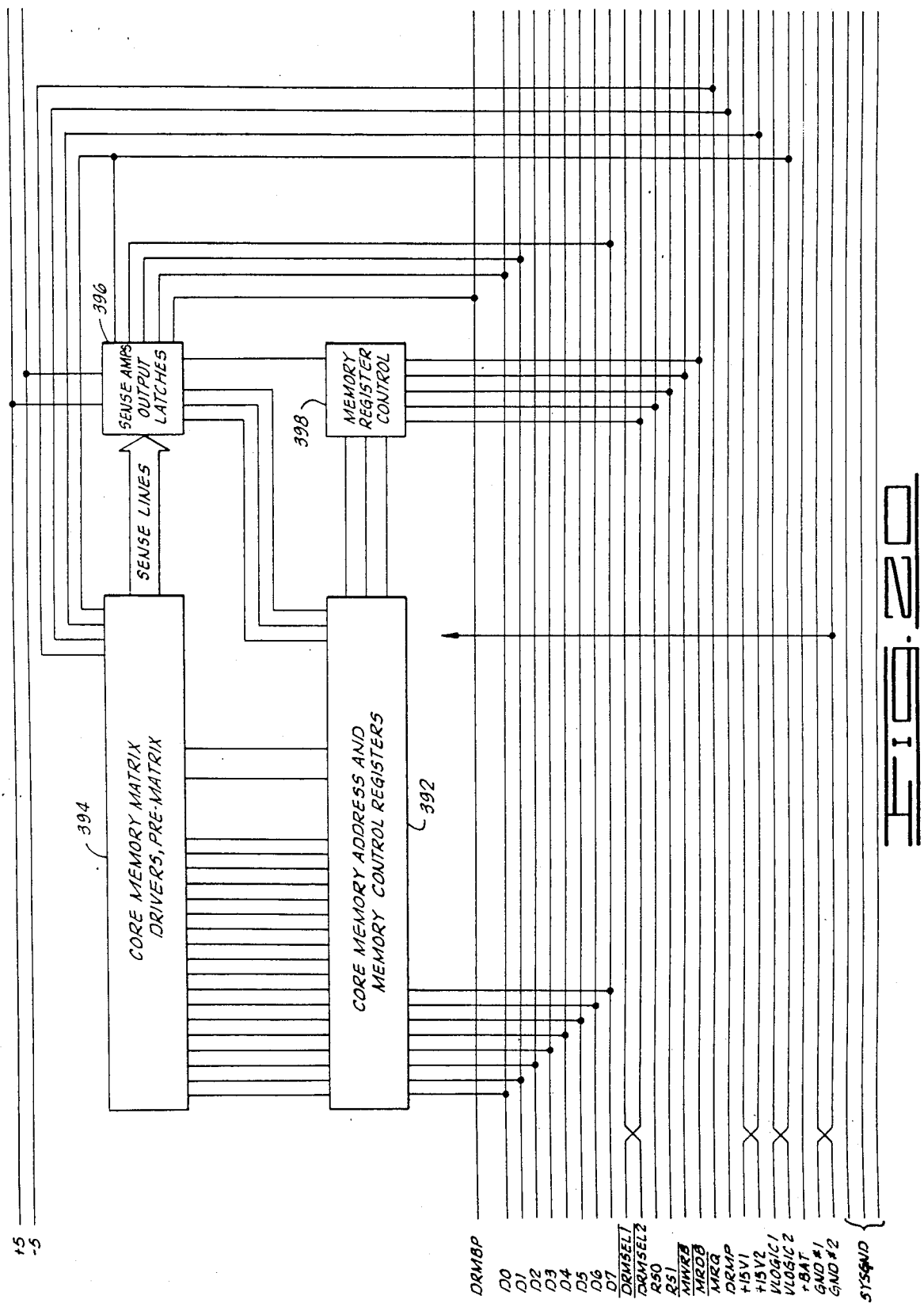

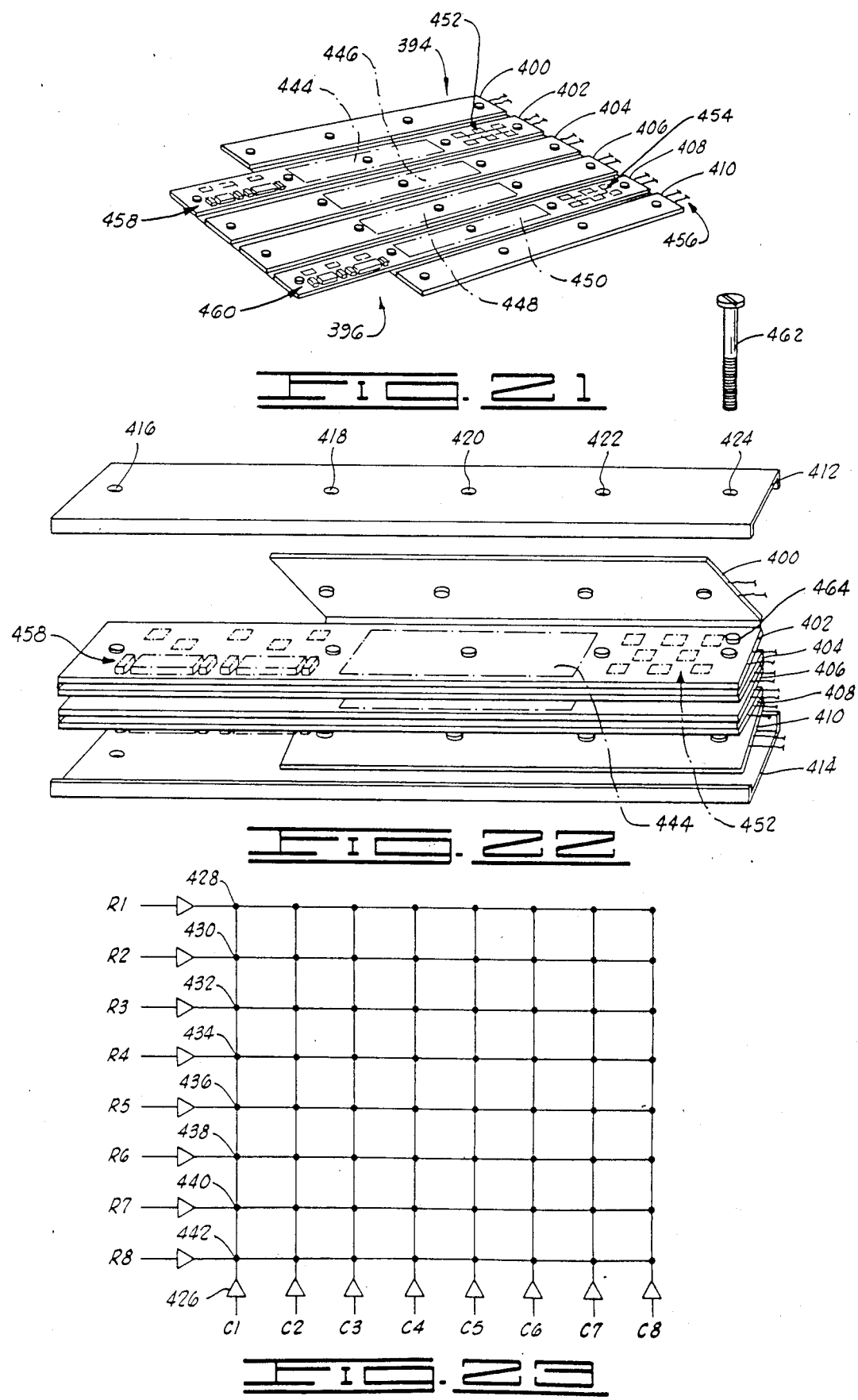

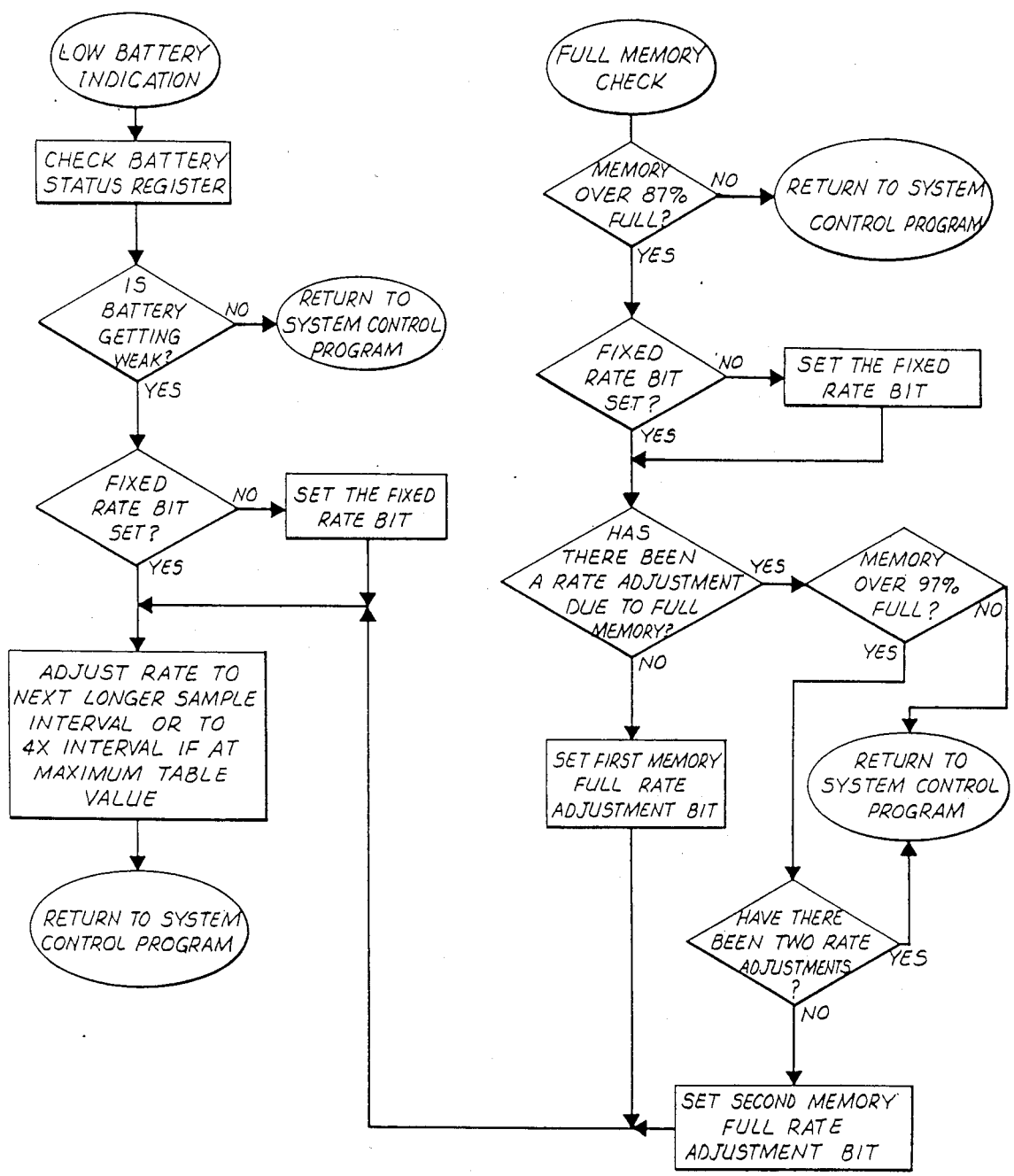

METHOD OF TESTING AND ADDRESSING A MAGNETIC CORE MEMORY

BACKGROUND OF THE INVENTION

This invention relates generally to a method of testing and addressing a magnetic core memory and more particularly, but not by way of limitation, to a method of determining which, if any, of the X-drive transistors, X-sink transistors, Y-drive transistors and Y-sink transistors is or are inoperable and thereafter controlling the address of the memory to avoid inoperable ones of the transistors and thus unusable memory locations.

It is well known in the art that there is a need for apparatus which can measure environmental conditions or physical phenomena, such as pressure and temperature, in downhole locations within a well bore. The Bourdon tube is well known and has been used for many years to mechanically record pressure by means of a chart scribed on a metallic plate in response to pressure. Electronic recording gauges have also been used in well bores. In one type of electronic gauge, the information is obtained and substantially immediately transmitted to the surface, such as over a wire line, for real-time display. Another type of electronic gauge obtains and stores the information within itself downhole for use only after the gauge has been extracted from the well bore.

Although several different types of gauges have been proposed or used in the industry, we are not aware of any gauge which accommodates several different transducers having different output signal characteristics. Nor are we aware of a microprocessor-based gauge which monitors itself to insure it is operating within normal limits, and which permits sample rates and resolutions to be varied in response to both software and hardware monitored changes in the downhole pressure (or other monitored condition) and to changes in battery life and remaining memory capacity, and which can be automatically selectively powered down, and which has increased storage capacity achieved with highly reliable, duty-cycled for low power consumption, magnetic core memory densely packed in a folded configuration. Likewise, we do not know of any such apparatus which permits such increased storage capacity to be accessed with a bit-by-bit technique that reduces the chances of losing complete words of stored information should there be a failure within the storage elements. We are not aware of any such apparatus which can determine which, if any, memory cells are inoperable and which thereafter does not attempt to store information in those bad memory cells. Although to out knowledge there is not a downhole apparatus having each of the foregoing features, such an apparatus is needed because of the following advantages which are or can be obtained by appropriately implementing these features as is done in the present invention.

A gauge which accommodates different types of transducers is needed to provide flexibility of use since a single downhole gauge is used in different locations where certain types of transducers may not be available and for different customers who may specify different types of transducers.

Self-monitoring is an important feature in a microprocessor-based gauge because it enables the microprocessor to be reset should the microprocessor operate outside normal operating limits. This insures accurate data collection.

The software and hardware features by which sample rates and resolutions of the samples can be changed are important for at least two reasons. The software monitoring is important because it effectively increases the length of time over which samples can be obtained by reducing the sample rate when there is little or no change between or among consecutive samples of a parameter or when changes are substantially linear. The hardware monitoring is important because it detects, and forces the gauge to record, rapid changes which occur between the software set sample times and which thus would otherwise be lost. Adjusting the sample rate based upon the remaining battery life and memory insures that meaningful information is always obtained and properly stored. Theoretically, it is desirable to slow the sample rate sufficiently so that samples are obtained and stored without ever totally exhausting the battery life or the memory capacity prior to the time the apparatus is withdrawn from the well bore and deactivated. Having a selectable resolution is important so that suitable precision is obtained at each sample rate.

The feature of automatically selectively powering down selectable parts of the apparatus is important because it conserves the remaining battery life. Section selectability maximizes the conservation at any one time by powering only those sections which need to be operated at that time. Selective power down of substantially the entire tool both at scheduled times and at unscheduled times when nothing significant is happening further assists in energy conservation.

Having an increased storage capacity is critical in an apparatus which is to be placed downhole and left for extended periods of time without having the information immediately transmitted to the surface. Because monitoring which needs to be done in a downhole environment might extend over several hours or days, a large storage capacity is needed to retain all the necessary samples required to perform the analyses which are to be made with the information as known to the art.

The specific bit-by-bit technique for using the memory in the downhole environment is important to prevent lost information and, therefore, to prevent lost time and money in obtaining valid samples. Knowing those locations within a memory device which are inoperable at the time the memory is made or subsequently tested, but prior to introducing it into the downhole environment, is advantageous so that, once the device is downhole, information will not be written into, and thus not be lost from, such bad locations, preventing lost time and money in obtaining valid samples.

Although there are several types of gauges which have been proposed or used for recording information in a downhole environment, we are not aware of one which meets each of the foregoing needs in a single apparatus.

SUMMARY OF THE INVENTION

The present invention overcomes the above-noted and other shortcomings of the prior art by providing a novel and improved method of testing and addressing a magnetic core memory.

The present invention claimed herein provides a method by which location selection elements, such as drive and sink transistors, for accessing memory storage locations within a magnetic core memory are tested for operability and of thereafter controlling the address of the magnetic core memory to avoid inoperable ones of the elements. The method includes the steps of:

(a) operating a first set of the location selection elements to access a first storage location;
(b) writing a bit to the first storage location;
(c) sensing whether the bit has been successfully written into the first storage location;
(d) performing a failure isolation test on the location selection elements to determine which of the elements is inoperable if the bit has not been successfully written into the first storage location; and
(e) repeating steps (a) through (d) for other sets of location selection elements and corresponding storage locations until each of the location selection elements has been tested.

Once the inoperable elements are identified, the method further comprises storing in the magnetic core memory a record identifying the inoperable elements for subsequent use in controlling the addressing by a computer of the storage locations when the magnetic core memory is connected in the computer.

The method of the preferred embodiment more particularly comprises the steps of:

(a) initializing an address means for addressing X-drive transistors, X-sink transistors, Y-drive transistors and Y-sink transistors to a respective start address for the X-drive transistors, the X-sink transistors, the Y-drive transistors, and the Y-sink transistors so that one X-drive transistor, one X-sink transistor, one Y-drive transistor and one Y-sink transistor are initially addressed;
(b) writing a bit to the magnetic core memory element selected by the addressed X-drive transistor, X-sink transistor, Y-drive transistor and Y-sink transistor;
(c) sensing whether the bit has been successfully written during step (b);
(d) if the bit has not been successfully written during step (b) as sensed by step (c), performing a failure isolation test on the addressed X-drive transitor and the X-sink transistor to determine which of these transistors is defective;
(e) controlling the address means to select the next pair of X-drive and X-sink transistors and repeating steps (b) through (e) until all the X-drive transistors and X-sink transistors have been tested;
(f) after step (e), resetting the address means to the respective start address for the X-drive transistors, the X-sink transistors, the Y-drive transistors, and the Y-sink transistors;
(g) writing a bit to the magnetic core memory element selected by the initially addressed X-drive transistor, X-sink transistor, Y-drive transistor and Y-sink transistor;
(h) sensing whether the bit has been successfully written during step (g);
(i) if the bit has not been successfully written during step (g) as sensed during step (h), performing a failure isolation test to determine whether the addressed Y-drive transistor or the Y-sink transistor is defective; and
(j) controlling the address means to select the next pair of Y-drive and Y-sink transistors and repeating steps (g) through (j) until all of the Y-drive and Y-sink transistors have been tested.

The step of performing a failure isolation test on the X-drive and X-sink transistors includes the steps of:

(k) controlling the address means so that the address of the X-sink transistor is changed to a previous address of an X-sink transistor that has already passed the test performed during steps (b) through (e);
(l) writing a bit to the magnetic core memory element selected by the addressed X-drive transistor and the newly addressed X-sink transistor;
(m) controlling the address means to return to the address of the X-sink transistor from which the address change occurred during step (k);
(n) sensing whether the bit has been successfully written during step (l);
(o) if the bit has not been successfully written during step (l) as sensed during step (n), setting a drive failure bit in a drive memory status register to indicate the X-drive transistor is defective and returning to step (e);
(p) if the bit has been successfully written during step (l) as sensed during step (n), controlling the address means so that the address of the X-drive transistor is changed to a previous address of an X-drive transistor that has already passed the test performed during steps (b) through (e);
(q) writing a bit to the magnetic core memory element selected by the addressed X-sink transistor and the newly addressed X-drive transistor;
(r) controlling the address means to return to the address of the X-drive transistor from which the address change occurred during step (p);
(s) sensing whether the bit has been successfully written during step (q);
(t) if the bit has not been successfully written during step (q) as sensed during step (s), setting a sink failure bit in a sink memory status register to indicate the X-sink transistor is defective and returning to step (e);
(u) if the bit has been successfully written during step (q) as sensed during step (s), writing another bit to the magnetic core memory element selected by the X-drive transistor and X-sink transistor addressed prior to performing step (d);
(v) sensing whether the bit has been successfully written during step (u) and returning to step (e) if it has; and
(w) if the bit has not been successfully written during step (u) as sensed during step (v), setting both the sink and drive failure bits in the respective memory status registers.

The failure isolation test for the Y-drive and Y-sink transistors is similar to the one for the X-drive and X-sink transistors.

Once the foregoing steps have been performed, the method utilizes the information to obtain an address which does not select the inoperable drive or sink transistors. In the preferred embodiment this is accomplished by grouping the predetermined number of binary bits defining a memory address into four groups, each of which groups contains the address of a respective one of the X-drive, X-sink, Y-drive and Y-sink transistors; converting each inoperable-transistor-designating entry in status maps defined in the memory status registers into a respective address pattern, each respective pattern representing the address of the inoperable transistor; and comparing each respective address pattern with the address defined by the bits in the corresponding respective one of the four groups of the predetermined number of binary bits defining the memory address and detecting when a respective address pattern matches the address in the corresponding respective one of the four groups to determine whether an inoperable transistor is addressed by the new memory address and changing the addesss if one is.

Therefore, from the foregoing, it is a general object of the present invention to provide a novel and improved method of testing and addressing a magnetic core memory. Other and further objects, features and advantages of the present invention will be readily apparent to those skilled in the art when the following description of the preferred embodiment is read in conjunction with the accompanying drawings.

BRIEF DESCRIPTION OF THE DRAWINGS

FIGS. 2A and 2B are a block diagram of the interface and computer system shown in FIG. 1 and of the downhole gauge which is shown to include a transducer section, a controller/power converter and control/memory section, and a battery section.

FIG. 3 is a schematic circuit diagram of the preferred embodiment of the temperature VCO circuit shown in FIG. 2 as forming part of the transducer section.

FIG. 6 is a schematic circuit diagram of the preferred embodiment of a +10-volt reference circuit contained within the transducer section.

FIGS. 10A–10C are a schematic circuit diagram of the preferred embodiment of a central processing unit circuit of the controller portion of the controller/power converter and control/memory section.

FIG. 12A is a schematic circuit diagram of the preferred embodiment of a data recording module interface circuit of the controller portion of the controller/power converter and control/memory section.

FIGS. 13A–13C are a schematic circuit diagram of the preferred embodiment of a frequency-to-binary conversion circuit of the controller portion of the controller/power converter and control/memory section.

FIG. 20 is a schematic circuit diagram of the preferred embodiment of a magnetic core memory circuit of the memory portion of the controller/power converter and control/memory section.

FIG. 21 is a perspective view of the magnetic core memory shown in an unfolded configuration.

FIG. 22 is an exploded view showing the magnetic core memory in partially folded configuration between its upper and lower housing parts.

FIGS. 25A–25B disclose a flow chart of the preferred embodiment of a sample rate change control program which responds to software-detected changes in the monitored conditions as well as to hardware-detected rapid pressure changes.

FIG. 26 discloses a flow chart of the preferred embodiment of a sample rate modification program for modifying the sample rate in response to a low battery indication or a substantially full memory indication.

DETAILED DESCRIPTION OF THE PREFERRED EMBODIMENTS

Figure 1:
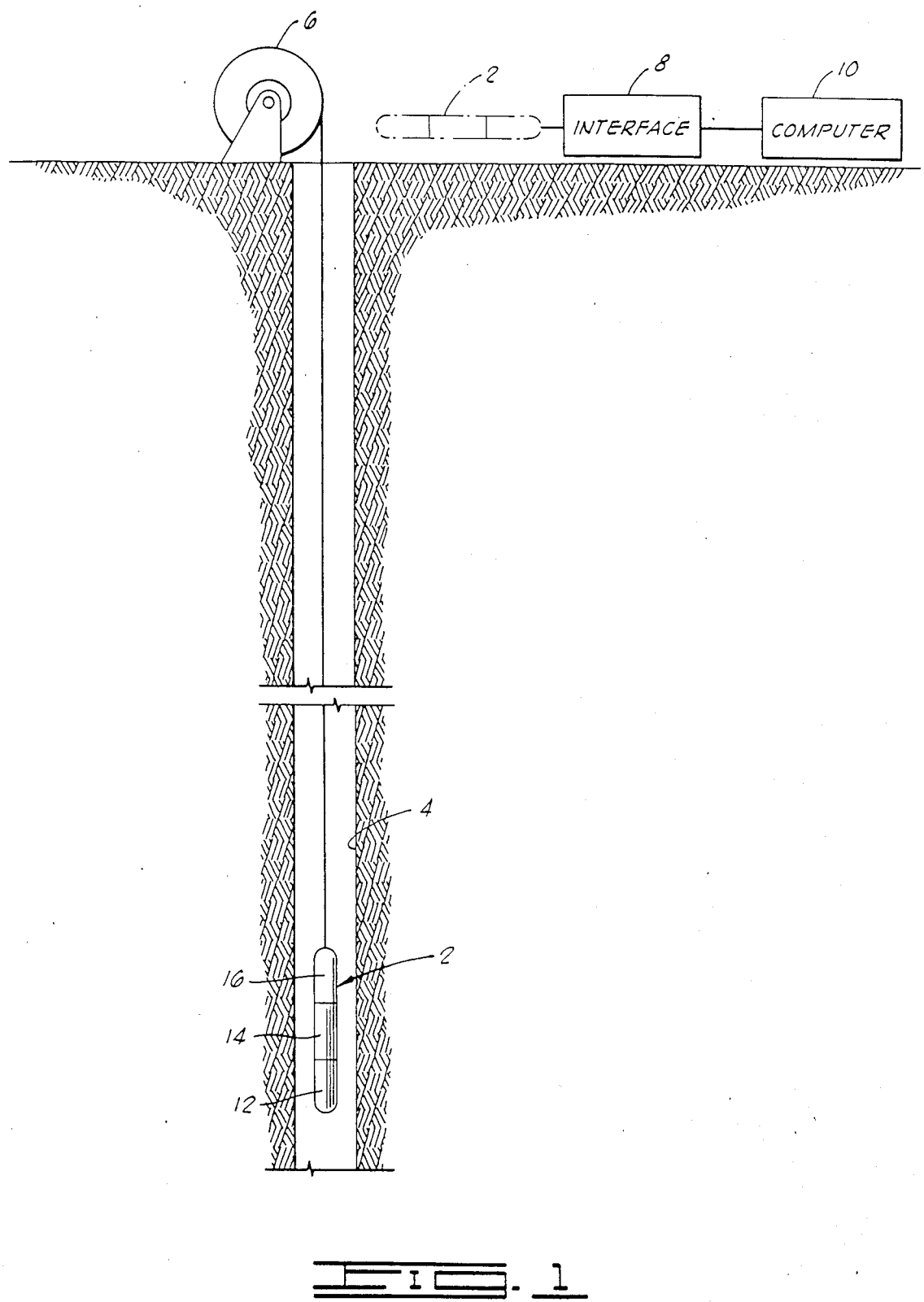
FIG. 1 is a schematic illustration of a self-contained downhole gauge of the present invention shown in a downhole location and, in dot-dash lines, in a surface location connected by an interface to a computer.

FIG. 1 shows a self-contained downhole gauge 2 disposed in a well bore 4 by a suitable hoisting or tool carrier means 6 of a type as known to the art. For example, the means 6 can be a wire line (although there are no electrical communications over the wire line between the surface and the downhole location of the gauge 2 in the preferred embodiment) or a drill string of which the gauge 2 is a part and which is raised and lowered such as by the draw works and travelling block as known to the art. The self-contained gauge 2 is constructed in accordance with the preferred embodiment as will be more particularly described hereinbelow with reference to the remaining drawings.

FIG. 1 also shows, in dot-dash outline, the gauge 2 located at the surface and connected by an electronic interface 8 to a computer system 10. Because in the preferred embodiment communications do not occur between the surface and the gauge 2 when the gauge 2 is located in the well bore 4, the interface 8 and the computer system 10 are used to communicate with the gauge 2 when it is at the surface. Such communications can occur, prior to lowering the gauge 2 into the hole, for the purpose of entering information or presetting variables within the gauge 2 or, after the gauge 2 has been withdrawn or extracted from the well bore 4, for reading the stored information from the gauge 2 into the computer system 10 so that the information can be analyzed, for example.

Figure 2A:
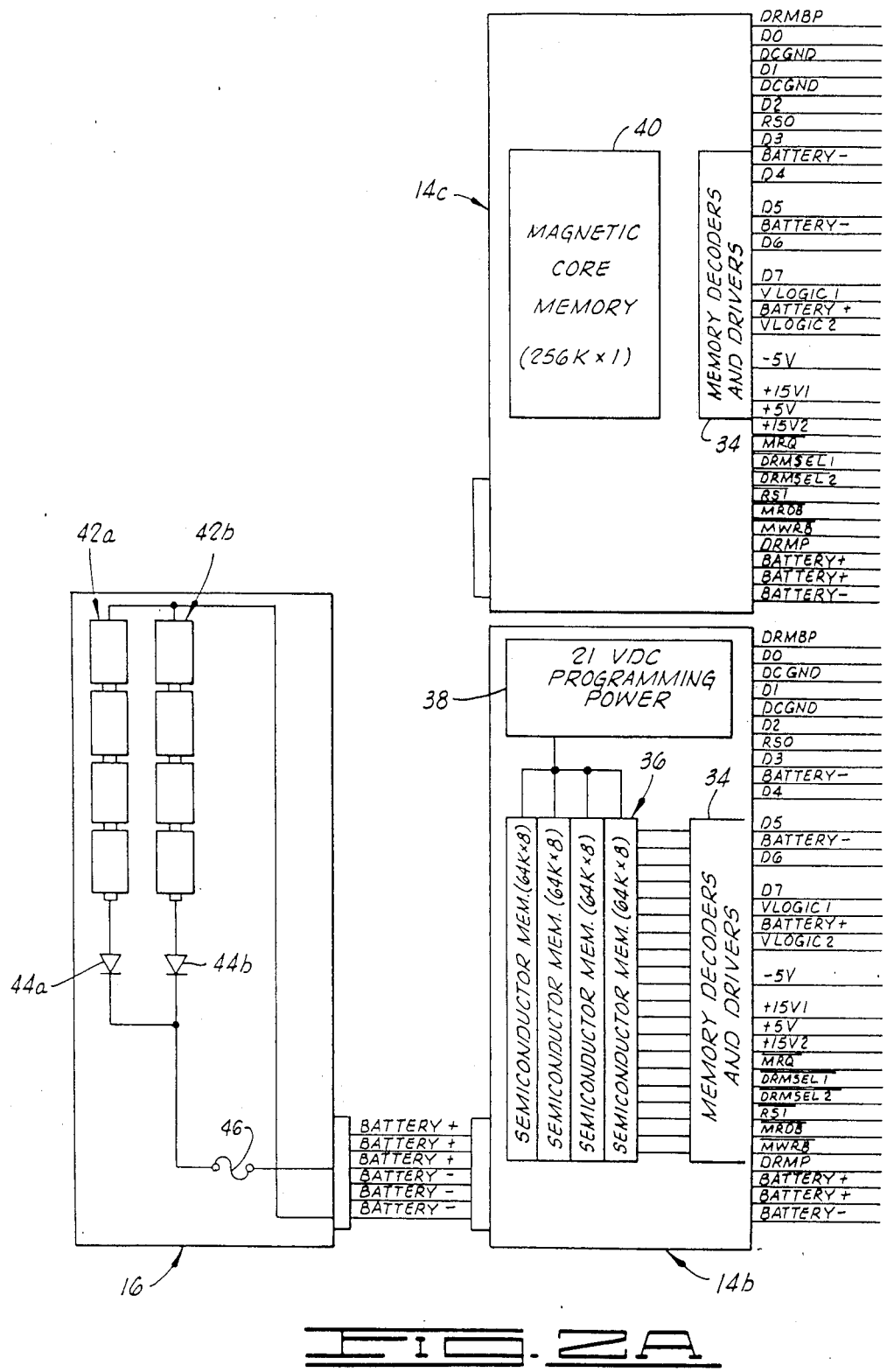

FIGS. 2A and 2B show, in block diagram format, elements comprising the preferred embodiment of the gauge 2, the interface 8 and the computer system 10. The preferred embodiment of the gauge 2 is made of three detachable segments or sections which are electrically and mechanically interconnectible through multiple conductor male and female connectors which are mated as the sections are connected. These three sections are contained within respective linearly interconnectible tubular metallic housings or suitable types as known in the art for use in downhole environments. As illustrated in FIG. 1 and more particularly shown in FIGS. 2A and 2B, the three sections of the gauge 2 include (1) a transducer section 12, (2) a controller/power converter and control/memory section 14 comprising controller and power converter and control portion 14a and a data recording module including an interchangeable semiconductor memory portion 14b or magnetic core memory portion 14c, and (3) a battery section 16.

Various types of a plurality of specific embodiments of the transducer section 12 can be used for interfacing the gauge 2 with any suitable type of transducer, regardless of type of output. In the preferred embodiment, suitable transducers include a CEC pressure-sensing strain gauge with a platinum RTD, a Hewlett-Packard 2813B quartz pressure probe with temperature sub, a Geophysical Research Corporation EPG-520H pressure and temperature transducer, and a Well Test Instruments 15K-001 quartz pressure and temperature transducer. However, regardless of the specific construction used to accommodate the particular output of any specific type of transducer which may be used, the preferred embodiment of the transducer section 12 includes a temperature voltage controlled oscillator circuit 18 which receives the output from the particular type of temperature transducer used and converts it into a suitable predetermined format (such as an electrical signal having a frequency proportional to the magnitude of the detected condition) for use by the controller portion in the section 14 of the gauge 2. The preferred embodiment of the transducer section 12 also includes a pressure voltage controlled oscillator circuit 20 for similarly interfacing the specific type of pressure transducer with the controller portion of the section 14. Associated with the pressure voltage controlled oscillator circuit 20 in the preferred embodiment is a delta pressure ($\Delta P$) circuit 22 which provides hardware monitoring of rapid pressure changes and which generates a control signal in response to positive or negative pressure changes which pass a predetermined threshold. These three circuits, along with a voltage reference circuit contained in the transducer section 12, will be described in more detail hereinbelow with reference to FIGS. 3–9.

The controller portion of the controller/power converter and control/memory section 14 includes a central processing unit circuit 24, a real time clock circuit 26, a data recording module interface circuit 28 and a frequency-to-binary converter circuit 30, which elements generally define a microcomputer means for receiving electrical signals in the predetermined format from the transducer section 12, for deriving from the electrical signals digital signals correlated to a quantification of the magnitude of the detected parameter and for storing the digital signals in the memory portion of the section 14. These four circuits communicate with each other over a suitable bus and suitable control lines generally indicated in FIG. 2 by the reference numeral 32. The central processing unit circuit 24 also communicates with the computer system 10 through the interface 8 as indicated by the commonly labeled interface lines shown in FIG. 2B. The central processing unit 24 also communicates, through a part of the circuitry contained on the circuit card on which the data recording module interface circuit 28 is mounted, with the transducer section 12 to receive an interrupt signal generated in response to the $\Delta P$ signal from the $\Delta P$ circuit 22. The frequency-to-binary converter circuit 30 also communicates with the transducer section 12 by receiving the temperature and pressure signals from the circuits 18, 20, respectively. The circuit 30 converts these signals into digital signals representing numbers corresponding to the detected magnitudes of the respective environmental condition. The real time clock circuit 26 provides clocking to variably control the operative periods of the central processing unit 24. The data recording module interface circuit 28 provides, under control by the central processing unit 24, control signals to the memory portion of the section 14. Each of the circuits 24, 26, 28, 30 will be more particularly described hereinbelow with reference to FIGS. 10, 11, 12 and 13, respectively.

The power converter and control portion of the section 14 includes circuits for providing electrical energy at variously needed DC voltage levels for activating the various electrical components within the gauge 2. This portion also includes an interconnect circuit for controlling the application of at least one voltage to respective portions of the gauge 2 so that these portions of the gauge 2 can be selectively powered down to conserve energy of the batteries in the battery section 16. The specific portions of the preferred embodiment of the power converter and control portion will be described hereinbelow with reference to FIGS. 14–17.

The data recording module or memory portion of the section 14 includes either the semiconductor memory portion 14b or the magnetic core portion 14c or a combination of the two. Each of these portions includes an addressing/interface, or memory decoders and drivers, section 34. The semiconductor memory portion 14b further includes four 64K×8 (K=1024) arrays of integrated circuit, solid state semiconductor memory. These are generally indicated by the reference numeral 36 in FIG. 2A. A 21-VDC power supply 38 is contained within the portion 14b for providing a programming voltage for use in writing information into the memory 36. The magnetic core memory portion 14c includes a 256K×1 array of magnetic core memory generally identified in FIG. 2A by the reference numeral 40. These elements of the memory portion will be more particularly described hereinbelow with reference to FIGS. 18-23.

The battery section 16 shown in FIG. 2A includes, in the preferred embodiment, a plurality of lithium-thionyl chloride or lithium-copper oxyphosphate, C-size cells. These cells are arranged in six parallel stacks of four series-wired cells. Two of these stacks are shown in FIG. 2A and identified by the reference numerals 42a, 42b. Each series is protected by a diode, such as diodes 44a, 44b shown in FIG. 2A, and each parallel stack is electrically connected to the power converter and control portion through a fuse, such as fuse 46 shown in FIG. 2A. In the preferred embodiment the parallel stacks are encapsulated with a high temperature epoxy inside a fiber glass tube. These battery packs are removable and disposable, and the packs have wires provided for voltage and ground at one end of the battery section. The batteries are installed in the gauge 2 at the time of initialization of the gauge.

The portions of the gauge 2 are shown in FIGS. 2A–2B to communicate with each other with the various power, control and data signals shown between the respective portions. FIGS. 2A–2B should be viewed with FIG. 2A placed to the left of FIG. 2B so that the signals between portions 14a and 14b match.

The interface 8 through which the gauge 2 communicates with the computer system 10 comprises suitable circuitry as would be readily known to those skilled in the art for converting the signal lines specified in FIG. 2B into the appropriate format recognizable by the computer system 10. In the preferred embodiment this conversion is from the designated input signals at the inputs of the interface 8 to suitable IEEE-488 standard interface format output signals at the outputs of the interface 8. The input lines to the interface 8 are generally identified by the reference numeral 48 and the IEEE-488 output is designated by the block marked with the reference numeral 50. The preferred embodiment is also capable of converting the input signals into RS-232 standard format. Broadly, the interface 8 includes an 8-bit parallel data bus and four hand shake lines. The four hand shake lines are referred to as in-strobe (INSTB), out-strobe ($\overline{OUTSTB}$), in-strobe acknowledge ($\overline{INSTBACK}$), and out-strobe acknowledge ($\overline{OUTSTBACK}$). As data are placed onto the data bus, an in-strobe or out-strobe is indicated; and after the data are read, an in-strobe acknowledge or an out-strobe acknowledge is provided. The SPAC signal shown in FIG. 2B is provided by the interface 8 to indicate that the gauge 2 is connected to the interface 8. The $\overline{RSTPWR}$ signal shown in FIG. 2B is generated by the interface 8 to "wake-up" the gauge 2. These last two signals are shown elsewhere in the drawings to indicate their uses. In an alternate embodiment the interface 8 can be made an integral part of the gauge 2.

The computer system 10 of the preferred embodiment with which the interface 8 communicates is a Hewlett-Packard Model 9816 or Model 9826 microcomputer with a Hewlett-Packard Model 2921 dual disk drive. The microcomputer is labeled in FIG. 2B with the reference numeral 52 and the dual disk drive is labeled with the reference numeral 54. Suitably associated with the microcomputer 52 in a manner as known to the art are a printer 56, a keyboard 58 and a plotter 60. Although not part of the presently claimed invention, it is contemplated that the computer 52 can be programmed to perform several functions related to the use of the gauge 2. An operator interface program enables an operator to control the operation of the computer through simple commands entered through the keyboard 58. A test mode program is used to test the communication link between the computer 52 and the interface 8. A tool test mode program provides means by which the operator can test the gauge 2 to verify proper operation. A received data mode program controls the interface 8 to read out the contents of the memory of the gauge 2; after the memory has been read into the interface 8, the information is transmitted to the computer 52 with several different verification schemes used to insure that proper transmission has occurred. A write data mode program within the computer 52 automatically writes the data received from the interface 8 to one or both of the disks as an ASCII file so that it may be accessed by HPL, Basic, Pascal, or Fortran 77 programming languages. A set-up job program allows the operator to obtain various selectable job parameters and pass them to the interface 8. A monitor job program allows the operator to monitor any job in progress.

Under control of the aforementioned programs in the computer 52, several programs can be run on a microprocessor within the interface 8. A core memory test program in the gauge 2 reads and writes, under control from the interface 8, a memory checkerboard pattern to read and verify proper operation of the magnetic core memory in the gauge 2 when it is connected to the interface 8 and to maintain a list of any bad memory locations detected. A processor check program checks the status of a microprocessor within the gauge 2, and a battery check program checks the voltage of the power cells in the gauge 2 to insure proper voltage for operation. A tool mode select program places the gauge 2 in the proper mode for the test being run, and a set-up job program further configures the gauge 2 for the job to be run. A core memory transfer program reads the contents of the memory of the gauge 2 and stores that information in memory within the interface 8 prior to transfer to the computer 52.

Through the use of the foregoing programs, the tool operator initializes the gauge 2 prior to lowering the gauge 2 into the well bore 4. In the preferred embodiment the operator initializes the gauge 2 using a predefined question and answer protocol. The operating parameters, such as sampling mode, test delay times, serial numbers of the individual instruments, estimated testing time and a self-test or confidence test, are established at initialization and input through the question and answer protocol. The sampling rates for sampling the pressure and temperature and the corresponding resolution control information are entered in a table by the operator at this initialization; the specific sampling rate and resolution used by the gauge at any one time are automatically selected from this table as subsequently described hereinbelow. In the preferred embodiment, the sampling mode to be selected is either a fixed time interval mode, wherein the sampling occurs at a fixed time interval, or a variable time interval mode, wherein the particular sample rate is selected from the table based upon a software detected change in the pressure sensed by the pressure transducer.

After the downhole test has been run and the gauge 2 has been removed from the well bore 4, the tool operator connects the tool 2, specifically the memory portion, with the interface 8 to read out the temperature, pressure and time data stored within the memory section 14b or 14c. Through another question and answer protocol and other suitable tests, the operator insures that the gauge 2 is capable of outputting the data without faults. When the data is to be read out, it is passed through the interface 8 to the computer system 10 for storage on the disks within the disk drive 54 for analysis.

Although the interface 8 and the computer system 10 form parts of the overall system of which the gauge 2 is also a part, they do not form parts of the present claimed invention directed to the gauge 2.

With the foregoing general description of the present invention, a more detailed description of the elements of which the gauge 2 is comprised will be given with reference to FIGS. 3-32.

The preferred embodiment of the temperature voltage controlled oscillator circuit 18 providing the temperature transducer interface circuit for the preferred embodiment is shown in FIG. 3. This circuit includes a comparator 62 having an inverting input to which a suitable temperature sensor 64 is connected. The comparator 62 has a non-inverting input to which an R-C charging circuit, comprising resistors 66, 68 and capacitors 70, 72, is connected. The comparator 62 has an output connected to a trigger input of a one-shot device 74. The voltage at the inverting input of the comparator 62 is determined by the resistance of the temperature sensor 64, which resistance is a function of the temperature detected by the transducer. The voltage at the non-inverting input of the comparator 62 charges from zero volts through the charging R-C circuit comprising the elements 66-72. When the charging voltage at the non-inverting input rises to the voltage determined by the resistance of the transducer 64 (and a resistor 76 connected between the transducer and the +15SW-volt source), the comparator 62 triggers the one-shot 74. Triggering of the one-shot 74 generates a fixed width pulse through a transistor 78. The transistor 78 is coupled, through a suitable mechanical and electrical connector such as previously mentioned, to the controller/power converter and control/memory section 14. Triggering of the one-shot 74 also actuates a transistor 80 through which capacitors 70, 72 are discharged to reset the comparator 62 so that it can be retriggered when the charging voltage again rises to the voltage determined by the resistance of the transducer 64. The frequency at which the triggering of the one-shot 74 occurs as a result of this action of the comparator 62, and thus the frequency of the pulse train passed through the transistor 78, is inversely proportional to the temperature detected by the transducer 64. The transistor 78 provides a low-power CMOS logic interface between the transducer section 12 and the section 14. These components shown in FIG. 3 are energized by the ±15-volt switched source (+15SW, −15SW), shown in FIG. 16, of the power converter and control portion of the section 14 so that these elements can be selectably powered up and powered down as subsequently described hereinbelow.

Figure 4:
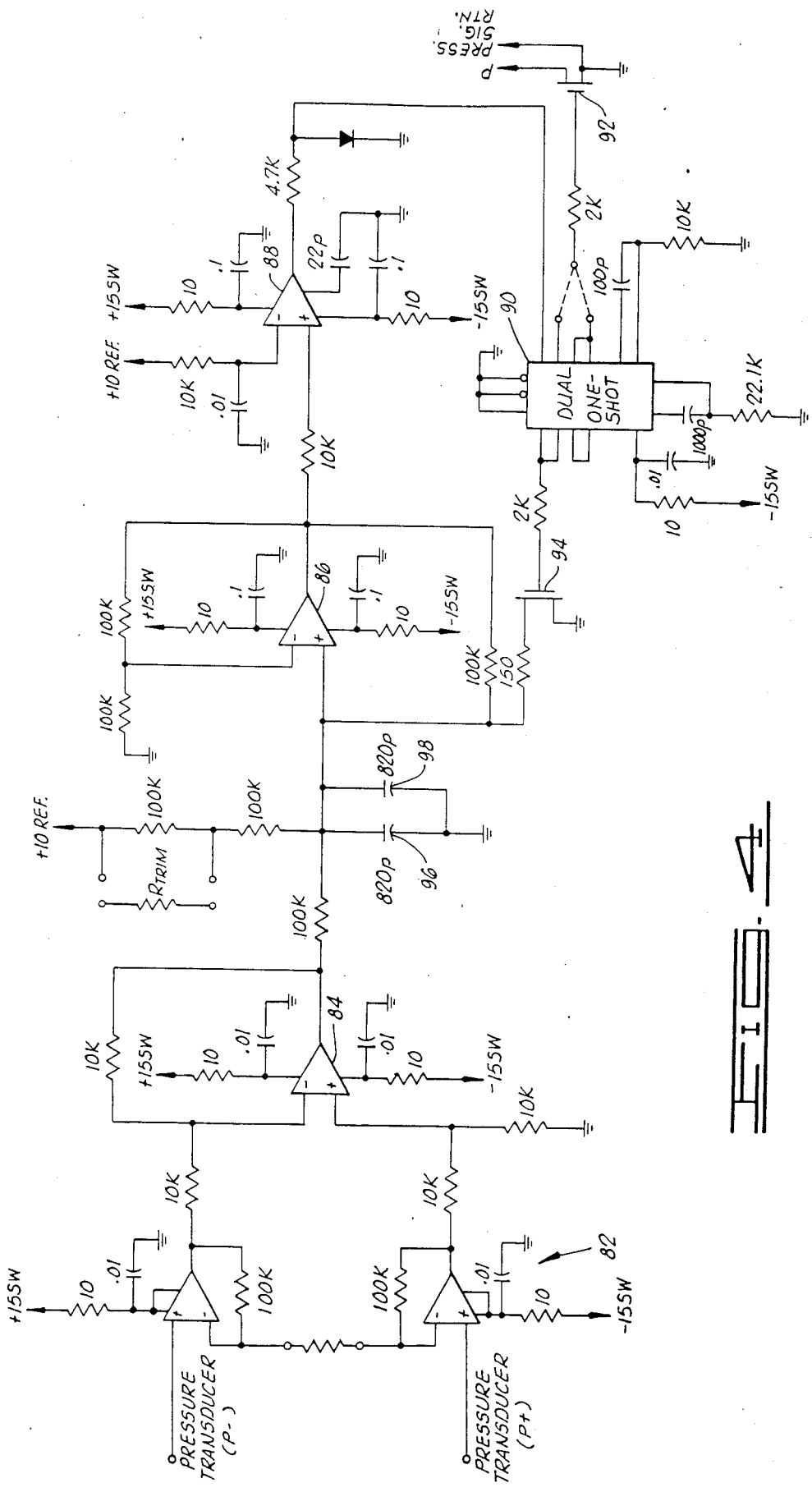
FIG. 4 is a schematic circuit diagram of the preferred embodiment of the pressure VCO circuit shown in FIG. 2 as forming part of the transducer section.

The preferred embodiment of the pressure voltage controlled oscillator circuit 20 providing the pressure transducer interface circuit for the preferred embodiment is shown in FIG. 4. This preferred embodiment is for use with a strain gauge type of transducer. This transducer is connected to the non-inverting inputs of differential amplifiers 82, and the transducer is continually energized by a constant ±15-volt source (see FIG. 15) so that the transducer is continuously responsive to the pressure in the well bore. The outputs of these differential amplifiers are provided to the inputs of an amplifier 84. The amplifiers 82, 84 provide a precision differential to single-ended amplifier circuit. The output of the amplifier 84 is connected to the non-inverting input of a positive feedback integrator 86. The output signal from the integrator 86 slews toward +10 volts at a rate set by the output of the amplifier 84. This output signal is input into the non-inverting input of a comparator 88. When the comparator 88 is tripped in response to the output signal from the integrator 86, this triggers a one-shot device 90. The one-shot 90 provides a fixed-width pulse through a transistor 92 interfacing with the controller/power converting and control/memory section 14. The one-shot 90 also drives a transistor 94 to discharge capacitors 96, 98 forming part of the integrator 86. As with the temperature voltage controlled oscillator circuit 18, the pressure voltage controlled oscillator circuit 20 provides in the preferred embodiment a CMOS logic interface by means of the transistor 92. The circuit 18 is also primarily powered in response to the −15SW switchable power signals shown in FIG. 16.

An analog ground (ANALOG GND) for use with the frequency signals coming from the transducer section 12 is provided as shown in FIG. 2B. This is the connection for the signal returns labeled in FIGS. 3-5.

Figure 5:
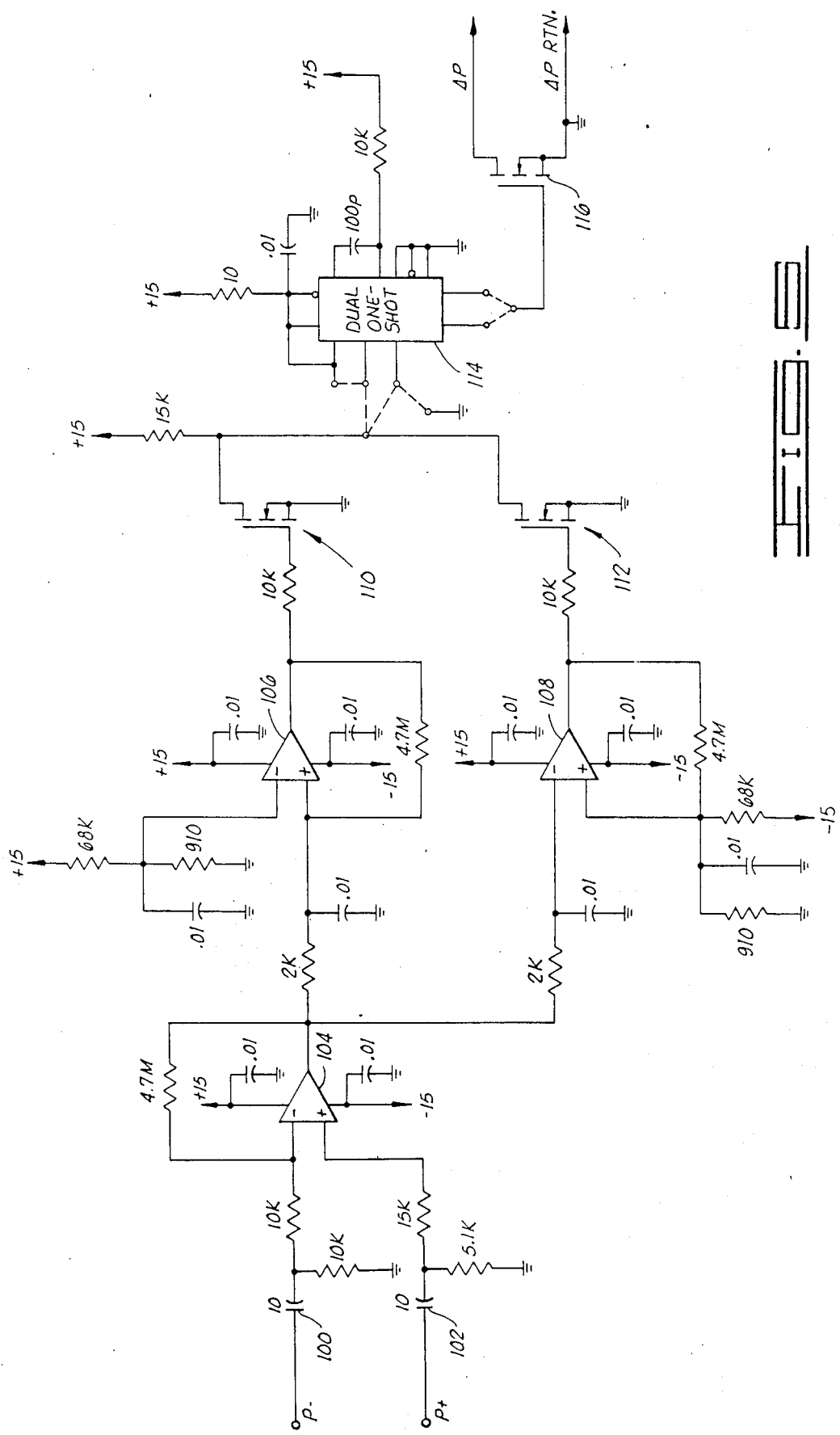
FIG. 5 is a schematic circuit diagram of the preferred embodiment of the ΔP circuit shown in FIG. 2 as forming part of the transducer section.

The ΔP circuit 22 of the preferred embodiment is shown in FIG. 5. Pressure pulses, such as would occur when there is rapidly changing pressure within the borehole fluid, are received by a pressure transducer to which the ΔP circuit 22 is connected. In the preferred embodiment this pressure transducer is the continuously energized strain gauge pressure transducer to which the pressure voltage controlled oscillator circuit 20 is also connected. However, a separate, auxiliary pressure measuring device can be used.

In the illustrated preferred embodiment, the strain gauge transducer is AC-coupled through capacitors 100, 102 to the input of a differential amplifier 104. The output of the amplifier 104 is connected to a positive sensing comparator 106 and a negative sensing comparator 108 so that both positive and negative-going pressure pulses are detected. Level translating pulse output circuits 110, 112 are connected to the outputs of the comparators 106, 108, respectively. These circuits 110, 112 are commonly connected to an input of a one-shot device 114. When either of the comparators 106, 108 detects a suitable pressure change, as indicated by the output from the amplifier 104 passing one of the respective thresholds of the comparators 106, 108, the respective one of the output devices 110, 112 activates the one-shot device 114 to generate a timed pulse which is interfaced to the section 14 through a transistor 116. In the preferred embodiment, the differential amplifier 104 responds only to rapidly time-varying pressure signals slewing on the order of 100 psi per second or greater with peak changes of 300 psi or greater; however, other pressure changes, and even changes in other environmental conditions, can be used and remain within the scope of the present invention. These elements are continuously energized from the constant (i.e., unswitched) ±15-volt source shown in FIG. 15 so that the ΔP circuit 22 is continuously monitoring for rapid pressure changes.

Features of the ΔP circuit 22 of particular note include the AC-coupling which prevents interference by the ΔP circuit with the precision transduction of steady or slowly varying pressures which are to be detected by the circuit 20 shown in FIG. 4. The AC-coupling also makes the ΔP circuit 22 responsive only to large, rapidly slewing pressure changes. Being bipolar, the circuit 22 responds to both increasing and decreasing pressures. The circuit is also constructed of devices which are low in power consumption. Through the use of the ΔP circuit, re-enabling signals are provided to the gauge 2 to "wake-up" the gauge, if it has been powered down into a sleep mode to conserve energy, to cause the controller portion to take a new sample irrespective of the software implemented sample rate interval. This signal is also used within the controller portion of the section 14 to cause the software to use the fastest sample rate. These last two features are further described hereinbelow.

Figure 7:
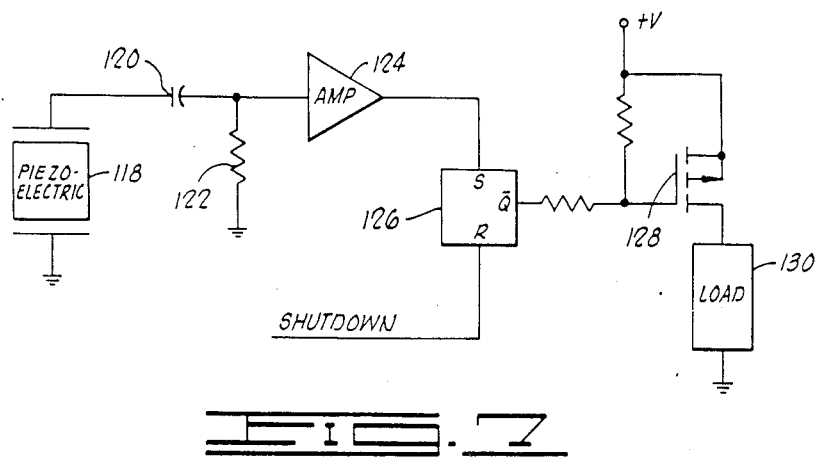
FIG. 7 is a schematic circuit diagram of an alternate embodiment of the ΔP circuit.
Figure 8:
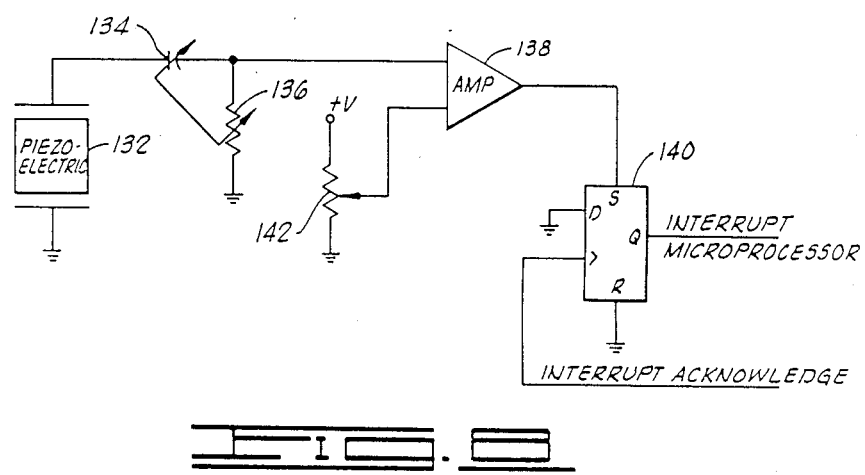
FIG. 8 is a schematic circuit diagram of another alternate embodiment of the ΔP circuit.
Figure 9:
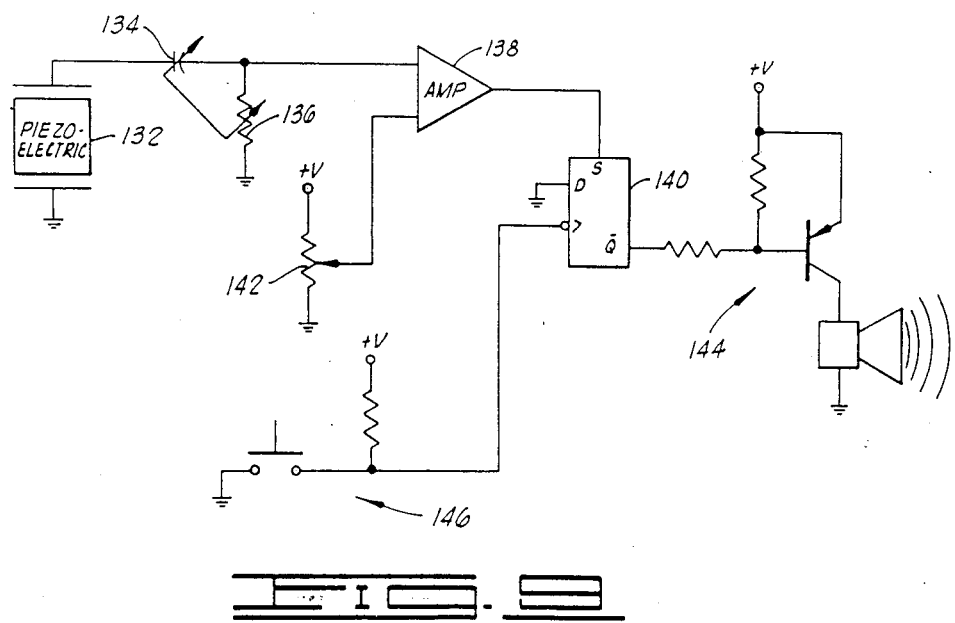
FIG. 9 is a schematic circuit diagram of still another alternate embodiment of the ΔP circuit.

FIGS. 7-9 show alternate embodiments of circuits which can be used for detecting rapid pressure changes. Each of these circuits is directed to a piezoelectric pressure sensor which is an extremely low power consuming device. In FIG. 7, a piezoelectric pressure sensor 118 converts detected pressure into corresponding electrical signals. A high pass filter, comprising a capacitor 120 and a resistor 122, passes only rapidly changing signals from the sensor 118 to an amplifier 124. The amplifier 124 converts the electrical signals passed by the high-pass filter to a digital format for controlling a latch element 126. When a suitable high frequency signal is generated by the sensor 118 and passed through the amplifier 124, the latch element 126 generates a signal which makes a transistor 128 conductive for connecting the load (such as circuits within the gauge 2) to a voltage source, +V. A signal labeled "shutdown" in FIG. 7 can be generated (such as by the controller portion of the gauge 2) to reset the latch element 126 and turn off the transistor 128, thereby disconnecting, or shutting down, the operation of the load 130. The shutdown signal can be generated by any suitable means.

The circuit shown in FIG. 8 is similar to the circuit shown in FIG. 7 in that it includes a piezoelectric sensor, identified by the reference numeral 132, a high-pass filter comprising a capacitor 134 and a resistor 136, an amplifier 138 and a latch element 140. However, the capacitor 134 and the resistor 136 are variable so that the "rate of change in pressure" set point can be adjusted in the FIG. 8 circuit. The FIG. 8 circuit also includes a resistor 142 which can be adjusted to control the amplitude set point at which a suitable ΔP pulse is to be detected by the amplifier 138. The latch 140 is shown connected in a specific application for providing an interrupt to a microprocessor and receiving an interrupt acknowledge from the microprocessor.

FIG. 9 shows the same circuit illustrated in FIG. 8, as indicated by like reference numerals, except for the different application of the latch element 140 being connected to an external alarm circuit 144 and being connected to a push-button reset circuit 146 used to reset the alarm circuit 144.

In the ΔP circuit 22, the sensitivity or thresholds of the detecting circuitry can be adjusted such as illustrated in FIGS. 8 and 9 or by other suitable means, such as through analog switches, whose uses would be readily known to those in the art.

The circuits 18, 20, 22 are analog circuits which are energized by the ±15-volt sources, either constant or switched as previously described, generated from the sections 14, 16.

Also included in the transducer section 12 is a precision +10 voltage reference for use by the transducers. The preferred embodiment of this voltage reference circuit is shown in FIG. 6. This circuit is continuously energized by the constant ±15-volt source.

Figure 10A:
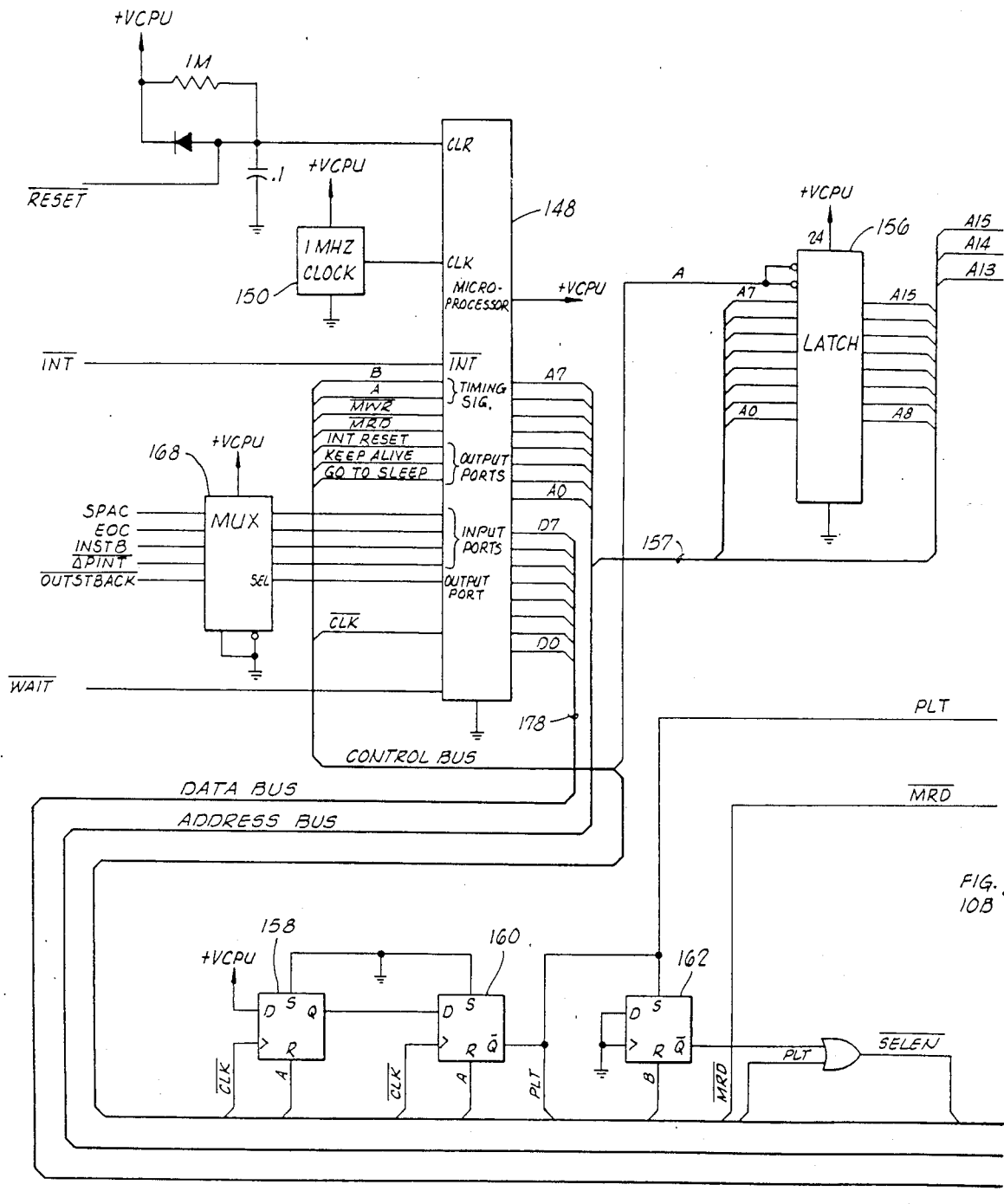

The schematic circuit diagram of the preferred embodiment of the central processing unit circuit 24 of the section 14 is shown in FIGS. 10A-10C. In the preferred embodiment this circuit is mounted on one printed circuit card contained in the section 14 of the gauge 2. Generally, the central processing unit controls the operation of the gauge 2 once it is placed in the downhole position where pressure and temperature are to be monitored. More particularly, in the preferred embodiment the central processing unit controls and takes measurements from the transducer section, compresses and stores the data in the memory portion, controls the power management function, and runs tool diagnostics throughout the time the guage 2 is downhole and records the results of the tests. At the surface, the central processing unit also initializes the tool with information received through the interface 8 (such as initializing the gauge with any bad memory locations), and it performs diagnostic testing upon initial energization with the interface 8 connected and reports the results of the testing of the interface 8.

Structurally, the central processing unit circuit 24 includes a microprocessor 148 of a suitable type. In the preferred embodiment the microprocessor 148 is a low-power CMOS circuit capable of functioning in the high temperature environments found in oil and gas well bores. The timing at which the microprocessor 148 runs is primarily provided by a clock 150 of a suitable type. In the preferred embodiment the clock 150 provides a nominal one megahertz timing signal. The microprocessor 148 operates under the control of suitable programs (see FIGS. 25-32) stored in an 8K×8 read only memory 152 shown in FIG. 10B and in response to a processor reset signal, $\overline{\text{RESET}}$, an interrupt signal, $\overline{\Delta\text{INT}}$, and a pressure change interrupt signal, $\overline{\Delta\text{PINT}}$, provided to respective inputs as shown in FIG. 10A. The microprocessor 148 also responds to the end of count signal, EOC, and the stop processing signal, $\overline{\text{WAIT}}$, during data monitoring and to the SPAC interconnect and the INSTB and $\overline{\text{OUTSTBACK}}$ handshake signals during communications with the interface 8.

A random access memory 154 capable of storing 128 8-bit bytes of information is also shown in FIG. 10B; this memory 154 provides working storage space, such as for software controlled registers, for use by the programs as would be readily known to those skilled in the pertinent arts.

To permit 16-bit addressing, the central processing unit is also shown in FIG. 10A to include a high address byte latch 156 which receives address signals over an address bus 157.

Latch elements 158, 160, 162 and channel selectors, or decoders, 164, 166 shown in FIGS. 10A and 10B are used to provide the various control signals designated in the drawings. The $\overline{\text{SRFPSEL}}$ signal, which is used to select circuits in the interface 8, is provided from the decoder 166 shown in FIG. 10B to the interface 8 as indicated in FIG. 2B by the common label; the other signals from the latches 158, 160, 162 and the decoders 164, 166 are used elsewhere in the gauge 2 as shown throughout the drawings by like labels.

A multiplexer 168 shown in FIG. 10A receives the various designated signals previously described and selectably provides them to respective inputs of the microprocessor 148.

FIG. 10B also shows a tri-state buffer 170 which has an input section powered by one power source through a conductor 172 and an output section powered by another power source through a conductor 174. The power source connected through the conductor 172 is switchable so that the input stage of the latch 170 can be deactivated to conserve power at selectable times during the operation of the gauge 2 in its downhole location. However, the source connected through the conductor 174 is a continuous power supply so that the outputs are always ready to receive information once the gauge 2 is energized and so that the inputs of the random access memory 154 are properly maintained. The power supply for continuously energizing the logic circuits of the controller portion of the section 15 is designated in FIG. 10B and elsewhere throughout the drawings by the label +VSTBY. The switchable power supply for the central processing unit and other circuits shown in subsequent drawings is designated throughout by the label +VCPU (other switchable supplies will be described hereinbelow). The random access memory 154 is powered by the continuous source, +VSTBY, so that volatile information stored therein is retained.

FIG. 10C shows a hex D-type latch 176 which receives information over a data bus 178 from the microprocessor 148. The latch 176 is clocked in response to the power select ($\overline{\text{PWRSEL}}$) and memory write ($\overline{\text{MWR}}$) control signals as indicated in FIG. 10C. The latch 176 has five independently selectable outputs, each of which is connected to a respective one of five transistors 180, 182, 184, 186, 188. The transistors 180, 182, 184 and 188 control additional transistors 190, 192, 194, 196, respectively, to define power switch means for providing the respective selective power signals labeled in FIG. 10C. The +15 MEM power signal, switchably connectable to the memory portion of the section 14 as power source signals +15V1 and +15V2, is generated by the circuit shown in FIG. 17; and the +VSUPPLY signal, switchably connectable to respective digital circuits in the control portion of the section 14 as the +VDRM and +VFBC power source signals, is the CMOS logic power source signal generated by the circuit shown in FIG. 15. The transistor 186 is controlled to provide a transducer power switch control signal, $\overline{\text{XDRSW}}$, to the power switching circuit shown in FIG. 16. The outputs of the latch 176, and thus the operation of the transistors 180-192, are independently controllable by the microprocessor so that selectable combinations of power signals can be provided.

Each of the components in the central processing unit circuit 24 shown in FIGS. 10A-10C are, in the preferred embodiment, CMOS semiconductor members or otherwise compatible with CMOS circuitry so that power consumption is reduced. This type of construction is used throughout the gauge 2 to reduce the overall power consumption of the electronic circuits. Suitable specific model types of such elements are known to the art.

Figure 11A:
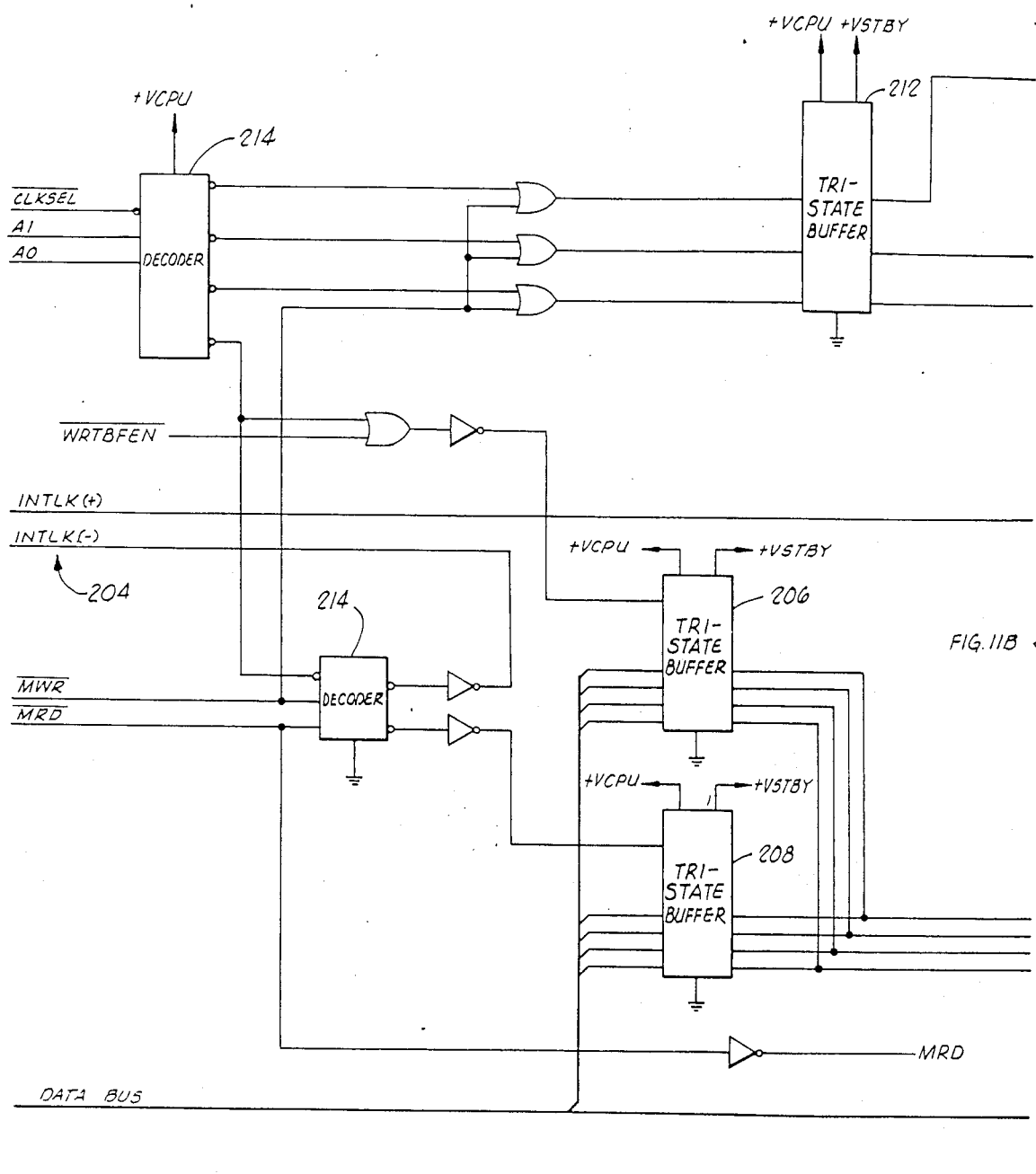
FIGS. 11A and 11B are a schematic circuit diagram of the preferred embodiment of a real-time clock circuit of the controller portion of the controller/power converter and control/memory section.
Figure 11B:
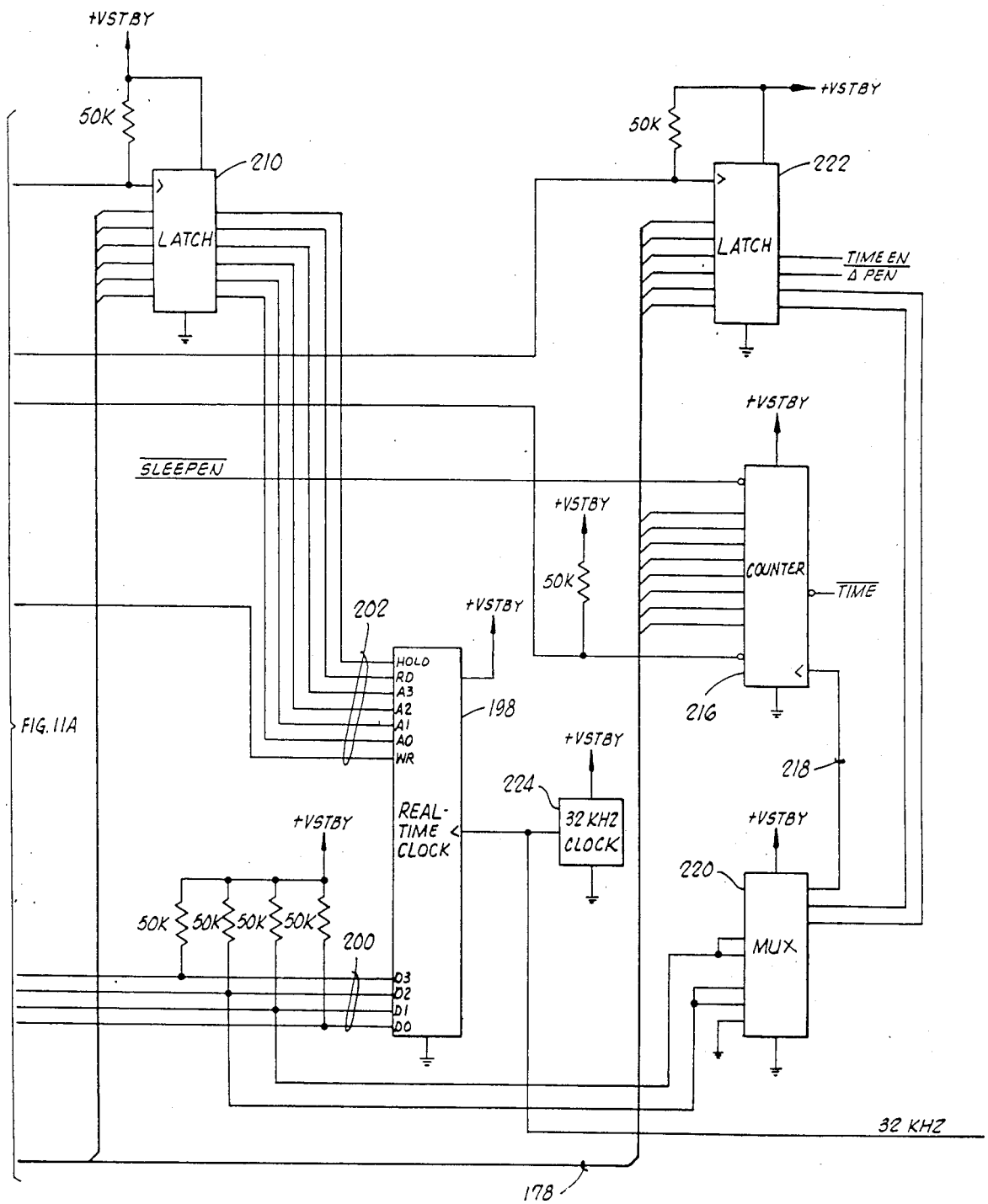

The circuit diagram of the real time clock circuit 26 of the section 14 is shown in FIGS. 11A and 11B. This circuit is contained on one card in the controller section within the gauge 2. This circuit provides four timing options. One is a real time option wherein the real time is initially programmed at the surface by the interface 8 prior to the gauge 2 being lowered into the well bore 4. Once downhole, the real time function provides an elapsed time number which is stored with each sample of the temperature and pressure data so that the time of occurrence of the temperature and pressure samples can be reconstructed at the surface. The second timing option provides a wake-up signal, $\overline{\text{TIME}}$, used to automatically re-energize those portions of the gauge 2 which have been powered down after a selected time period, entered from the central processing unit, has expired. In the preferred embodiment, wake-up signals can be generated within a range of 0 to 255 seconds or 0 to 255 minutes. The third timing option is a fixed timing option wherein a fixed timing signal is provided at one-second intervals; the fourth timing option is a fixed timing option wherein a fixed timing signal is provided at one-minute intervals.

Structurally, the real time clock circuit 26 includes an integrated circuit timer 198 (FIG. 11B) which can be programmed and controlled through data lines 200 and control lines 202. Initialization of the timer 198 with the real time is made at the surface by connecting the gauge 2 to the intergface 8 so that a write-enable interlock jumper within the interface 8 is connected across normally open terminals 204 (FIG. 11A). This closes the circuit to the write input (WR) of the timer 198, thereby enabling the timer 198 to be programmed in response to the memory write signal and with data transmitted over the data bus 178 from the microprocessor 148. Transfers of data to and from the data lines 200 are made through an input buffer 206 and an output buffer 208, comprising tri-state elements, shown in FIG. 11A. The control lines 202 carry signals provided through a latch 210 from the data bus 178. The latch 210 is controlled by a signal from another tri-state buffer 212. FIG. 11A also shows a channel select member 214 (shown in two parts) by which control signals are provided as shown in the drawings.

Although the outputs from the timer 198, as read over the data lines 200, provide real time (more particularly, elapsed time in the preferred embodiment) information for storage in the memory portion, one-second and one-minute timing signals can also be taken from the data lines 200 for selectably controlling a counter 216. The counter 216 can be loaded with a preset count received over the data bus 178 from the microprocessor 148. Clocking of the counter 216 occurs over a line 218 coming from a multiplexer 220 into which the one-second and one-minute signals are input. The one of these two timing signals selected through the multiplexer 220 is controlled by signals from a latch 222 which also receives inputs from the data bus 178. The latch 222 also provides time enable, TIMEEN, and delta pressure enable, $\overline{\Delta\text{PEN}}$, control signals (used in the circuits shown in FIG. 12B) in response to data bus signals from the central processing unit. By presetting the timer 216 with a selectable count, the $\overline{\text{TIME}}$ signal, a time period expiration signal, is generated when the count is depleted in response to the appropriate number of counts, or clock pulses, being received over the line 218. This $\overline{\text{TIME}}$ signal is used to generate "wake-up" signals so that power can be reapplied to any powered-down sections (see FIG. 12B).

FIG. 11B shows that the timer 198 is clocked by a nominal 32-kilohertz signal from an oscillator 224.

The timer 198, portions of the buffers 206, 208, 212, the latch 210, the counter 216, the multiplexer 220, the latch 222 and the oscillator 224 are continuously energized by the continuous power supply, +VSTBY, so that continuous timing is maintained.

The schematic circuit diagram for the data recording module interface circuit 28, which is contained on a single card within the section 14 of the gauge 2, is shown in FIG. 12A. FIG. 12A shows two tri-state buffers 226, 228 which receive the indicated control signals from the central processing unit. The output portions of the buffers 226, 228 are connected to the switchable +VDRM power source shown in FIG. 10C. The output of this same switchable power source is supplied to the respective power inputs of a channel selector 230, a latch 232, and a P-channel power switch chip 234, which chip 234 is operable by the central processing unit to switch the +VDRM power signal, only after it in turn has been switched on through the circuit in FIG. 10C, to its outputs at the various VLOGIC power signals to be used to energize the logic circuits in the data recording module portion of the section 14. The outputs of these chips, along with the data bus 178, are provided to the memory portion of the section 14 as shown in FIG. 12A and FIGS. 2A-2B by the common labels (the VLOGIC3 and VLOGIC4 signals are spares in the preferred embodiment and are not shown in FIGS. 2A-2B). Because these elements are powered by the +VDRM power supply, they can be separately activated and de-activated independently of the +VCPU and +VSTBY power sources.

The lower portion of FIG. 12A shows a transistor 236 which is responsive to the nominal 32-kilohertz signal from the real time clock circit 26. The output of the transistor 236 provides to the frequency-to-binary converter circuit 30 an inverted nominal 32-kilohertz signal having a magnitude between ground and the +VFBC power source, which power source is generated through the power switch circuitry shown in FIG. 10C.

Figure 12B:
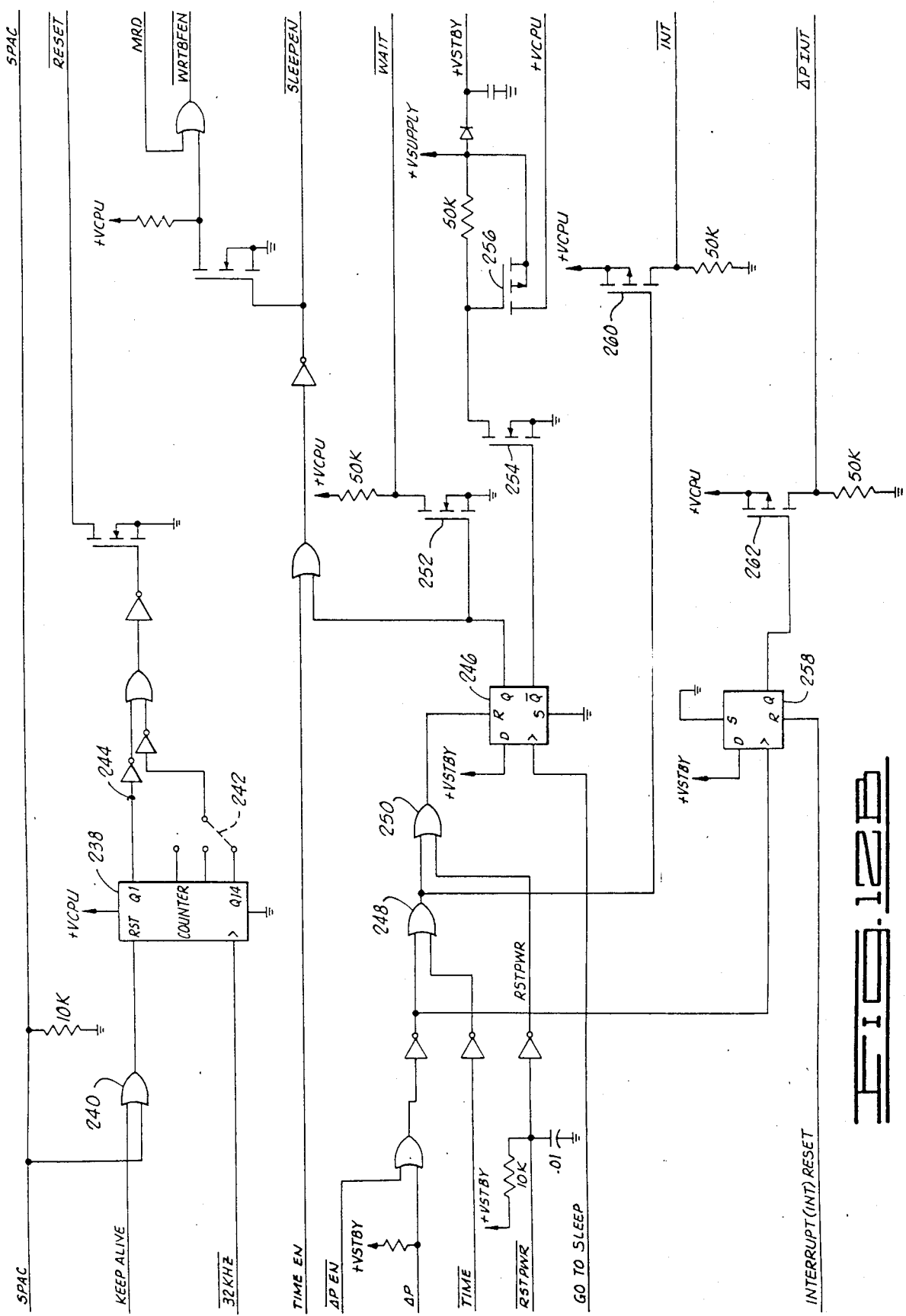
FIG. 12B is a schematic circuit diagram of the preferred embodiment of a power switching, ΔP interrupt power-up, time interval power-up and watchdog timing circuit of the controller portion of the controller/power converter and control/memory section.

FIG. 12B shows a "watchdog" resetting circuit including a counter 238 which is clocked by the inverted nominal 32-kilohertz signal from the real time clock circuit 26 to provide a sequential digital output. The counter 238 is, under normal operating conditions, continuously reset through a reset input thereof by the KEEP ALIVE signal which is generated by the central processing unit (see FIG. 10A) and provided through an OR gate 240. A jumper 242 connected at the outputs of the counter 238 is used to vary the length of a processor reset time-out period. If no KEEP ALIVE signal is received by the counter 238 within the preselected count defining the processor reset time-out period, the processor reset signal, $\overline{\text{RESET}}$, is logically generated from the count signal provided over a conductor 244 and through the jumper 242. By appropriately connecting processor the jumper 242, the length of time required before a processor reset signal is generated can be varied. Regardless of which length of time is selected by the jumper 242, the central processing unit is programmed to periodically generate the KEEP ALIVE signal, in response to the clock 150 (of different frequency than the nominal 32-kilohertz signal clocking the counter 238) shown in FIG. 10A, at a rate which is shorter than the jumper 242-selected time-out, or terminal count, of the counter 238. Therefore, when the central processing unit is operating within normal limits, the counter 238 is continually reset before the time-out period is counted by the counter 238. Should the central processing unit begin to operate outside this time limit, thereby indicating that the central processing unit has started to malfunction, then the KEEP ALIVE signal will no longer be generated within the selected time limit, whereby the counter 238 will time-out by reaching the count detected through the cnductors 242, 244. This count is logically combined by the logic gates shown in FIG. 12B to generate the processor reset signal, $\overline{\text{RESET}}$, through the illustrated transistor. Generation of the processor reset signal resets the microprocessor 148 to which the counter 238 is connected through the gates and transistor shown in FIG. 12B. To disable the watchdog timer shown at the top of FIG. 12B when the interface 8 is connected to the gauge 2, the SPAC signal is connected to another input of the OR gate 240. The watchdog timer is also disabled when the +VCPU power signal is not present because the counter 238 is energized by this switchable power signal. Therefore, the watchdog timer is not operational during sleep modes.

FIG. 12B also shows the circuit by which the power-down (sleep) and power-up (wake-up) signals for respectively deactivating and activating the microprocessor 148 are generated. A latch 246 is clocked by a GO TO SLEEP signal generated by the central processing unit circuit 24 as shown in FIG. 10A. The latch 246 is reset in response to any of the labeled signals which are input into either of the OR gates 248, 250 shown in FIG. 12B, including the power reset, $\overline{\text{RSTPWR}}$, signal generated by the interface 8 to insure the latch 246 is in a proper state when the battery section 16 is attached because when this attachment occurs, the power may fluctuate, causing the microprocessor to come-up randomly; therefore, the $\overline{\text{RSTPWR}}$ signal is provided to override any GO TO SLEEP signal the microprocessor may try to generate upon attachment of the battery section 16. The noninverted output (Q) of the latch 246 drives a transistor 252 that generates the $\overline{\text{WAIT}}$ control signal used to immediately stop the microprocessor 148, which receives this signal through the multiplexer 168 shown in FIG. 10A. The inverted output ($\overline{\text{Q}}$) of the latch 246 drives a transistor 254 which in turn controls a power switch transistor 256 through which the switchable +VCPU power source signal is provided from the +VSUPPLY signal. The constant logic circuit energizing power signal, +VSTBY, is also shown in FIG. 12B as being derived from the +VSUPPLY signal.

The lower portion of the circuit shown in FIG. 12B includes two switch means for generating control signals to the microprocessor 148. These include (1) a latch 258 having an output used to control a transistor 262 for providing a switchable ΔP interrupt signal ($\overline{\Delta\text{PINT}}$) and (2) a transistor 260 for providing a switchable interrupt signal ($\overline{\text{INT}}$). Control of the transistor 260 occurs through the OR gate 248 having one input connected to the output shown logically derived from the ΔP and $\overline{\text{APEN}}$ signals. The gate 248 has another input connected to receive the inverted $\overline{\text{TIME}}$ signal from the counter 216 shown in FIG. 11B. The latch 258 is clocked by the same ΔP-responsive signal connected to the first-mentioned input of the OR gate 248. The latch 258 is reset by an INTERRUPT RESET signal generated by the microprocessor 148 as shown in FIG. 10A.

When the GO TO SLEEP signal is generated, the latch 246 actuates the transistor 252 to provide the $\overline{\text{WAIT}}$ signal to suspend further operation of the microprocessor 148; and the +VCPU signal is switched off. When either a time period count in the counter 216 expires or the ΔP signal indicates a rapid pressure change has been detected, the latch 246 is reset so that the $\overline{\text{WAIT}}$ signal is terminated and the +VCPU signal is turned on. Additionally, the $\overline{\text{INT}}$ signal is generated and causes the microprocessor to start a new sample read. When the interrupt is caused by the ΔP signal, the $\overline{\text{ΔPINT}}$ signal is also generated to advise the microprocessor of the reason for the interrupt.

Figure 13B:
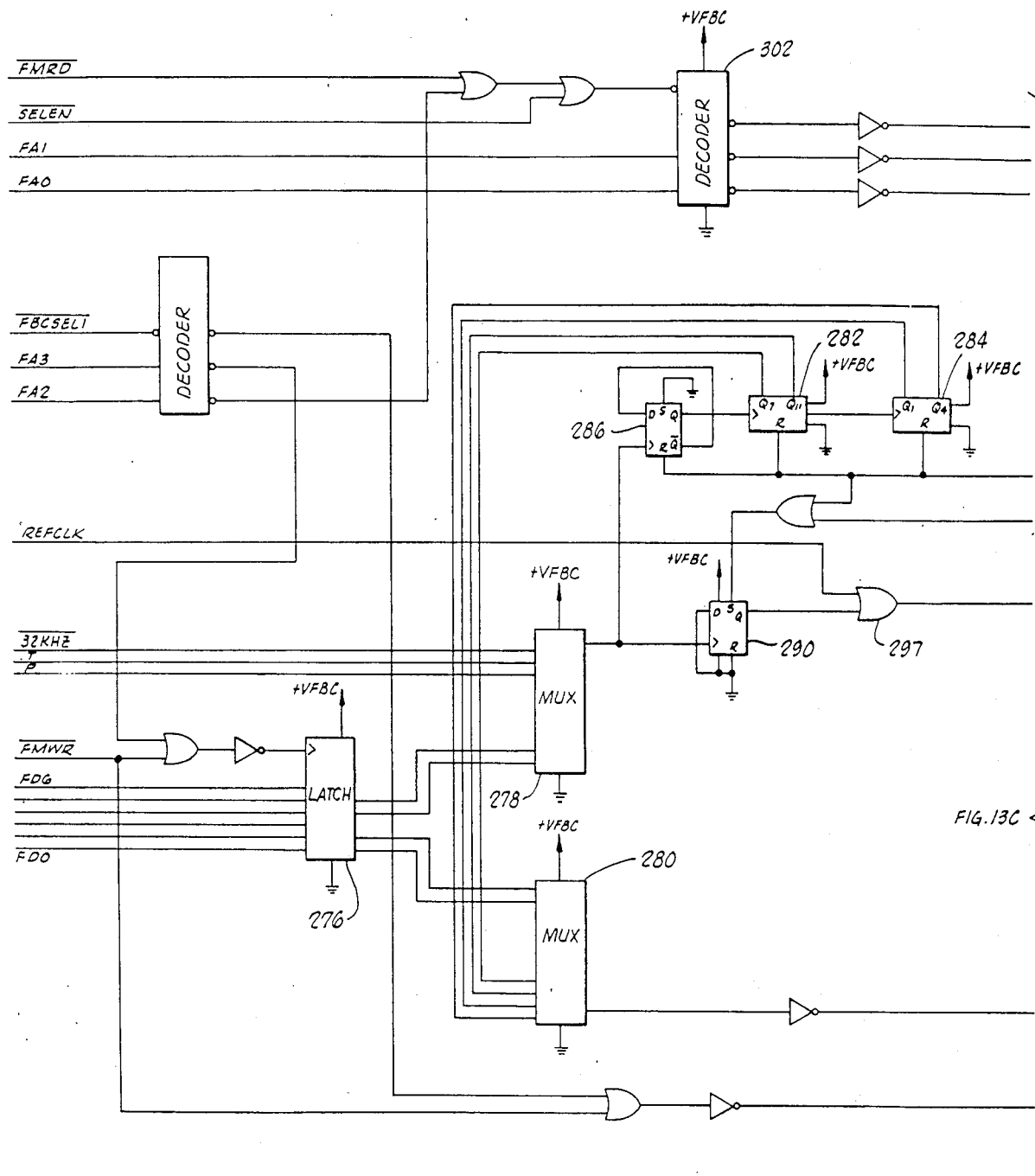
Figure 13C:
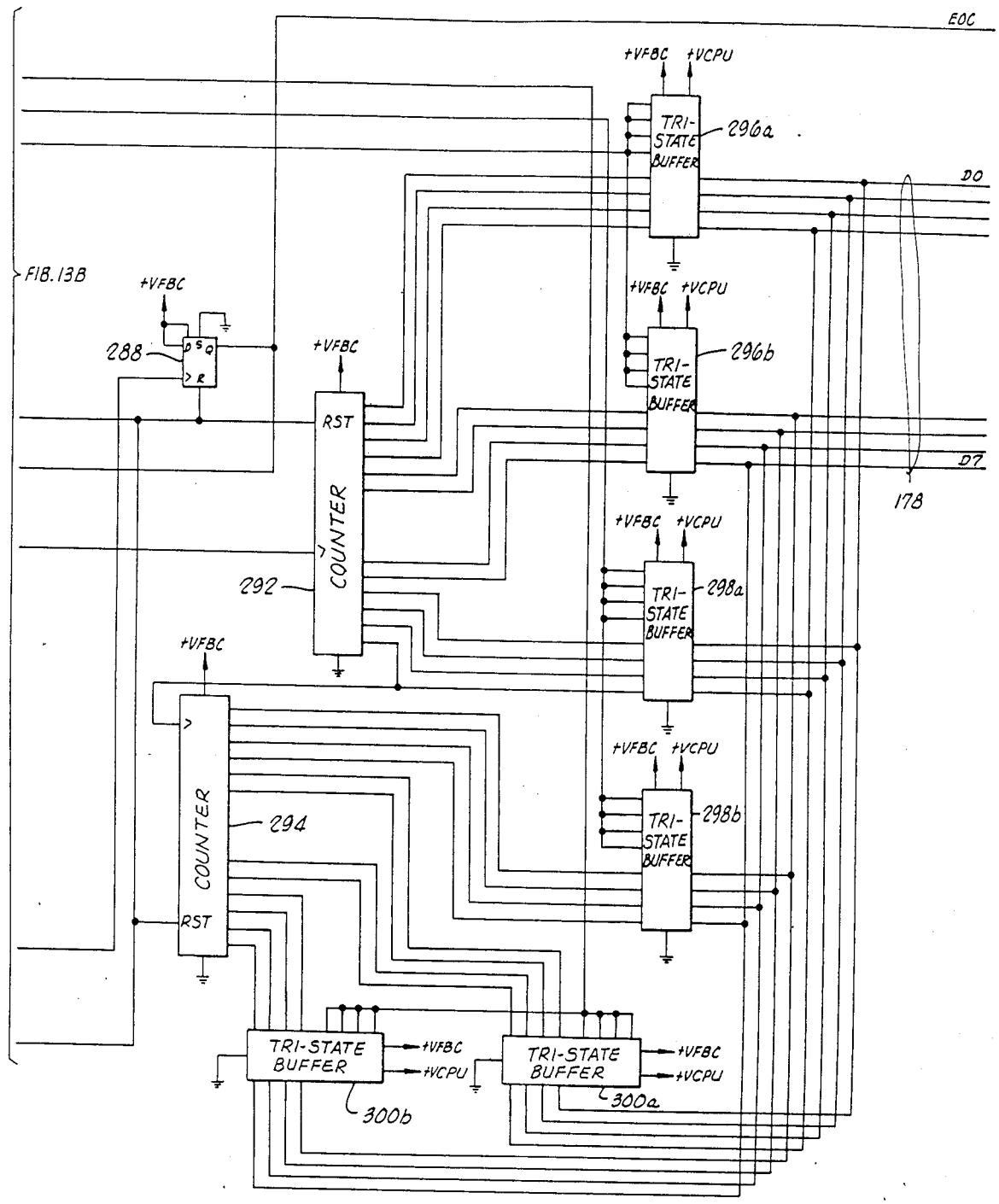

The schematic circuit diagram of the preferred embodiment of the frequency-to-binary conversion circuit 30 is shown in FIGS. 13A–13C. These circuits are contained on a single card in the preferred embodiment. FIG. 13A shows four tri-state buffers 264, 266, 268, 270 which receive the indicated signals from the central processing unit circuit 24 and provide them to the remainder of the frequency-to-binary conversion circuit 30 shown in FIGS. 13B and 13C. FIG. 13A also shows a 5-megahertz reference clock oscillator 272 and a line 274 over which the inverted nominal 32-kilohertz signal from the data recording module interface circuit 28 is provided. It is to be noted that the tri-state buffers 264–270 have their outputs powered by the switchable power source +VFBC whereas the inputs are powered by the switchable source +VCPU. The +VFBC power source is used elsewhere in the frequency-to-binary conversion circuit 30 as shown in FIGS. 13B and 13C so that these portions can be separately powered up and powered down independently of the +VCPU power source and the other independently switchable power sources in the gauge 2.

FIGS. 13B and 13C show the circuitry by which the pressure and temperature signals from the transducer section 12 are converted into binary counts used by the central processing unit circuit 24 for storing the pressure and temperature information in the memory portion. A latch 276 receives multiplexer control information from the central processing unit, through the circuits shown in FIG. 13A, for controlling a multiplexer 278 and a multiplexer 280. The principal information input into the multiplexer 278 includes the temperature and pressure signals from the transducer section 12 and the inverted nominal 32-kilohertz signal transferred by the conductor 274 shown in FIG. 13A. The principle information input into the multiplexer 280 includes resolution timing signals, defining different lengths of resolution timing intervals, taken from selected outputs of resolution timing counters 282, 284. The counters 282, 284 are clocked through a toggle latch 286 which is in turn clocked by the selected one of the pressure, temperature or inverted nominal 32-kilohertz signals passed through the multiplexer 278. The selected resolution signal provided at the output of the multiplexer 280 controls a latch 288 having an output which sets a latch 290 to stop or disable further counting or resolving of the measured input selected through the multiplexer 278.

Whichever input is selected through the multiplexer 278 and whichever resolution is selected through the multiplexer 280, the resolving occurring during the selected resolution time is achieved by means of primary counters 292, 294. These counters are clocked in response to the frequency of the signal derived from the reference clock signal shown in FIG. 13A as gated by the output of the latch 290 through an OR gate 297. The count accumulated by the counters 292, 294 is gated onto the data bus 178 through tri-state buffer pairs 296a,b, 298a,b, 300a,b. These pairs of buffers are controlled by respective control signals provided through a channel selector, or decoder, 302 shown in FIG. 13B.

In an alternative embodiment, the counters 282, 284 can be replaced by a programmable counter which is loaded by the microprocessor and incremented by the selected transducer signal. The output of such a programmable counter would enable a counter, such as the counters 292, 294, which would be directly driven by the reference clock.

The inverted nominal 32-kilohertz signal selected through the multiplexer 278 can be used for diagnostic purposes to check the accuracy of the reference oscillator and the reliability of the counters.

The circuits 24, 26, 28, 30 generally include digital circuits which become operational when energized by the switchable power signals previously described.

Figure 14:
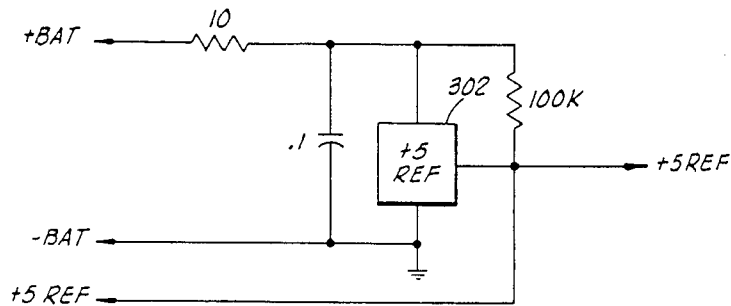
FIG. 14 is a schematic circuit diagram of the preferred embodiment of a +5-volt regulated power circuit of the power converter and control portion of the controller/power converter and control/memory section.

The power converter and control portion of the section 14 includes in the preferred embodiment the circuits schematically illustrated in FIGS. 14–17. FIG. 14 shows an integrated circuit voltage regulator 302 which provides a precision +5-volt source from the batteries in the battery section 16. This voltage level is used in the power circuits shown in FIGS. 15 and 17.

Figure 15:
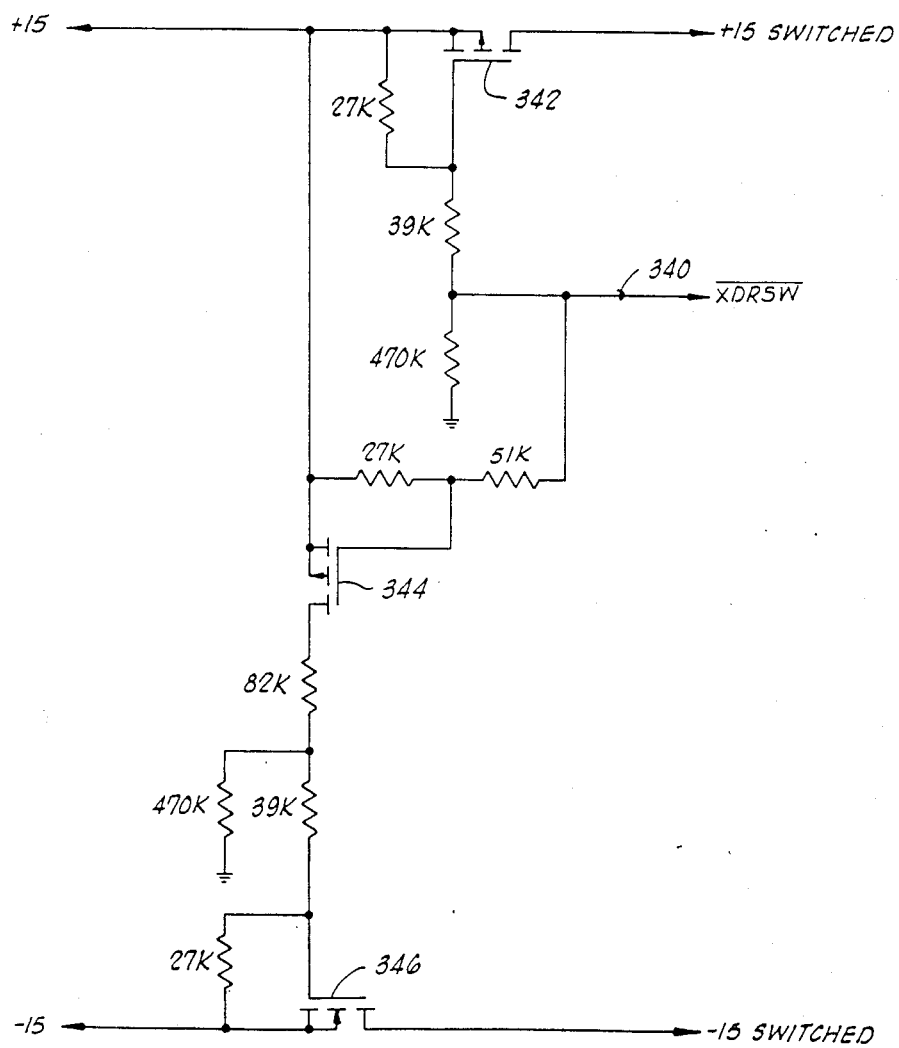
FIG. 15 is a schematic circuit diagram of the preferred embodiment of a DC to DC converter for CMOS logic voltage (+VSUPPLY) and transducer section voltage (±15-volt) power sources of the power converter and control portion of the controller/power converter and control/memory section.

FIG. 15 shows the preferred embodiment schematic circuit diagram of the CMOS logic power signal source, labeled +VSUPPLY and used as the source for the non-switched logic power signal +VSTBY and the switchable logic power signals +VCPU, +VDRM and +VFBC, and the +15-volt source, used to provide both the constant and switched power signals to the transducer section 12. The circuit includes an oscillator circuit 304 having an output which is divided by two through a latch 306 that also provides squaring of the oscillating signal. Another latch 308 provides another level of division by two to further reduce the timing signal. The non-inverted signal from the non-inverted output of the latch 308 is provided through two NOR gates 310, 312 to a part of a gate driver/level translator 314. The inverted signal provided at the inverted output of the latch 308 is provided through NOR gates 316, 318 into another part of the gate driver/level translator 314. A transformer 320, energized by the battery supply, is driven by the outputs from the gate driver/level translator 314 through transistors 322, 324 and their associated circuitry shown in FIG. 15. The transformer 320 has one secondary winding 326 from which the +15-volt sources are provided for use by the transducer circuit. The transformer 320 includes another secondary winding 328 which provides the +VSUPPLY source used in the CMOS logic circuits, which are operational throughout a range of specified operating voltages as known to the art.

The NOR gates 310, 312, 316, 318 are controlled by a pulse width modulator 330 comprising a one-shot 332 and an R-C circuit 334. The one-shot 332 is actuated by a feedback control network 336 which compares a sample of the +VSUPPLY source (labeled FB) to the +5 precision reference through a comparator 338.

Figure 16:
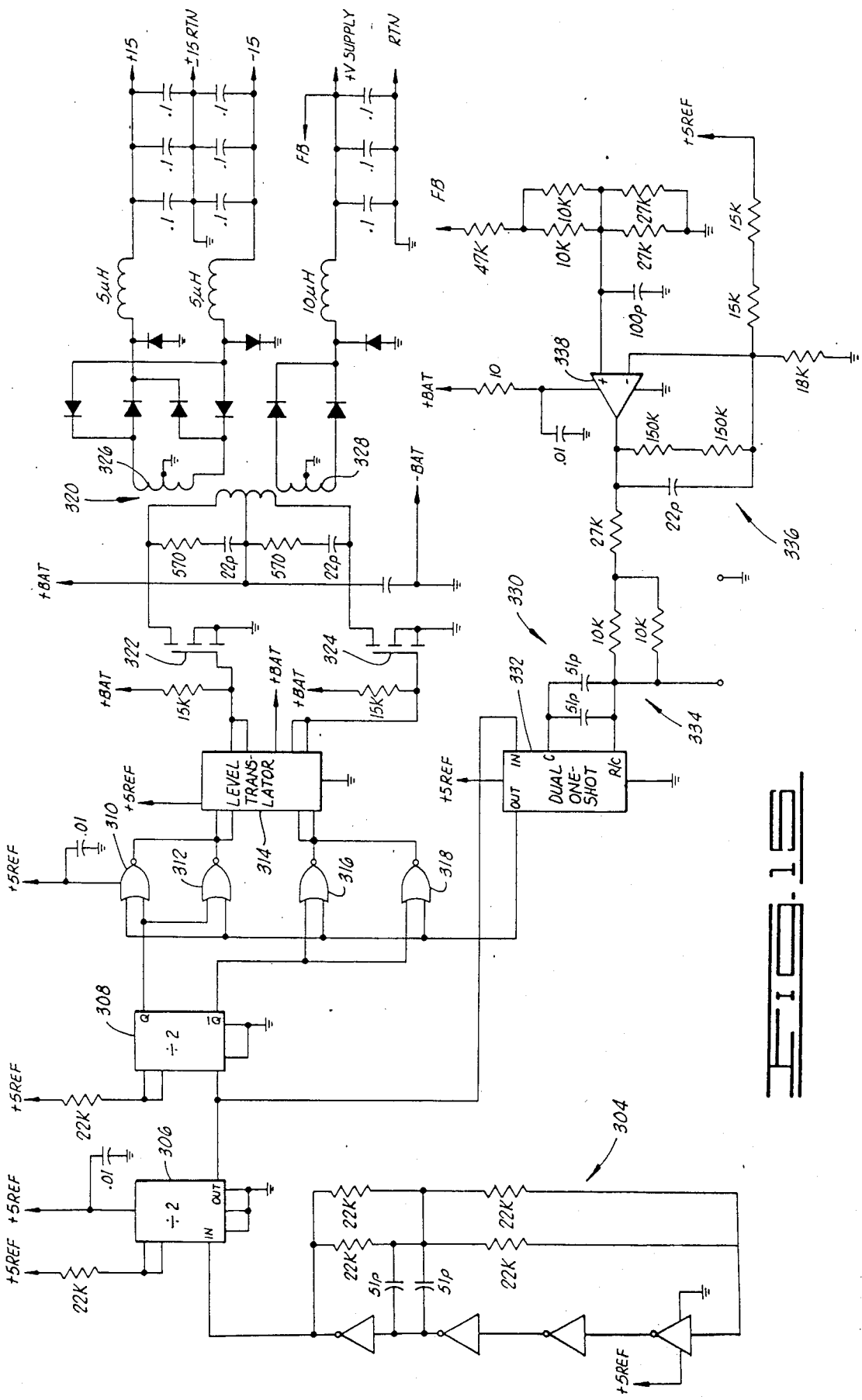
FIG. 16 is a schematic circuit diagram of the preferred embodiment of a controllable interconnection circuit for the ±15-voltage source of the power converter and control portion of the controller/power converter and control/memory section.

The +15-volt sources provided by the circuit shown in FIG. 15 can be connected or disconnected, as the +15SW and −15SW power signals, to or from the transducer circuit, under command of the $\overline{\text{XDRSW}}$ signal from the central processing unit circuit 24, through the power switch circuit schematically shown in FIG. 16. By controlling the logic level of the $\overline{\text{XDRSW}}$ signal applied to a control line 340, the conductivity of transistors 342, 344, 346 can be controlled to conduct or not conduct from the +15-volt sources, connected at the input of the power switch circuit, to the transducer section 12, connected to the output of the power switch circuit.

Figure 17:
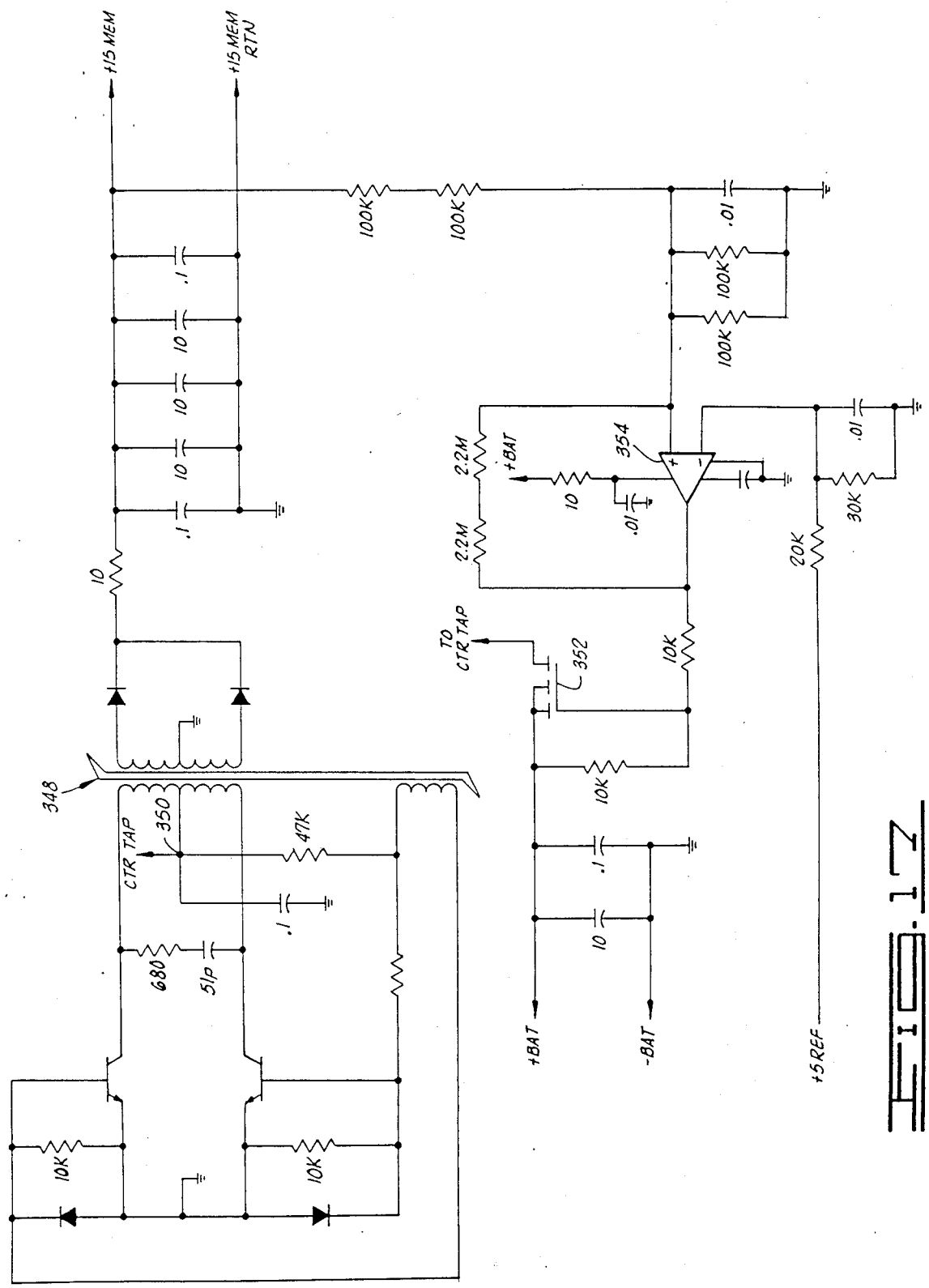
FIG. 17 is a schematic circuit diagram of the preferred embodiment of a memory power circuit of the power converter and control portion of the controller/power converter and control/memory section.

The schematic circuit diagram of the preferred embodiment of a +15-volt memory power source is shown in FIG. 17. This circuit provides a self-oscillating DC-DC converter for converting the battery voltage to a +15-volt level for use, upon appropriate switchable operation of the power switch transistors 190, 192 (FIG. 10C) having inputs to which the memory voltage is supplied, by the memory programming power supply within the memory portion of the section 14. The circuit of FIG. 17 includes a transformer 348 having a center tap 350 to which the battery voltage can be switchably connected through a transistor 352. A comparator 354 compares the +15-volt memory voltage source with a sample of the +5-volt reference. When the +15-volt memory power source drops to a lower limit, the comparator 354 turns on the transistor 352 to connect the battery voltage to the center tap 350 of the transformer 348. When the +15-volt memory voltage source reaches an upper limit, the comparator 354 turns the transistor 352 off.

Figure 18:
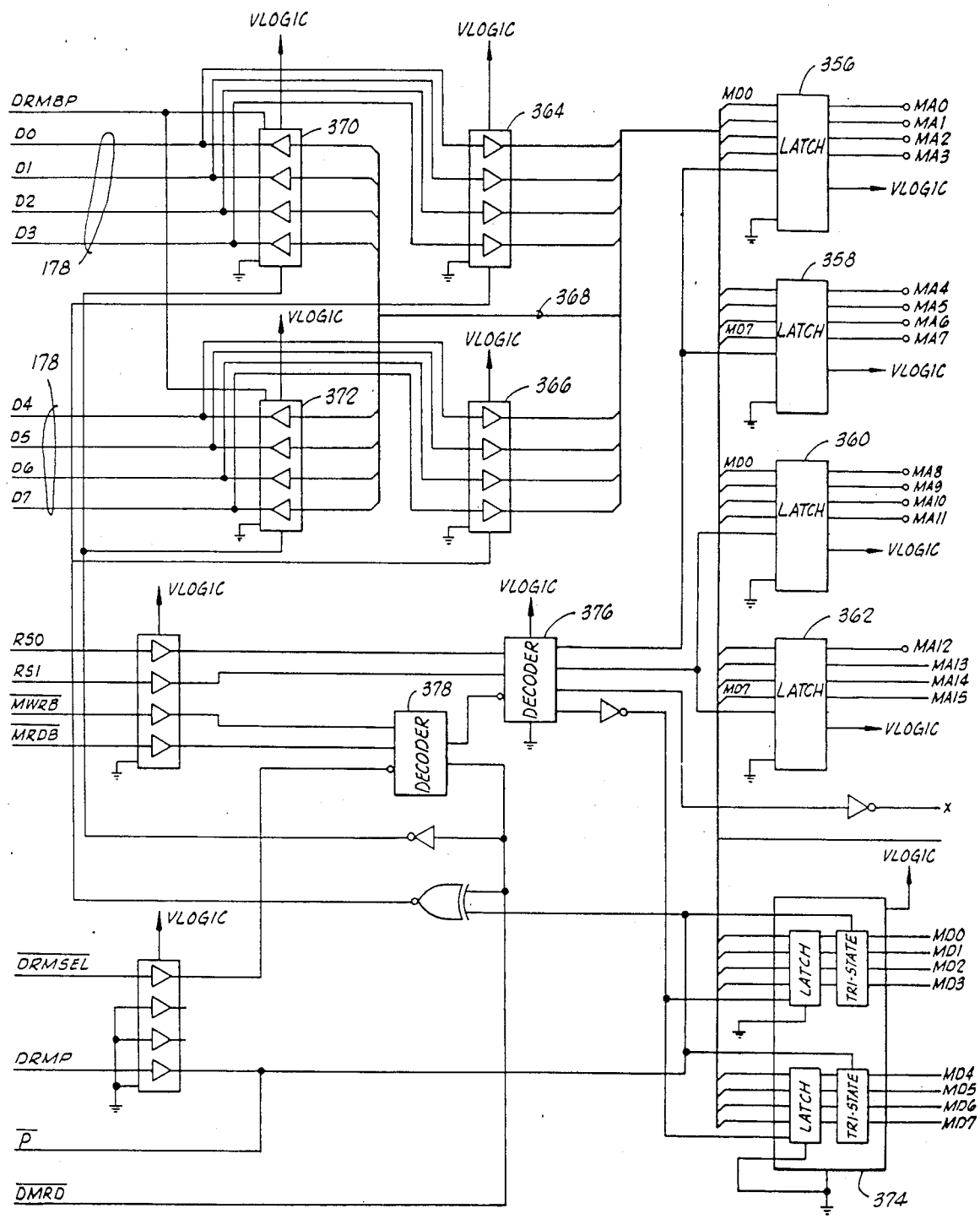
FIG. 18 is a schematic circuit diagram of the preferred embodiment of an addressing/interface circuit of the memory portion of the controller/power converter and control/memory section.
Figure 19A:
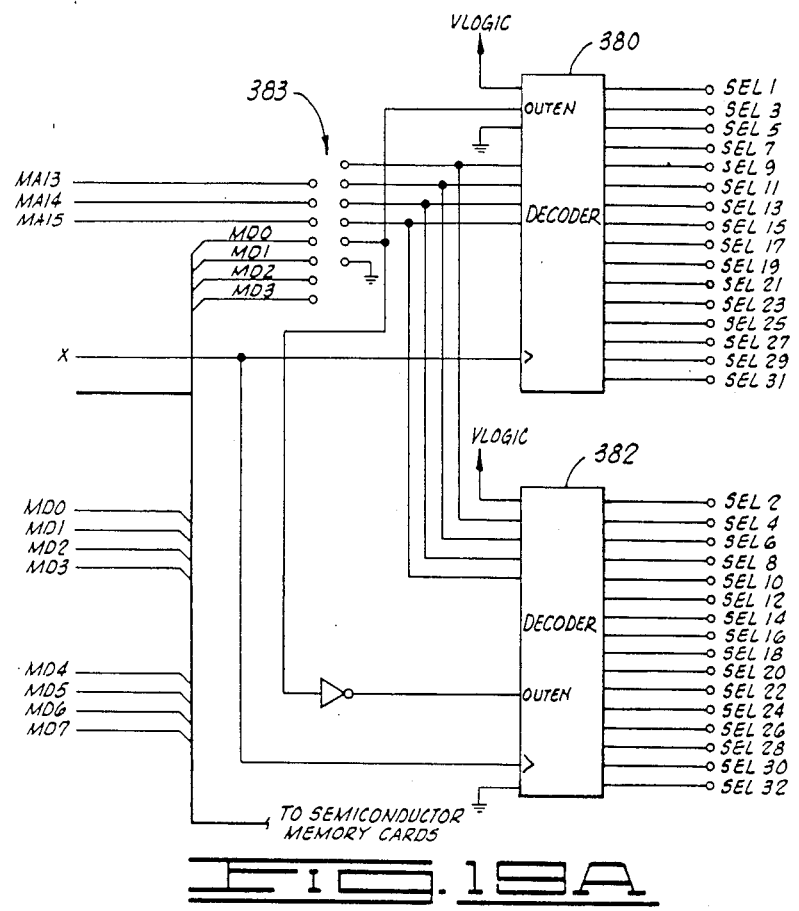
FIGS. 19A–19C are a schematic circuit diagram of the preferred embodiment of a semiconductor memory circuit of the memory portion of the controller/power converter and control/memory section.
Figure 19C:
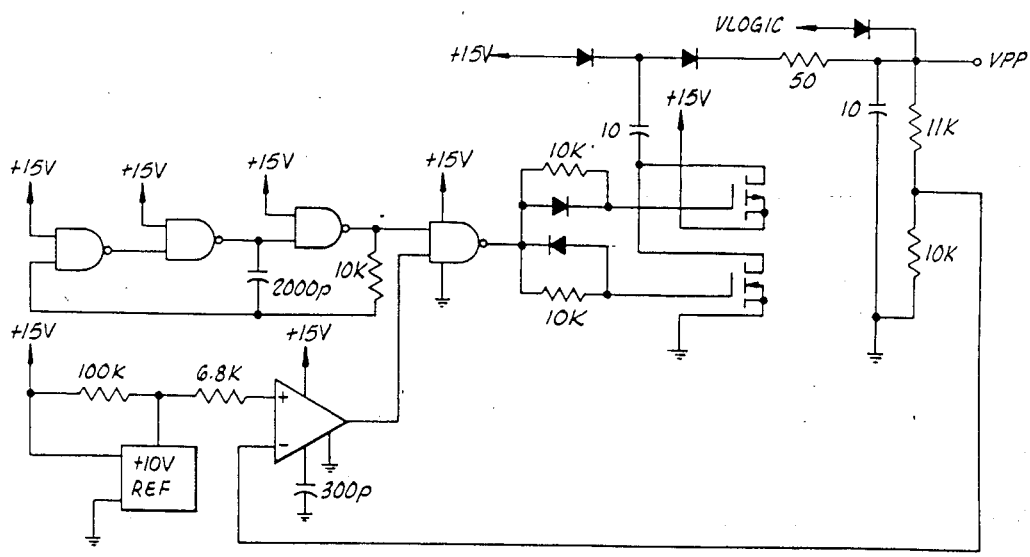
Figure 19B:
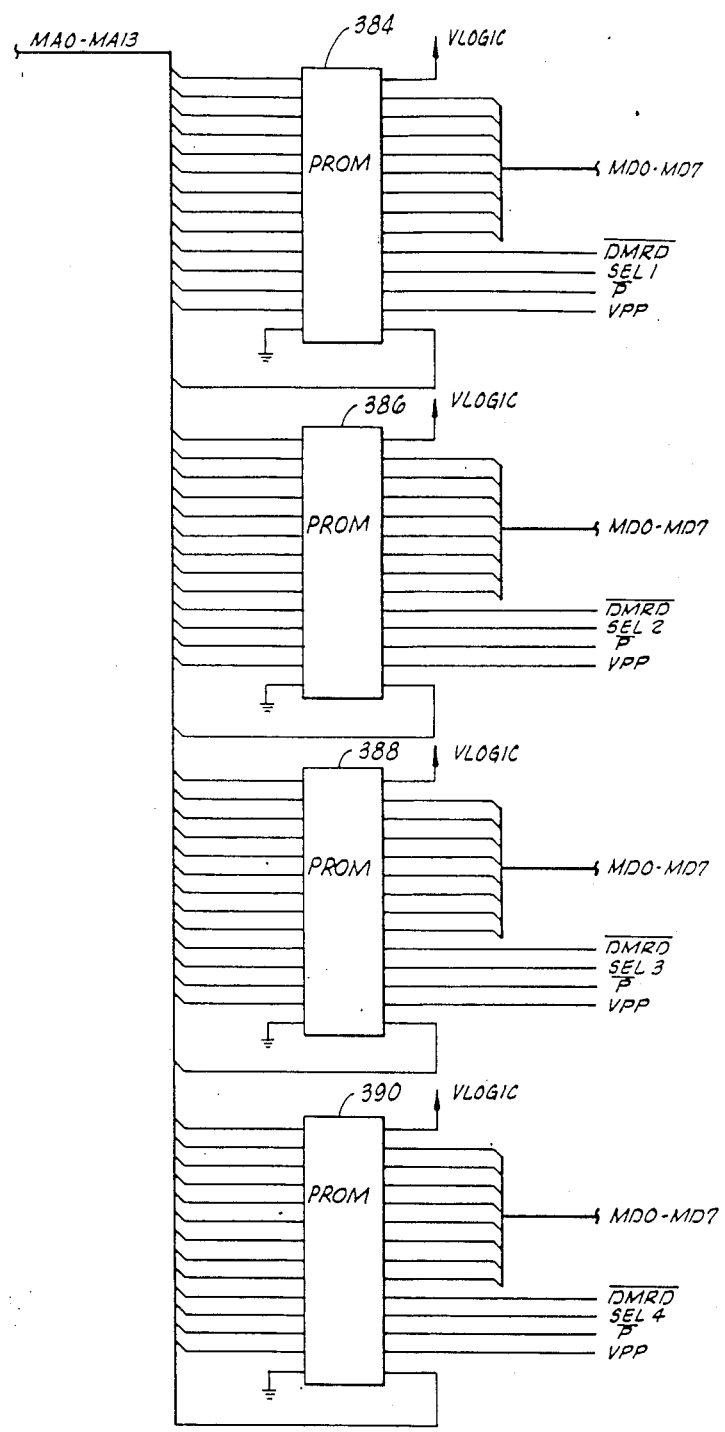
Figure 23B:
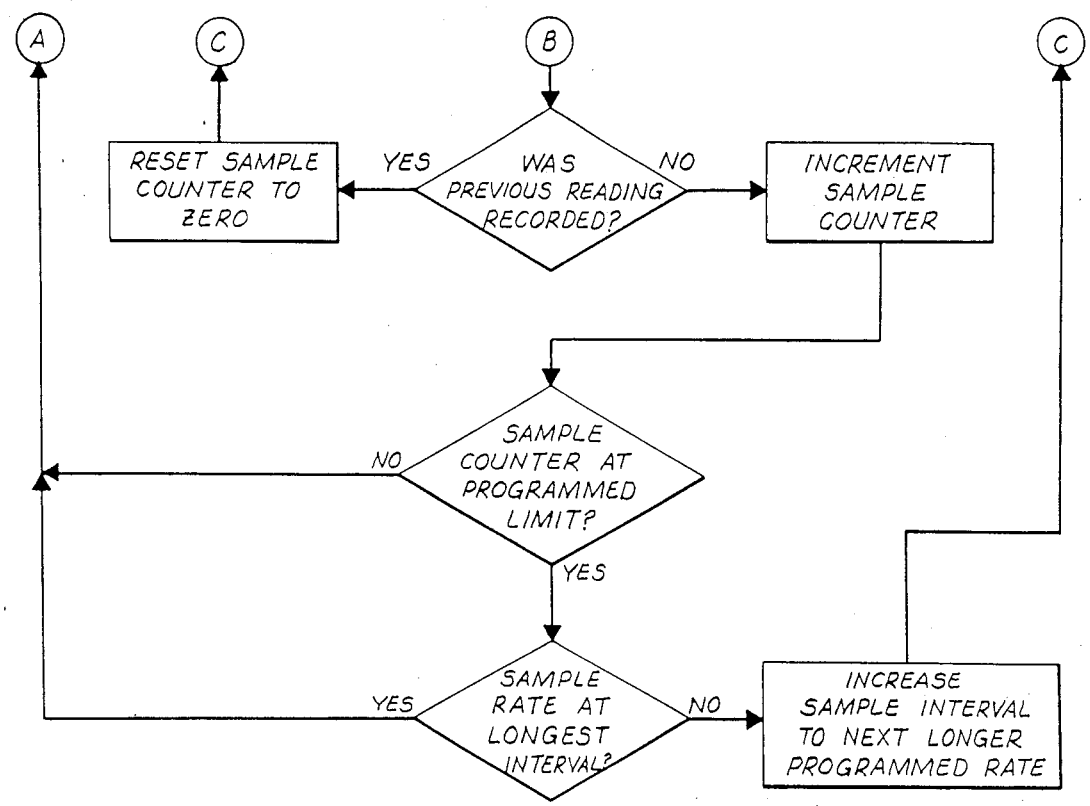
FIG. 23 is a schematic illustration of an eight by eight memory array.

The memory portion of the section 14 of the gauge 2 includes the ciruits shown in FIGS. 18–20. FIG. 18 shows the addressing/interfacing circuit 34. This circuit includes latches 356, 358, 360, 362 for retaining the memory addresses. The memory addresses are entered into the latches 356–362 over the data bus 178 after being passed through buffers 364, 366 connected to the inputs of the latches 356–362. This connection is made over a memory data bus 368 which is made bi-directional through output buffers 370, 372. The memory data bus also is connected to a tri-state latch circuit 374. Control of these circuits is made through channel selectors, or decoders, 376, 378 and the related circuits shown in FIG. 18. The circuit shown in FIG. 18 is used to interface with either the solid state, semiconductor memory schematically shown in FIGS. 19A–19C or the magnetic core memory schematically shown in FIG. 20. The designated VLOGIC power signals are used to energize the memory integrated circuits and the $\overline{\text{DRMSEL}}$ signals are used to select memory sections. These signals are shown in FIG. 12A with ending numerals. These numerals indicate usage with different ones of at least two sections of, for example, the data recording module 14b. Therefore, these signals are not numbered in FIGS. 18–19 because they could be any of the numbered signals depending upon how many modules are used.

The semiconductor memory shown in FIGS. 19A–19C can be used interchangeably with the magnetic core memory shown in FIG. 20; however, in the preferred embodiment, the semiconductor memory is considered an alternate memory to the magnetic core memory which is particularly suitable for high temperature environments where low average power requirements are desirable. FIG. 19A shows that the semiconductor memory includes 4-line to 16-line channel selectors 380, 382 for providing 32 select signals used to select a particular one of the 32 units of semiconductor memory cells. The channel selectors 380, 382 are controlled by means of information provided over the memory data bus and memory address lines shown in FIG. 19A. The selectors are responsive to addresses which are selectable by appropriately strapping address selector terminals 383.

FIG. 19B shows four of the possible 32 solid state semiconductor programmable read only memory chips which can be used in the preferred embodiment of the module 14b. The memory chips shown in FIG. 19B are labeled with the reference numerals 384, 386, 388, 390. The four chips shown in FIG. 19B represent one circuit board or unit of memory in the preferred embodiment; therefore, this memory can be expanded up to eight units of memory in the preferred embodiment.

FIG. 19C shows a schematic circuit diagram of a power supply for generating the +21-volt programming voltage, VPP, for programming the solid state, semiconductor memory. This power supply draws from the +15-volt memory power source illustrated in FIG. 17, as switched through the circuitry of FIG. 10C to become either +15 V or +15 V2. As with the VLOGIC and $\overline{\text{DRMSEL}}$ signals, these ending numerals indicate different modules 14b; therefore, no ending numerals are shown in the single circuit illustrated in FIG. 19C.

The magnetic core memory 40 is schematically illustrated in FIG. 20. FIG. 20 shows a box 392 labeled "core memory address and memory control registers." This includes the same circuit shown in FIG. 18. The magnetic core memory includes a core memory matrix with drivers identified in FIG. 20 by the box 394. The memory matrix 394 includes the actual non-volatile ferrite core elements in which the information is stored. The construction of these elements will be more particularly described hereinbelow with reference to FIGS. 21 and 22. The core matrix 394 has sense lines which are provided to sense amps and output latches 396. A memory register control circuit 398 is used to control the writing and reading of the information into and from the core memory matrix 394. The construction of these elements shown in FIG. 20 are functionally of types as known to the art. However, the mechanical structure of the core memory matrix 394 and its utilization are important as will be described with reference to FIGS. 21–23.

FIG. 21 shows a portion of the core memory matrix 394 in an unfolded, planar configuration wherein the ferrite core elements are distributed across and mounted on an articulated mat comprised of six rectangular support members, designated as strips 400, 402, 404, 405, 408, 410, of known printed circuit board material pivotally interconnected along their edges by flexible tape hinges. In the preferred embodiment, the ferrite core elements provide 256K (262,144) bits of storage and are mounted on core planes comprising sixteen 0.8-inch×4.25-inch sections with four of these sections mounted on the strip 402 as designated by the reference numeral 444, with four of these sections mounted on the strip 404 as designated by the reference numeral 446, with four of these sections mounted on the strip 406 as designated by the reference numerals 448, and with the remaining four sections mounted on the strip 408 as designated by the reference numeral 450, whereby the memory elements lie in different spatial planes when the mat is in a folded, stacked configuration as shown in FIG. 22. The memory elements are mounted so that they lie on one side of the articulated mat when it is in its unfolded, planar configuration. This one side is defined by the substantially continuous and aligned planar surfaces of the members 400-410. In the preferred embodiment the compact core memory matrix 394 can store up to 5,000 samples and can be further expanded.

When installed in the gauge 2, the core memory matrix 394 is folded along the seams connecting each adjacent set of strips 400-410. This construction is illustrated in FIG. 22. When fully folded, the strips 400-410 overlie each other so that overlying edges of the strips are substantially aligned whereby the strips are confined within a width and length equal to the width and length of the longest or longer one of the strips 400-410 as is readily apparent from FIG. 22; in the preferred embodiment this space is sufficient to fit within the tool housing section which includes a longitudinal cavity defined by an inner cylindrical surface of the housing wall having a diameter of less than one inch. The length of the folded mat is approximately twenty-eight inches in the preferred embodiment. In this folded, stacked configuration, the core memory matrix 394 can be housed between and within the channels of two elongated, substantially C- or U-shaped housing strips, or stiffener trays, 412, 414 connected by pins or other retaining means, such as illustrated in FIG. 22 by screw 462, extending through holes 416, 418, 420, 422, 424 defined through the housing strip 412 and matching holes formed through the strips 400-410 and the other housing strip 414. Spacers of the type shown at 464 can be used to separate the strips so that the facing circuits do not touch each other. The spacers are retained along the pins between adjacent ones of the members 400-410.

Although this folded array packs the core elements closely together, there is no temperature problem in the present invention because the cores are not continually driven, but rather are actuated only briefly during the write cycles performed to store the pressure, temperature and time information downhole. No reading from the memory or continual accessing is done downhole.

Mounting on the strips 402, 408 are steering diodes 452, 454, respectively. These are of types as known to the art for use with the X-drive and Y-drive transistors, of types known to the art, which, along with X-sink and Y-sink transistors, of types known to the art, define in the preferred embodiment location selection elements operated in predetermined sets to access each bit or storage location within the memory array. The conductors 456 shown in FIGS. 21-22 are respresentative of conductors extending from the core mat to connections with the aforementioned drivers and sinks. Although these sinks and drivers are actuated in the preferred embodiment to address the 256K bits as a linear array of 256K×1, they are grouped as a 256×512×2 matrix defined by sixteen X-drive transistors and sixteen X-sink transistors (256), by sixteen Y-drive transistors and thirty-two Y-sink transistors (512) and by the direction of current flow (2).

Also mounted on the strips 402, 408 are logic circuits and sense amps 458, 460 forming part of the element 396 shown in FIG. 20.

Although a folded configuration wherein each segment overlies each other is shown in the illustrated embodiment, it is contemplated that other folded configurations, such as in a triangular shape, can be used and are within the scope of the present invention.

To use the compact memory shown in FIG. 22, bit addressing is used so that the bits of any one word of information are individually stored in the core matrix. In the preferred embodiment this addressing is done over a 256K×1 memory array. For example, with reference to FIG. 23, each bit of an 8-bit word of information is stored by suitably controlling a respective set of drive and sink elements associated with the rows R1-R8 and the columns C1-C8 where the storage is to occur. If the 8 bits are stored in rows R1-R8 of column C1, for example, each set includes a column driver 426 and one of the row drivers associated with R1-R8 and their corresponding sink elements (not shown). By appropriately controlling the elements of each of these exemplary sets in a known manner, the 8 bits are individually stored in the 8 memory locations designated in FIG. 23 by the reference numerals 428, 430, 432, 434, 436, 438, 440, 442.

The gauge 2 is constructed in the preferred embodiment to function over several days. In the specific embodiment it is contemplated that the operation life will be 720 hours or 30 days. These limitations are imposed by the life of the battery in the battery section 16 and the capacity of the memory in the memory portion of the section 14. During the operating time when the gauge 2 is downhole, operation is controlled by the programs contained in the program storage read only memory 152. Flow charts of these programs are shown in FIGS. 25-32. These programs, described more particularly hereinbelow, operate automatically or in response to the various control signals found throughout the circuits in the previously described drawings. Two of these signals include the $\overline{\text{TIME}}$ signal generated by the real time clock circuit shown in FIG. 11B and the ΔP signal generated by the ΔP hardware circuit shown in FIG. 5, which signals are the primary control signals for causing the gauge 2 to take a new sample or reading of the monitored environmental condition.

The $\overline{\text{TIME}}$ signal of FIG. 11B is generated when the count of the counter 216, which has been preset by the microprocessor 148, is extinguished, thereby signaling that a sleep period has ended. This signal is provided to the primary power switch circuit comprising the latch 246, the transistors 254, 256 and the related circuitry shown in FIG. 12B. This signal is inverted and provided to an input of the OR gate 248. The other input of the OR gate 248 is connected to the inverted logically OR'd ΔP and $\overline{\Delta\text{PEN}}$ signals. The output of the gate 248 is fed through the OR gate 250 to reset the latch 246. The inverted output of the latch 246 controls transistors 254, 256 to provide the +VCPU power signal. In response to the GO TO SLEEP signal, the non-inverted output of the latch 246 causes the $\overline{\text{SLEEPEN}}$ and $\overline{\text{WAIT}}$ signals to be generated to commence a sleep period; at this time, the +VCPU signal is deactivated. The output of the OR gate 248 also connects to the transistor 260 to provide the interrupt signal, $\overline{\text{INT}}$, also shown in FIG. 12B. The interrupt signal is provided to the microprocessor 148 to initiate a wake-up procedure and the taking of another sample in accordance with the means of the gauge 2 including the programs depicted in FIGS. 25-32.

The ΔP interrupt signal ($\overline{\Delta\text{PINT}}$) is generated in response to the ΔP signal from the ΔP circuit 22 in the transducer section 12. It is provided to the central processing unit as shown in FIG. 10A for use within the means thereof including the programs depicted in FIGS. 25-32 for controlling the sampling of the monitored environmental condition. This interrupt signal is specifically generated from the output of the inverter gate connecting the logically OR'd ΔP and $\overline{\Delta PEN}$ signals to the gate 248, which output clocks the latch 258 shown in FIG. 12B.

The specific software-controlled times at which samples are to be taken, as indicated by the $\overline{TIME}$ signal, are determined by in which of two principal modes the preferred embodiment of the present invention is operated. One mode is the fixed interval mode wherein samples are taken at a fixed interval, such as every one second or one minute, regardless of which parameter is being monitored or the change between consecutive samples of a parameter. The other mode is the variable interval mode wherein samples are taken at a sample rate dependent upon the rate of change of the sampled parameter and also dependent upon whether the ΔP circuit 22 detects a fast change in the pressure. The various stages of operation within this variable sample rate mode will be described with reference to FIG. 24.

Figure 24:
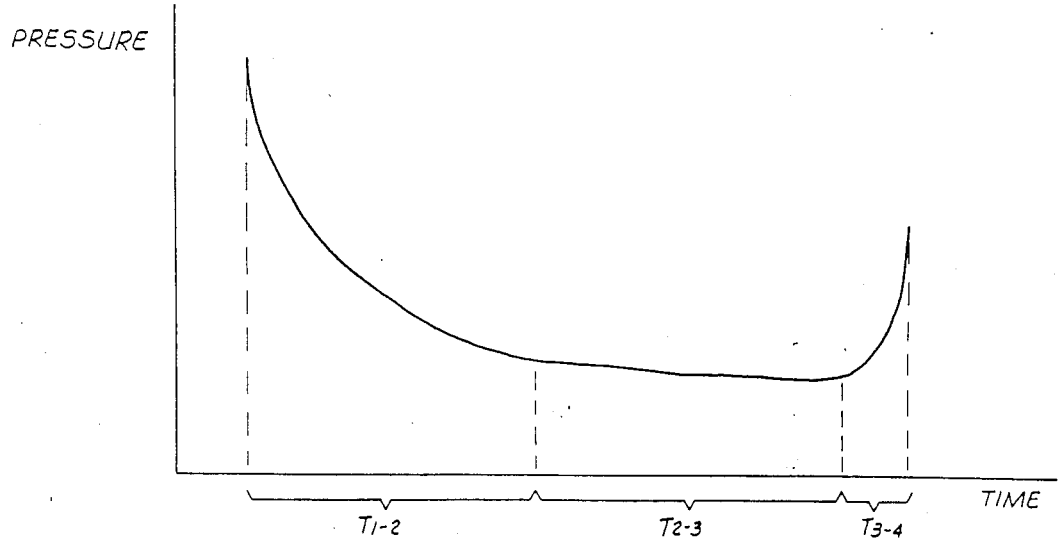
FIG. 24 is a diagram of a pressure graph exemplifying pressure within a well bore over time.

FIG. 24 illustrates a pressure curve plotted over time. During time period $T_{1-2}$, the software controlling the microprocessor 148 determines that the pressure is changing sufficiently between consecutive samples whereby a relatively fast sample rate is to be used to insure that sufficient samples are taken during this period of significant change. During the time period $T_{2-3}$, the software determines that the change in the pressure is sufficiently linear so that a longer sample rate can be used without losing important information. Therefore, to conserve energy and memory, the software switches to a slower sample rate. Because an important event (i.e., a rapidly changing pressure) can occur betwen the longer sample times during time period $T_{2-3}$ (or even between the samples taken at the faster rate during $T_{1-2}$), the ΔP hardware circuit 22 is utilized. The circuit 22 detects the rapidly changing pressure which occurs during time period $T_{3-4}$ showh in FIG. 24, which change would otherwise be missed if the gauge 2 were operating only under software monitoring. The event shown in FIG. 24 within time period $T_{3-4}$ illustrates what could happen when the well is shut in during a drill stem test, for example. This would occur subsequent to the valve open and flow periods exemplified by the graph during time periods $T_{1-2}$ and $T_{2-3}$.

In addition to the foregoing two modes, it is contemplated that the gauge 2 could operate in any other suitable mode. For example, the mode could be one wherein a fixed time interval in effect slides in correspondence with any rapid pressure changes detected by the ΔP hardware circuit 22. Or, it could operate in a variable mode dependent upon various thresholds set for the detected parameters. Whichever mode or modes are implemented, they are implemented by presetting the gauge 2 at the surface since no downhole communication is utilized in the preferred embodiment. However, it is contemplated that such surface to well bore communication can be implemented, such as by acoustic, wire line, pressure pulse or other suitable signals.

Figure 25A:
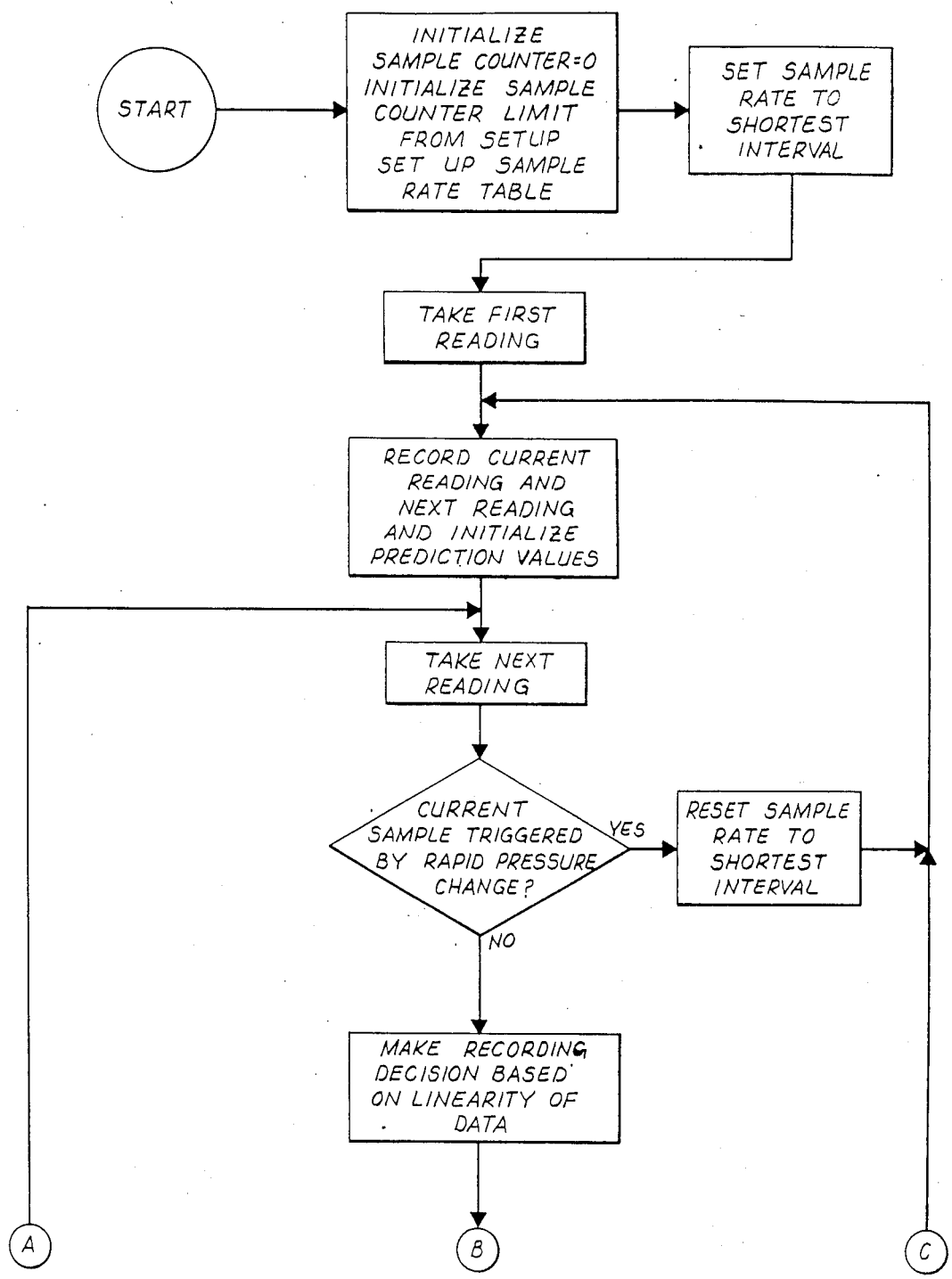

The flow chart of the software used to implement the variable rate sampling mode is shown in FIGS. 25A-25B. As previously mentioned, this operation is responsive to changes in the pressure (or other monitored parameter) observed while the gauge 2 is sampling as described hereinabove with reference to FIG. 24. The sample rate change is also dependent upon the ΔP hardware circuit 22 as previously described. When a faster rate (shorter sample interval) is selected, a lower resolution is also selected because at the faster rate there is not enough time to achieve a higher count in the counters 292, 294 shown in FIG. 13C. The lower resolution is selected through the multiplexer 280 under control of the microprocessor 148 and the variable rate sampling program shown in FIGS. 25A-25B. In the preferred embodiment each sample rate or interval is stored during initialization with corresponding resolution control information so that when the program of FIGS. 25A-25B causes a new sample rate or interval to be selected, the corresponding resolution information is also selected, for controlling the microprocessor 148 to properly operate the multiplexer 280. When a slower sample rate (longer sample interval) is selected, a higher resolution is used because the counters 292, 294 then have sufficient time to achieve a higher count, thereby providing a higher resolution. In the preferred embodiment, a resolution of 0.01 psi is used when a sample rate of greater than or equal to four seconds is selected, and a resolution of 0.1 psi is used when a sample rate of less than four seconds is selected. In the preferred embodiment, the decision to select a slower sample rate is based upon whether the pressure (or other detected condition) is greater than or less than, by a predetermined variance, a predicted pressure (or other monitored condition). Whenever a rapid pressure change is detected, the tool returns to full operation regardless of the present sample rate or the programmed off time duration when the tool is operating in the variable rate sampling mode. When such and event occurs, the shortest or fastest sample rate is entered by the software.

With reference to FIGS. 25A-25B, the program depicted by the flow chart shown therein will be more specifically described. The first operation shown in FIG. 25A includes the initialization of a software maintained sample counter by setting it to zero and the initialization of the sample counter limit (i.e., the maximum number of samples to be read before the interval is lengthened) and the setting-up of the sample rate table wherein a plurality of different sample rates, or intervals, and the corresponding resolution control information are entered in a table maintained in the random access memory 154, for example. These are steps which one skilled in the pertinent arts would be able to readily implement.

After initialization, the program sets the sample rate to the shortest interval, thereby selecting the fastest sample rate. A first reading, or sample, of the monitored condition is then taken and recorded. A next reading is taken and recorded, and a third reading is taken. These first three samples are taken at the sample rate then being used, which for the initial three samples is the shortest sample interval.

Using the three samples, prediction values are determined by first computing a difference, d, as follows: $d = [(S3 - S1)/2 + (S2 - S1)]/2$, where S1 equals the first sample, S2 equals the second sample and S3 equals the third sample. To predict the n-th point, the equation $Sn = S1 + (n-1)(d)$, where n=2,3,4, etc. is used.

Having initialized the prediction values by the foregoing equations, the next sample is read. After this reading, the software determines if the current sample has been taken in response to a rapid pressure change detected by the ΔP circuit 22 as indicated to the microprocessor 148 by the $\overline{INT}$ and $\overline{\Delta PINT}$ signals. If this has occurred, the sample rate is reset to the shortest interval and a new prediction step is commenced.

If the current sample is not triggered by the rapid pressure change, the previously determined prediction value for the current sample is compared with the actual current sample. If the absolute value of the difference between this, the n-th reading, and the predicted n-th reading is greater than a programmed difference threshold, then the previous, or (n−1)-th, reading is recorded as having been the last point in a linear region of data, the sample counter is reset to zero, and a new prediction is made (as indicated by the balloon C). If the difference is less than the programmed difference threshold, the sample counter is incremented and checked against the programmed sample count limit. If the count limit has been reached, the next longer programmed sample rate is selected and the process returns to begin a new prediction step as indicated by the balloon C shown in FIG. 25B. New prediction values are based upon data commencing with the (n−1)-th point.

Any time the sample rate is changed, such as due to a rapid pressure change or to no readings being recorded for the programmed number of time intervals, the process causes a software-controlled status flag to be set to indicate the change and reinitialization is performed.

It is respectfully submitted that the steps shown in FIGS. 25A-25B are otherwise self-explanatory and can be implemented readily by those skilled in the pertinent arts.

In addition to being responsive to the software monitored changes in the sampled parameter and to the ΔP hardware circuit 22, the variable rate sampling program is also responsive to the remaining battery life and the remaining memory capacity as shown in the flow chart depicted in FIG. 26. When the program detects that the remaining battery life is diminishing (as can be determined by counting the number, or monitoring the widths, of the pulses output by the pulse width modulator 330, for example) the software adjusts the sampling rate. One specific technique for obtaining a signal indicating the state of the battery is to connect the +BAT signal to the input of a voltage controlled oscillator, in a manner analogous to the temperature transducer shown in FIG. 3. The output of the voltage controlled oscillator would then be connected to a presently unused input of the multiplexer 278 shown in FIG. 13B so that it could be read by the central processing unit. The central processing unit would compare the reading with a table of predetermined entries correlating the voltage controlled oscillator output with remaining battery life. Once the reading and comparison showed a sufficient decline in the battery (such as the detected parameter being below a predetermined threshold), a bit designating that the battery is getting weak would be set in a battery status register to be read by the program as indicated in FIG. 26. This program also keeps track of how much memory remains, and it adjusts the sample rate to prolong the length of time that samples are taken. Theoretically, the program is to monitor battery life and remaining memory and do whatever is necessary so that the last bit of energy or the last memory location is never used during the programmed test time.

Referring to FIG. 26, once the battery is determined to be weak, such as described hereinabove, the program checks another software register to determine if a fixed rate bit has been set. If not, the program sets the bit to enter a fixed rate sampling mode rather than a variable rate sampling mode. After this is done, the next longer sample interval is selected or four times the maximum interval is selected if the maximum value has been previously used. Similar adjustments are made in the portion of the program shown in FIG. 26 performing the full memory check. It is believed that these steps are self-explanatory; however, in general, the program detects when the memory has reached either of two predetermined thresholds (87% and 97% in the depicted preferred embodiment) and lengthens the sampling interval when this occurs. All of the steps shown in FIG. 26 could be readily implemented by one skilled in the pertinent arts.

Figure 27:
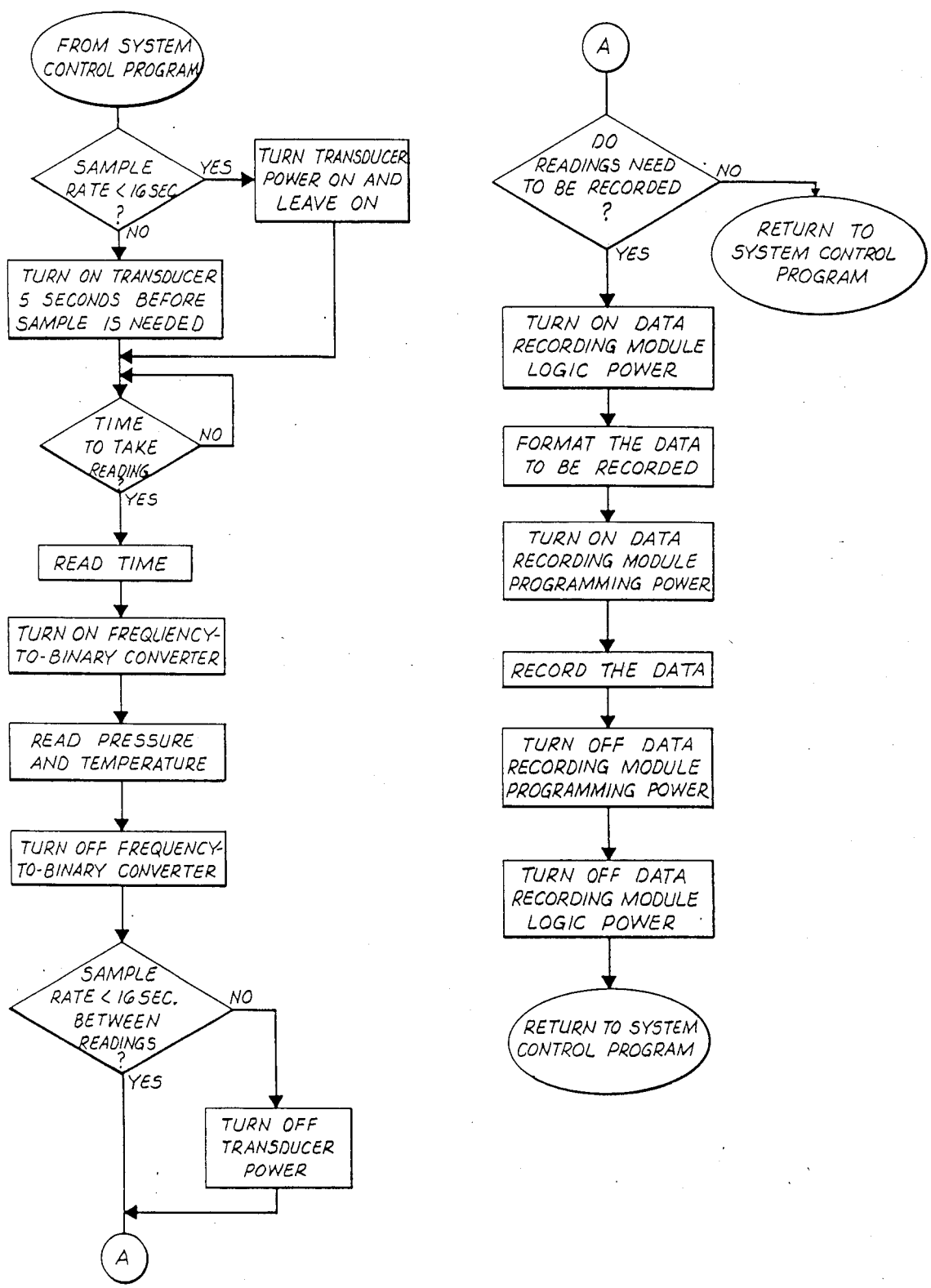
FIG. 27 discloses a flow chart of the preferred embodiment of a power control program by which samples of the monitored conditions are obtained, formatted, and recorded.
Figure 28:
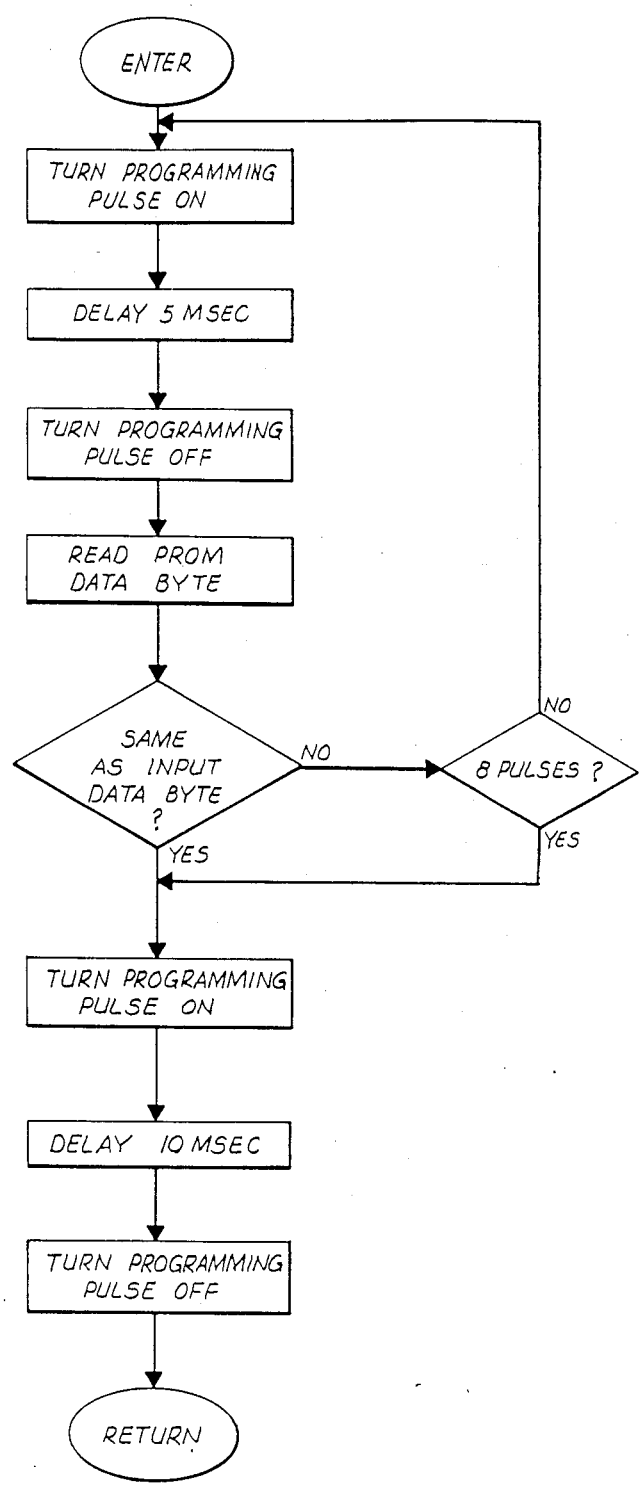
FIG. 28 discloses a flow chart of the preferred embodiment of a program for generating at least one programming pulse to record information in the semiconductor memory of the present invention.

The storing function for storing information derived from the samples is controlled by the data recording programs shown in FIGS. 27-28. THe raw data used by the microprocessor 148 for storing the information are contained in the binary bits at the outputs of the counters 292, 294 shown in FIG. 13C. When this information is received by the microprocessor 148, the microprocessor 148 determines periods of linear data in accordance with the steps shown in FIGS. 25A-25B. When such a period is detected, only the end points of the linear data period are recorded to minimize the number of data bits stored in the memory portions of the section 14, thereby conserving memory space. When linear data periods are not detected, the changes in the formation from the preceding sample, rather than the raw data, are stored to again conserve the amount of memory used per sample. The particular recording technique implemented uses variable length records with Huffman encoded identification fields and an adaptation of the advanced data communication control procedure (ADCCP) plus a parity bit for data integrity indication.

FIG. 27 discloses a flow chart of a program for controlling the microprocessor in obtaining information as well as in conserving energy during the process. The program commences by first determining whether the previously selected sample rate interval is less than 16 seconds. If it is, the transducer power is turned on by appropriately actuating the $\overline{\text{XDRSW}}$ signal shown in FIG. 10C. If the sample rate interval is greater than 16 seconds, the transducer is turned on five seconds (or other suitable transducer stabilization time) before the sample is needed. Next, it is determined, by monitoring the $\overline{\text{INT}}$ signal, whether a reading needs to be taken. When a reading is to be taken, the time is read from the timer chip 198 shown in FIG. 11B. Then the frequency-to-binary conversion means is energized by turning on the +VFBC power signal shown in FIG. 10C. This enables the frequency-to-binary conversion circuits to process the signals from the transducer section 12 and provide the count at the outputs of the counters 292, 294 shown in FIG. 13C.

After the pressure and temperature are read from these conters by the central processing unit, the central processing unit turns off +VFBC to deenergize the frequency-to-binary conversion means. Under control of the program shown in FIG. 27, the central processing means then determines if the sample rate interval is less than 16 seconds. If it is not, the $\overline{\text{XDRSW}}$ signal is deactivated to turn off the transducer power provided to the circuit shown in FIG. 16.

If a sample needs to be recorded, as determined by the sample rate program shown in FIG. 25, the central processing unit activates +VDRM and appropriately controls the power switch chip 234 so that logic circuit power signals VLOGIC are provided to the data recroding module. The central processing unit then formats the data to be recorded in accordance with any acceptable formatting scheme as would be known to the art, and then the data recording module programming power is turned on. For storing data in the semiconductor memory of the portion 14b, for example, the data recording module programming power is turned on by appropriately controlling the transistors 190, 192 shown in FIG. 10C to provide the +15 V power signals to the VPP generating circuit shown in FIG. 19C. With this power, the digital information is recorded in the semiconductor memory. The actual writing to the magnetic core memory is accomplished in a suitable manner as known to the art.

Once the data are recorded, the data recording module programming power is turned off the deactivating the transistors 190, 192 shown in FIG. 10C (for the semiconductor memory), and then the data recording module logic power is turned off by appropriately controlling the power switch chip 234 shown in FIG. 12A and the transistor 194 shown in FIG. 10C.

Figure 29A:
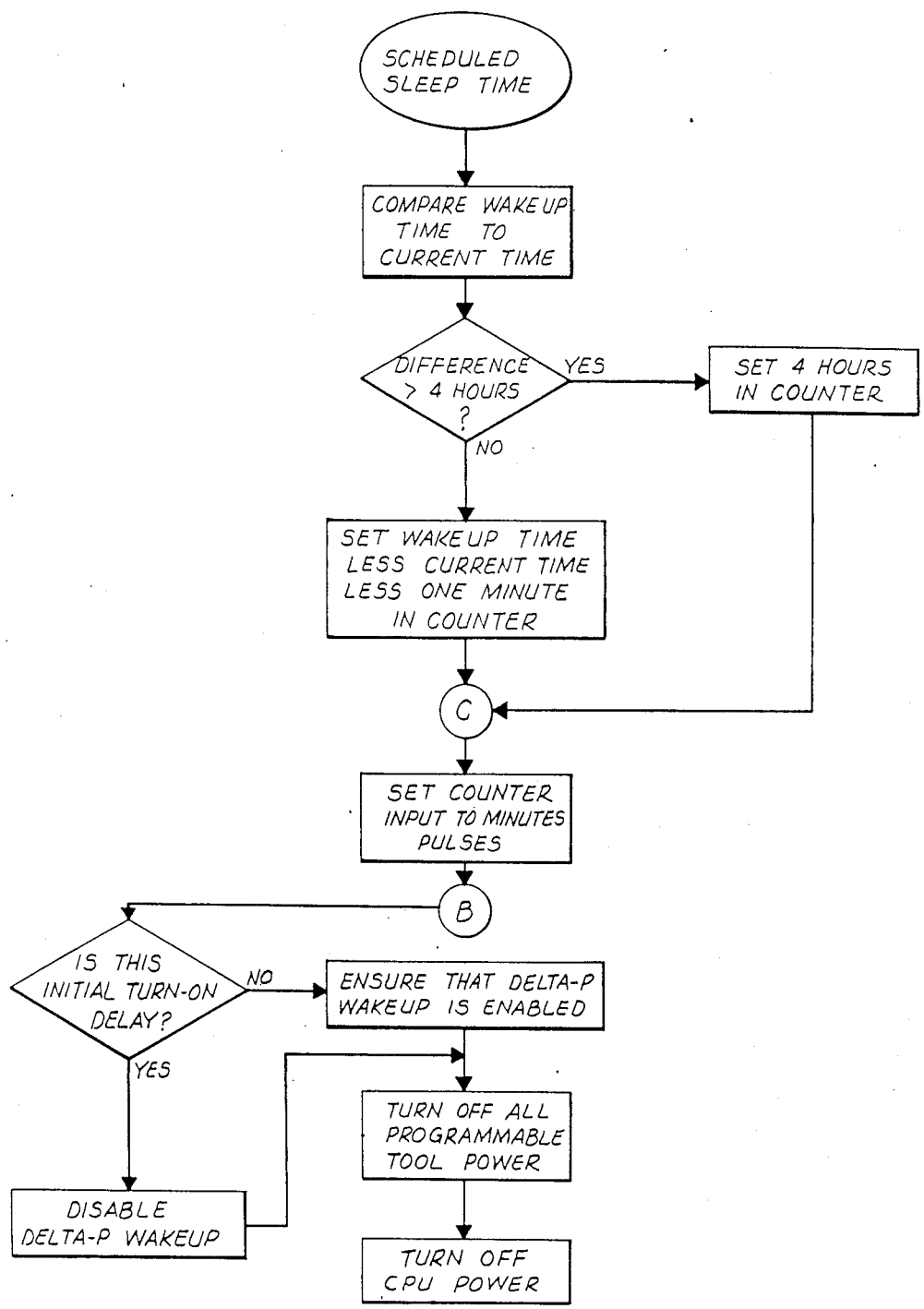
FIG. 29A discloses a flow chart of the preferred embodiment of a scheduled sleep time program by which the present invention can be preprogrammed to de-energize itself at scheduled times for conserving electrical energy.
Figure 29B:
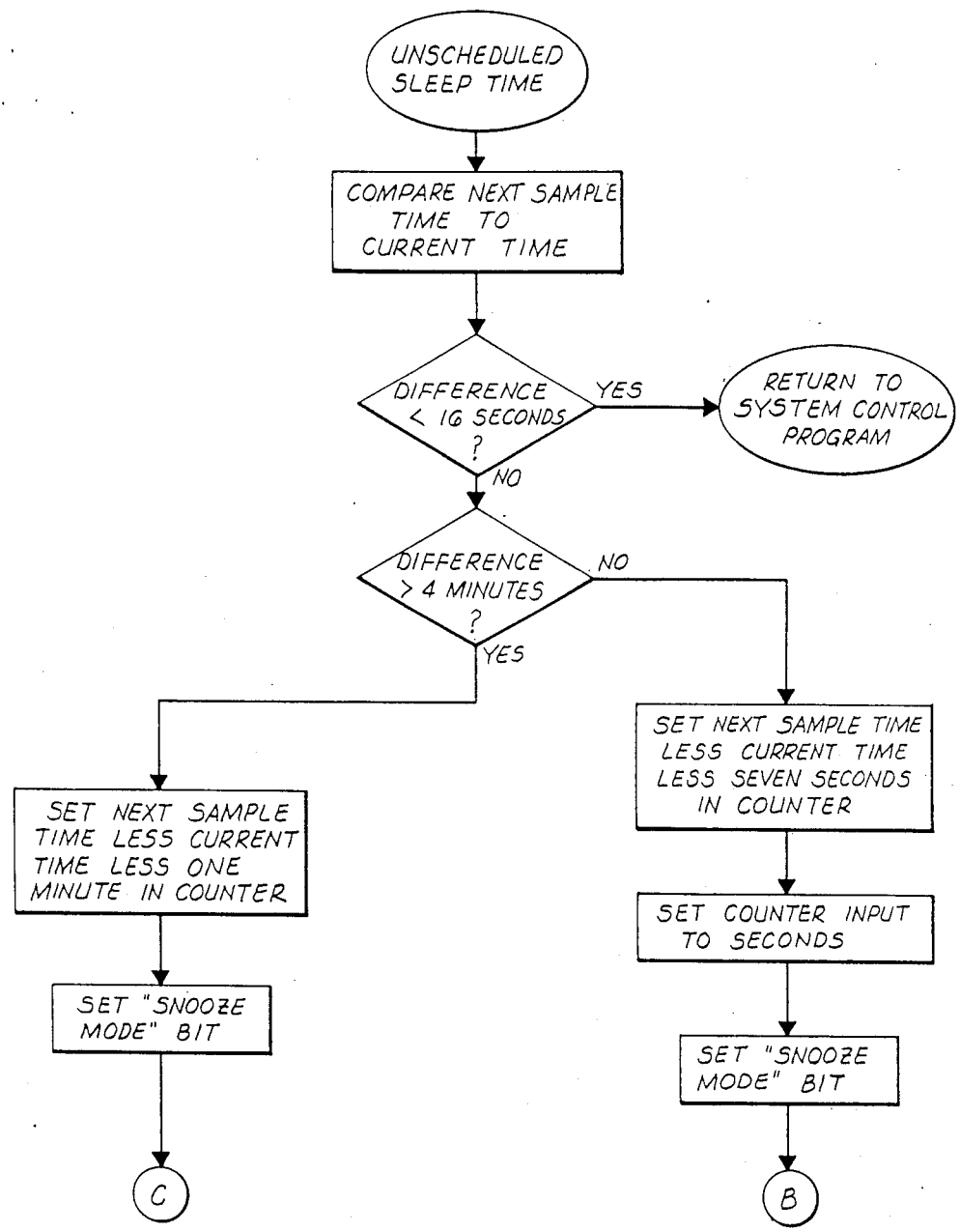
FIG. 29B discloses a flow chart of the preferred embodiment of an unscheduled sleep time program by which the present invention can turn itself off dependent upon how much time there is until the next sample is to be taken for also conserving electrical energy.

Other power conserving or managing programs of the preferred embodiment of the present invention are the sleep mode power control programs having flow charts shown in FIGS. 29A-29B. The scheduled sleep time program of FIG. 29A provides selectable initial turn-on delay to conserve the battery power while the tool is being run into the well bore 4. This program also permits a selectable number of cycles of selectable tool power on/power off after the gauge is downhole. This conserves battery power while scheduled changes in surface equipment and configuration are taking place during long tests, for example. The unscheduled sleep time program of FIG. 29B provides variable power-down dependent upon the sample interval. This also conserves battery power by not continually energizing portions of the tool which might not be continually needed. These features are implemented by controlling the various power sources activated through the transistors 180-188 shown in FIG. 10C and the transistor 256 shown in FIG. 12B. One specific time during which the power-down of selected portions occurs is during the intervals between samples (when the interval is greater than a predetermined time in the preferred embodiment).

The scheduled sleep time program shown in FIG. 29A first compares a preset wake-up time, entered during the initialization of the gauge 2 with the interface 8 and the computer system 10, to the current time maintained in the timer chip 198 shown in FIG. 11B. If the difference is greater than four hours, then four hours is programmed into the counter 216 and the multiplexer 220 is controlled so that the counter 216 is clocked by the one-minute timing pulses taken from the timer 198 through the multiplexer 220. If the difference is not greater than four hours, the preset wake-up time minus the current time minus one minute is entered into the counter 216, which counter is thereafter pulsed by the one-minute timing pulses. The program shown in FIG. 29A then determines whether this scheduled sleep period is the initial turn-on delay (e.g., when the gauge is run in the hole). If it is the initial delay, then the program disables the $\Delta \overline{PEN}$ signal so that any rapid pressure changes occurring during running in the hole, for example, will not energize the gauge. If it is not the initial delay, then the program insures that the $\Delta \overline{PEN}$ signal shown in FIG. 11B is enabled so that the $\Delta P$ signal will be detected in the circuitry shown in FIG. 12B to awaken the gauge 2 should a sufficiently large change in pressure be detected. After whichever one of these two decisions is made and the $\Delta \overline{PEN}$ signal is either disabled or enabled, the software causes the microprocessor 148 to turn off all the programmable power signals shown in FIG. 10C and to generate the GO TO SLEEP signal which clocks the latch 246 shown in FIG. 12B to turn off the +VCPU power signal. The foregoing routine for scheduled sleep time is performed at each sample time.

Also occurring at each sample time is the process shown in the unscheduled sleep time program disclosed in FIG. 29B. This program compares the next sample time to the current time and if the difference is less than 16 seconds, it returns to the system control program shown in FIGS. 32A-32C. If the difference is not less than 16 seconds, the program then determines whether the difference is greater than four minutes. If it is, the program sets the next sample time minus the current time minus one minute in the counter 216, sets a snooze mode bit in a software monitored register and goes to point C in the program shown in FIG. 29A. If the difference is not greater than four minutes, the next sample time minus the current time minus seven seconds (or other suitable warm-up period) is entered in the counter 216, the multiplexer 220 is controlled to clock the counter 216 with the one-second timing pulses, and then the snooze mode bit is set. Thereafter, the program goes to point B in the flow chart shown in FIG. 29A to perform the subsequent steps shown therein and described hereinabove. The snooze bit informs the gauge that no reinitialization of the sample rate program (FIGS. 25A-25B) needs to be performed upon wake-up from an unscheduled sleep period.

The foregoing steps shown in FIGS. 29A-29B can be readily implemented by those skilled in the pertinent arts.

When the bits of information are to be stored in the semiconductor memory shown in FIGS. 19A-19C, each bit is written to the memory for less than the manufacturer's specified write time; however, this is repeated several times, then a read is performed to verify that storage has occurred. This is also done with different voltages than are specified. This semiconductor programming routine is shown in the flow chart of FIG. 28, which flow chart is self-explanatory and which could be readily implemented by those skilled in the pertinent arts.

When the bits are to be stored in the storage locations of the magnetic core memory shown in FIG. 20, the storage program of the preferred embodiment is aware of inoperable location selection elements, such as bad drive and sink transistors, so that storage is not attempted in inoperable locations. Furthermore, when the magnetic core memory is used, the words of information are stored bit-by-bit.

To determine what memory locations in the magnetic core are not properly accessible due to bad drive and sink elements prior to the time the gauge 2 is lowered into the well bore 4, a surface test is performed under control through the interface 8 but with a program stored in the memory 152. When the bad locations (more specifically, the inoperable drive and sink transistors) are determined, a record of that information is stored in an operable portion within the core memory contained in the gauge 2. During the question and answer session which is conducted with the interconnected gauge 2, interface 8 and computer system 10, these bad memory locations are read from the core memory and transferred to the random access memory 154 shown in FIG. 10B. Inside the random access memory 154, the information can be accessed by the microprocessor 148 when it is conducting sample reading and storing operations. This feature of the present invention permits partially defective memories to be used. A flow chart of this memory test program is shown in FIGS. 30-31.

More particularly, in the preferred embodiment, the memory test program writes and reads through pairs of drive and sink transistors to determine whether the transistors in the pairs are functional. From this information, an address map locating the non-functional memory drive and sink transistors is created.

Figure 30:
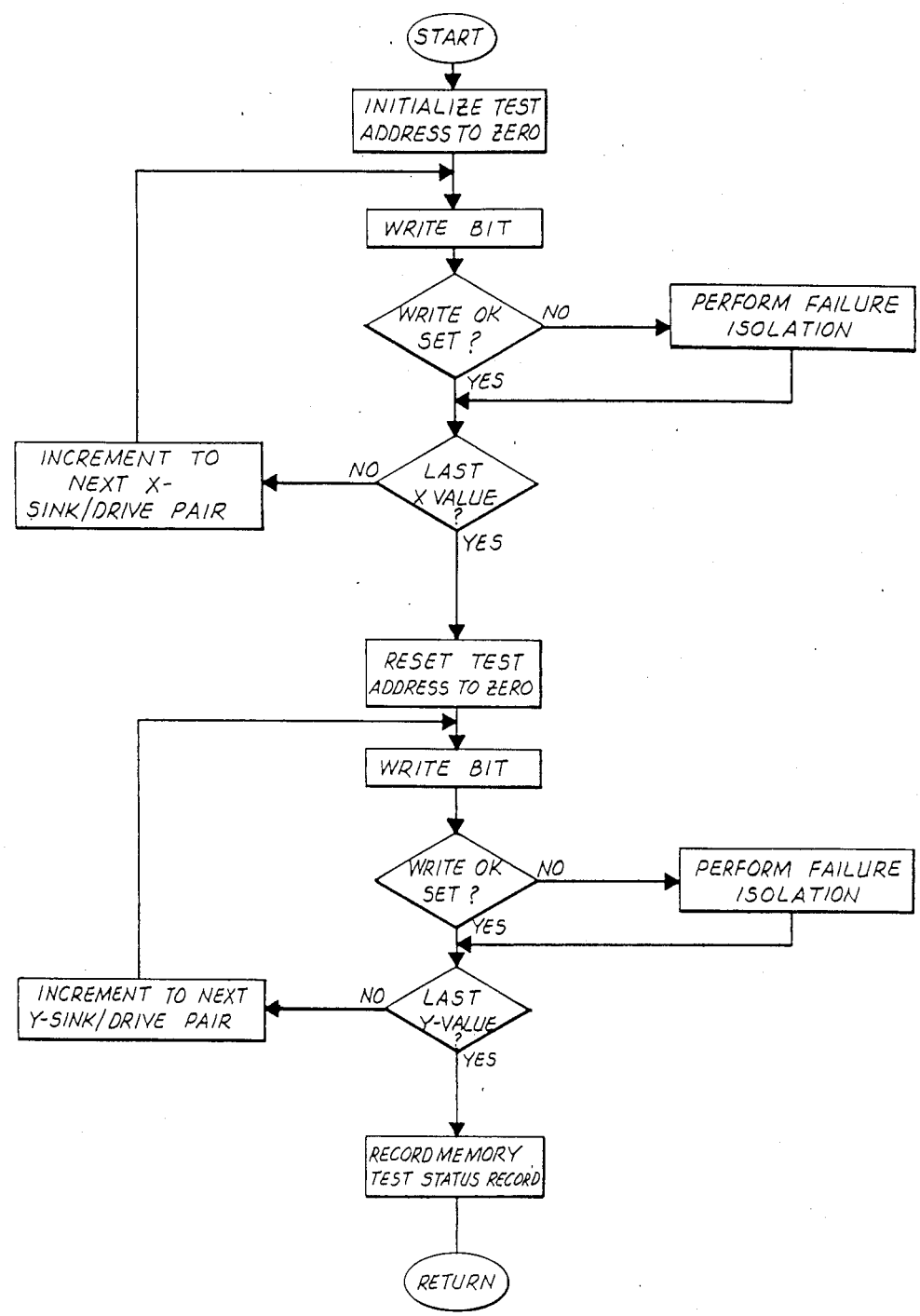
FIG. 30 discloses a flow chart of the preferred embodiment of a magnetic core memory test program by which the sink/drive transistor pairs are tested for operability.
Figure 31:
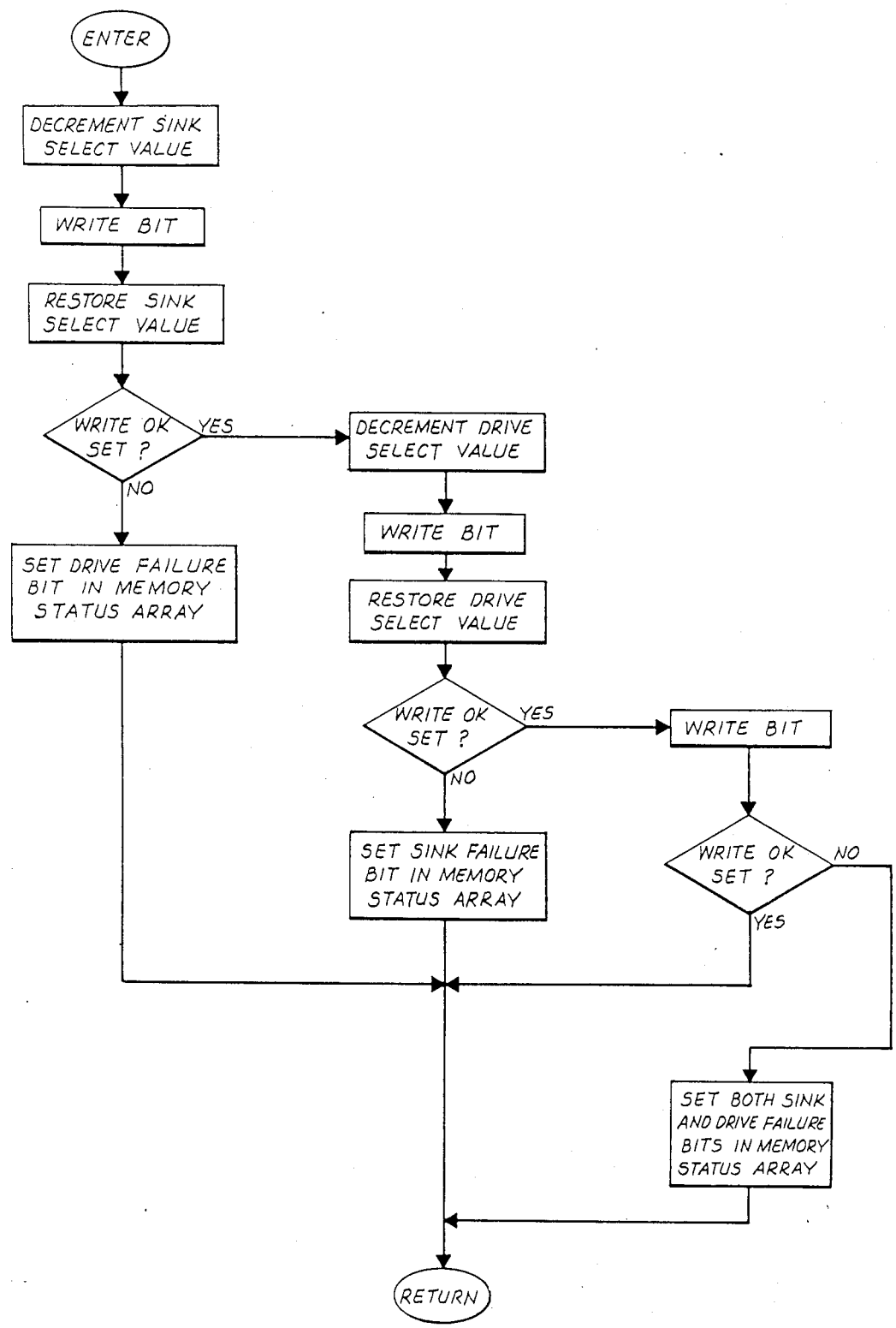
FIG. 31 discloses a flow chart of the preferred embodiment of a failure isolation program referred to in FIG. 30.

Referring to FIGS. 30-31, the specific program disclosed therein will be described. FIG. 30 shows the overall memory test procedure. Generally, the test address, defined by a software-maintained count, for the core memory is initialized to zero and a bit is written to the storage location accessed by the initially addressed set of location selection elements. The program senses the addressed cell to verify if the write was successful. If it was successful, the program determines whether all of the pairs of X-drivers and X-sinks of the preferred embodiment location selection elements have been checked. If not all have been checked, the address counter is incremented to the next X-sink/drive pair. To test the X-sink and X-drive transistors in the preferred embodiment, the addresses for these sinks and drives are started from zero and incremented by one to fifteen since there are sixteen of each in the preferred embodiment.

When the pairs of the X-sinks and X-drives have been tested, the test address is reset to zero and a similar test is performed on the Y-sinks and Y-drives. Because there are thirty-two Y-sinks, but only sixteen Y-drives, the address for the drives is set equal to the sink value divided by two.

If in testing either the pairs of X-sinks and X-drives or the pairs of Y-sinks and Y-drives the write step is not successful, a failure isolation program is run. The failure isolation program is shown in FIG. 31. Through the operation of this program shown in FIG. 31, the inoperable one or ones of the sink and/or drive transistors being tested are determined. First, the sink address is decremented to address the next lower numbered sink that has already passed the test. Another write is attempted whereupon the address of the sink is restored by being incremented to its previous value. If this second write fails, this indicates that the particular driver involved is not functional. This is noted by the software setting the appropriate drive failure bit in a memory status register. One register is kept for X-drives and one is kept for Y-drives. If this second write is accomplished, then the address of the drive is decremented to a previous valid address. A third write is attempted whereupon the address of the drive is restored by being incremented to its previous value and the effectiveness of the write is checked. If this write is not successful, this indicates that the paired sink is inoperable and so the appropriate sink failure bit is set in the respective sink memory status register. As with the drives, there is one register dedicated to the X-sinks and one dedicated to the Y-sinks. If a valid write occurs, a fourth write step is performed. If this fourth write fails, both the sink and drive failure bits are set. If this fourth write step achieves a valid write, the program returns to check the next pair. The physical writing and sensing are done in manners known to the art for writing to and sensing magnetic core memories.

In the preferred embodiment, the memory status registers include two bytes (sixteen bits) each for the sixteen X-drivers, the sixteen X-sinks and the sixteen Y-drivers, but four bytes (thirty-two bits) for the 32 Y-sinks. Each bit in these bytes is associated with a respective one of the associated sinks or drivers. For example, if the fourth X-drive transistor were inoperable, the fourth least significant bit (bit 3, with the first bit being bit 0) within the two-byte X-driver memory status register would be set.

Once the inoperable core memory locations have been determined and the memory status maps constructed in the respective registers, this information can be used by the gauge 2 to avoid inoperable core memory locations. For purposes of address incrementing in the preferred embodiment, the core memory address retained in a suitable memory address register is treated as an eighteen-bit linear address space for use in bit-addressing the 256K×1 bits of memory. However, for purposes of address checking, the address word is segmented into two sets of four segments. The two sets are defined as being the two phases or current flow directions of the Y-select lines as defined by the most significant address bit, bit 17. Each of the four segments provides the address for a respective one of the X-drive, X-sink, Y-drive and Y-sink matrices of transistors. In the preferred embodiment, the segments include the following address bits:

X-drive: A13-A16
X-sink: A9-A12
Y-drive: A5-A8
Y-sink: A0-A4.

That is, the four bits needed to address one of the sixteen X-drive transistors is located in bits 13-16 of the address word. Similarly, the four bits needed to address one of the sixteen X-sink transistors are found in bits 9-12 of the address word, and the address of one of the sixteen Y-drive transistors is found in bits 5-8. The five bits needed to address one of the 32 Y-sink transistors are located in bits 0-4 of the address word.

With the foregoing allocation, the program can look at each segment to determine if the four or five-bit address contained within the segment matches an address field pattern derived from the set bit locations of the driver and sink memory status maps created in accordance with the program shown in FIG. 31. For example, the X-drive memory status map is checked to see if any of the sixteen bits in those bytes have been set to a logical 1. If no set bits are found, there are no bad X-drivers. If there are set bits found, then the bits are converted into corresponding address field patterns. In the preferred embodiment, the address field patterns are the binary equivalent of the bit location within the memory status registers. For example, if the least significant bit of the Y-sink memory status word has a set bit, thereby indicating that the first Y-sink transistor is inoperable, the address field pattern is 00000. If the fourth least significant bit were set, this would correspond to an address field pattern of 00011. Each such field pattern is compared against the address within the corresponding segment of the address word. Whenever a match is found between the address in the address word and the address field pattern, the address in the memory address register is changed until a match no longer occurs. Thus, for the example of the first Y-sink transistor being inoperable, the A0-A4 bits of the memory address word are compared to the field pattern 00000. If bits A0-A4 are 00000, then this address will be changed, such as by being incremented to 00001. This new address is then checked.

Figure 32A:
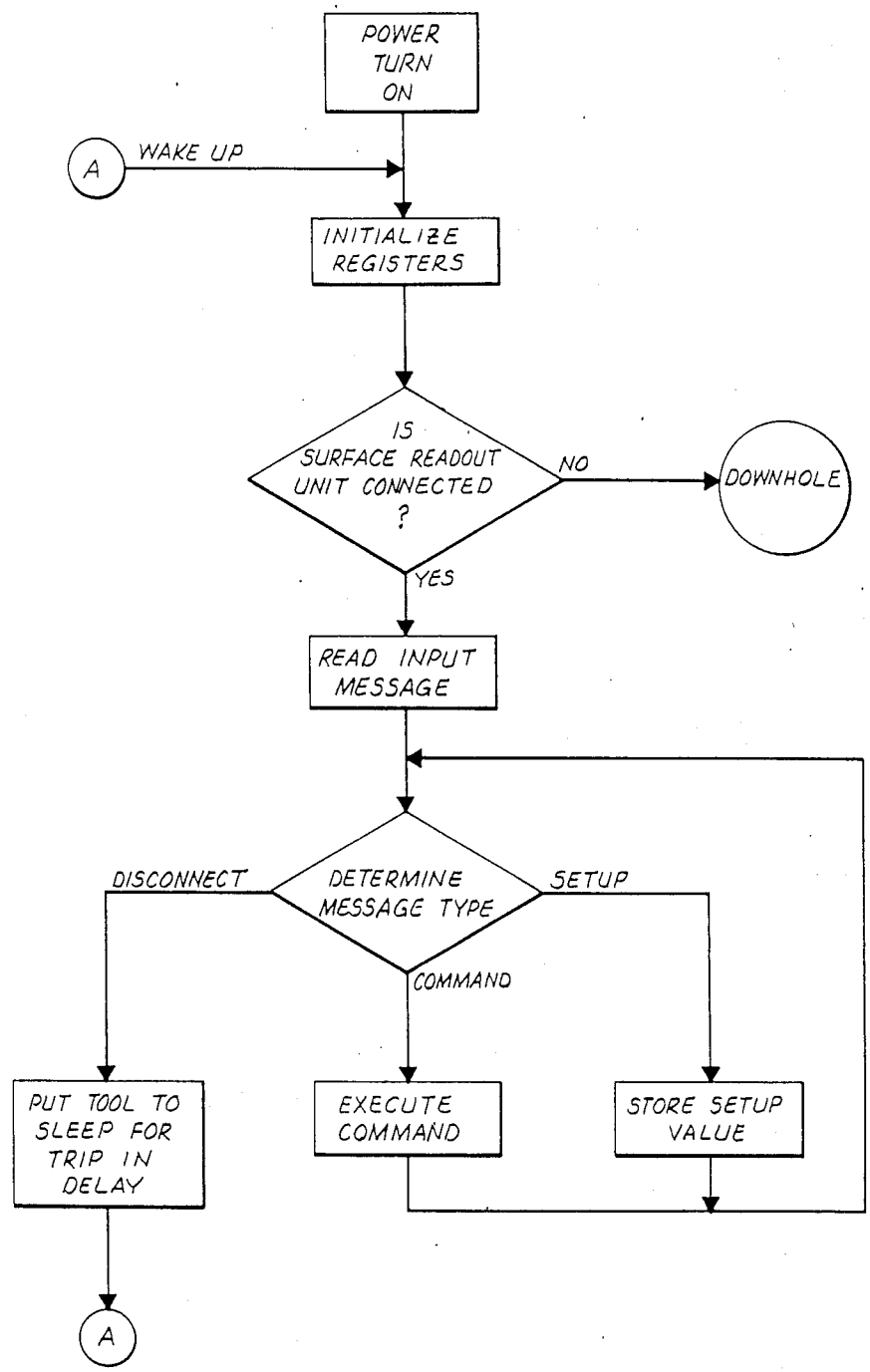
FIGS. 32A–32C disclose a flow chart of the preferred embodiment of a system control program.
Figure 32B:
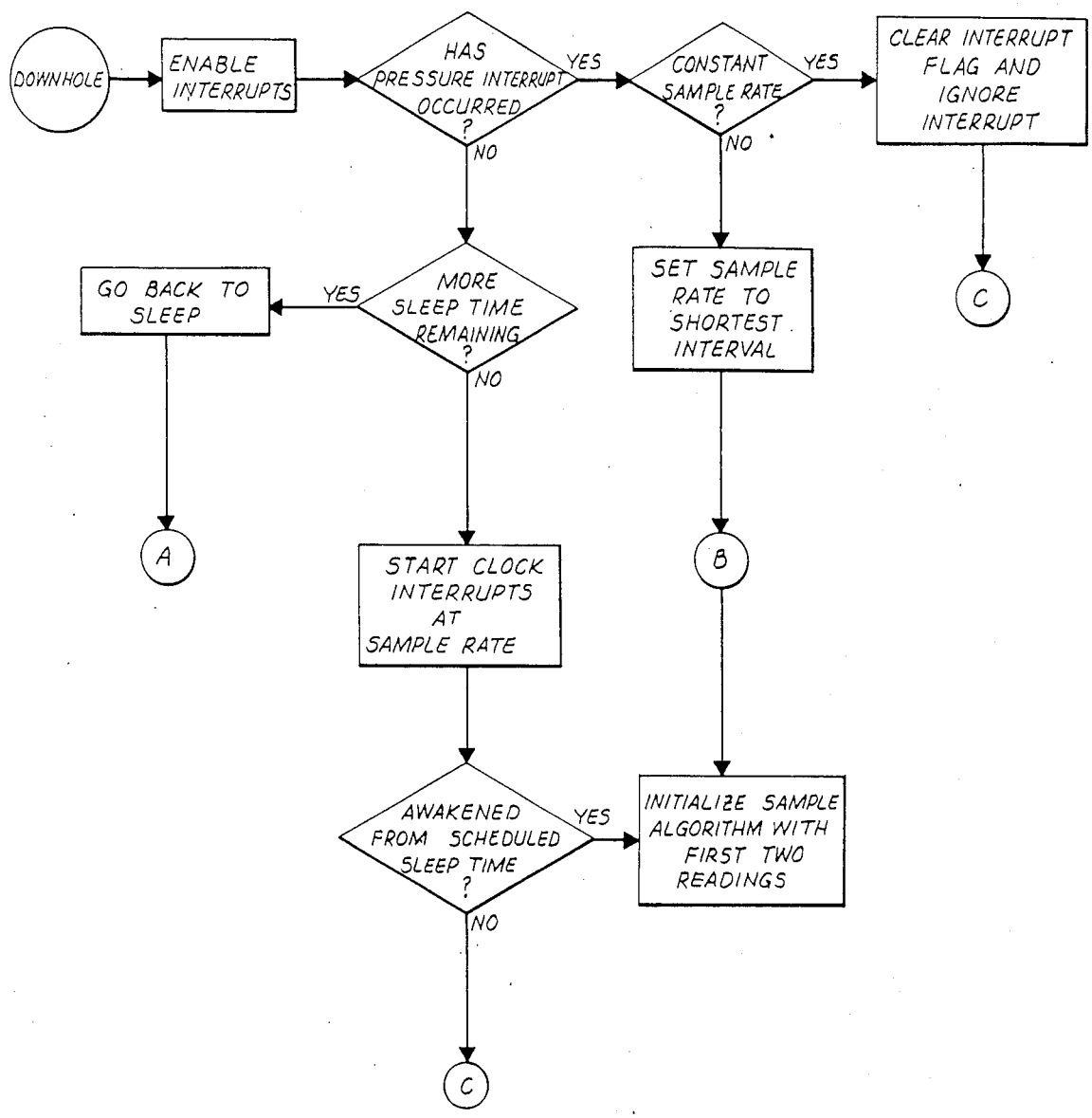
Figure 32C:
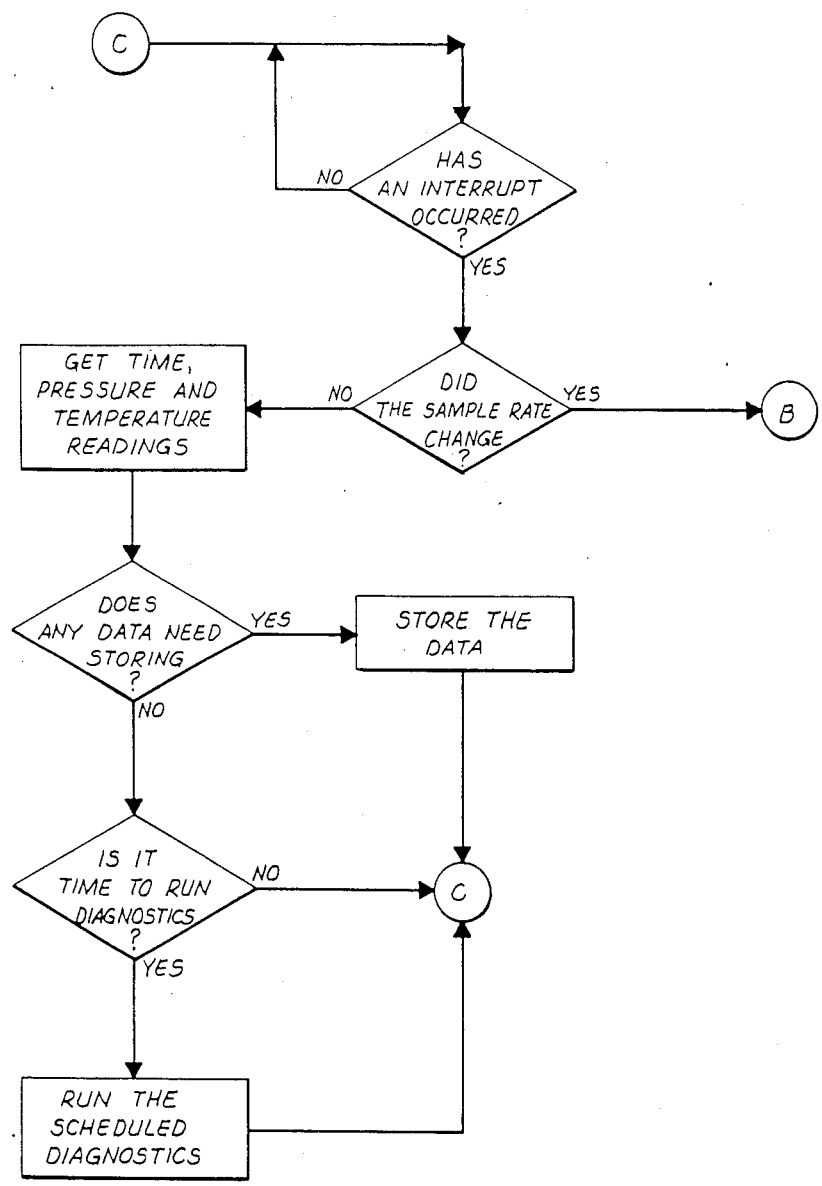

The flow chart for the overall system control program is shown in FIGS. 32A-32C. When the power is applied to the gauge 2, all of the registers are initialized in a manner as known to the art. The program then checks to determine if the surface readout unit is connected. This is done by monitoring the SPAC signal. If the surface readout unit is connected, the system control program reads input messages provided over the D0-D7 lines interconnecting the gauge 2 and the interface 8. The program determines the message type and executes the command or stores the set of values prior to determining the next message time as shown in FIG. 32A. For example, during these steps, any inoperable memory locations can be transferred to the random access memory 154 shown in FIG. 10B, predetermined sleep periods can be entered, and the various parameters for the sample rate control program entered. If the message type is a disconnect message, the program puts the tool to sleep by generating the GO TO SLEEP signal in the manner as previously described.

If the surface readout unit is not connected, the system control program branches to the downhole control portions shown in FIGS. 32B-32C. FIG. 32B shows that the interrupts are enabled and the ΔP interrupt is checked to see if it has occurred. If it has, the program checks to see if the constant sample rate, or fixed sample rate, bit has been set. If it has, it clears the interrupt flag and ignores the interrupt because the tool is to operate with a fixed sample rate regardless of any hardware detected rapid pressure changes. If the constant sample rate has not been selected, the sample rate is set to its shortest interval and the sample rate change program is performed.

If the ΔP interrupt has not occurred, the system control determines if more sleep time is remaining. If there is, the circuit goes back to sleep and returns to point A in the flow chart shown in FIG. 32A. If there is no more sleep time remaining the program loads the sample interval in the counter 216 so that the $\overline{INT}$ signal will be generated when the sample interval is counted and the $\overline{TIME}$ signal is produced. The system control program then determines whether a scheduled sleep time has ended. If it has, the sample rate program is implemented. If not, the program checks whether the $\overline{INT}$ signal shown in FIG. 12B has been generated. Once the $\overline{INT}$ signal is generated, the system control program performs the sample rate control routine if the sample rate changed. If the sample rate did not change, the system control program takes time, pressure and temperature readings, determines whether any data needs storing and stores the data if storage is to occur. These are performed in accordance with the programs depicted by the flow charts shown in FIGS. 27-28. If data are not to be stored, the system control program checks to see if it is time to run diagnostic programs and does so if it is time. If not, the program returns to point C shown at the top of FIG. 32C.

It is respectfully submitted that the foregoing programs can be readily implemented by those having skill in the pertinent arts.

The foregoing description shows that the gauge 2 provides an improved means for detecting physical conditions or parameters in a well bore. The tool monitors and detects, through a selected one of a plurality of transducer sections which provide interfacing with different types of transducers, all important changes in one or more monitored conditions so that none are missed. This is done through the combined use of software and hardware monitoring of at least one selected parameter, such as pressure. The software monitoring occurs at sample intervals and at resolutions which are selected by the gauge itself from initialized tables and in response to suitable changes in the monitored condition. The hardware monitoring detects rigid changes in a monitored condition and forces the gauge to energize itself if it is deenergized and to select the shortest sample interval. It also monitors itself to insure that the microprocessor is operating within proper limits and that meaningful data are collected throughout the entire test period even as the battery life and storage capacity are depleted. The battery life is conserved through selective power control of a variably selectable plurality of portions of the tool and through scheduled and unscheduled sleep periods during which the tool is powered down. The storage capacity is conserved by controlling the sampling so that data during linear regions are generally not stored and by generally storing the changes in the data and not the raw data themselves. Furthermore, it provides increased storage in nonvolatile magnetic core memory configured in a folded, bit-addressing configuration which is capable of operation in the extreme temperature environments found downhole. This memory is also utilized even if it is partially defective through the memory testing and non-functional location mapping and addressing procedures described hereinabove.

The present invention claimed herein provides methods for testing and addressing a magnetic core memory and has been described with reference to its specific use in a self-contained downhole memory gauge system for recording in the memory information related to conditions in a well bore.

The resistor values shown in the drawings are in ohms and those for the capacitors are in microfarads unless otherwise specified; however, it is to be noted that the specified component values are not to be taken as limiting the present invention. Additionally, use of the word "connected" and the like in describing electrical components through the specification and claims primarily connotes electrical relationships unless the context dictates otherwise. Furthermore, although the preferred embodiment has been described with specific reference to sampling pressure and temperature and to controlling functions in response to changes in pressure, for example, the present invention is not limited to sampling and responding to just these parameters. Rather, the present invention broadly contemplates use with any environmental condition which can be sensed and converted into an electrical signal. Other examples of such conditions besides pressure and temperature within the oil and gas industry include, but are not limited to, sensing flow, force, vibration, shear, viscosity, density, salinity, pH, porosity, and resistivity and other logging measurements. Still other examples of uses of the present invention include conducting bubble point tests and sampling fluids.

Thus, the present invention is well adapted to carry out the objects and attain the ends and advantages mentioned above as well as those inherent therein. While preferred embodiments of the invention have been described for the purpose of this disclosure, numerous changes in the construction and arrangement of parts and the performance of steps can be made by those skilled in the art, which changes are encompassed within the spirit of this invention as defined by the appended claims.

What is claimed is:

1. A method of testing a magnetic core memory which has a plurality of X-drive transistors, a plurality of X-sink transistors, a plurality of Y-drive transistors, and a plurality of Y-sink transistors, said method comprising the steps of:
   (a) initializing an address means for addressing the X-drive, X-sink, Y-drive, and Y-sink transistors to a respective start address for the X-drive transistors, the X-sink transistors, the Y-drive transistors, and the Y-sink transistors so that one X-drive transistor, one X-sink transistor, one Y-drive transistor and one Y-sink transistor are initially addressed;
   (b) writing a bit to the magnetic core memory element selected by the addressed X-drive transistor, X-sink transistor, Y-drive transistor and Y-sink transistor;
   (c) sensing whether the bit has been successfully written during step (b);
   (d) if the bit has not been successfully written during step (b) as sensed by step (c), performing a failure isolation test on the addressed X-drive transistor and the X-sink transistor to determine which of these transistors is defective;
   (e) controlling the address means to select the next pair of X-drive and X-sink transistors and repeating steps (b) through (e) until all of the X-drive transistors and X-sink transistors have been tested;
   (f) after step (e), resetting the address means to the respective start address for the X-drive transistors, the X-sink transistors, the Y-drive transistors, and the Y-sink transistors;
   (g) writing a bit to the magnetic core memory element selected by the initially addressed X-drive transistor, X-sink transistor, Y-drive transistor and Y-sink transistor;
   (h) sensing whether the bit has been successfully written during step (g);
   (i) if the bit has not been successfully written during step (g) as sensed during step (h), performing a failure isolation test to determine whether the addressed Y-drive transistor or the Y-sink transistor is defective; and
   (j) controlling the address means to select the next pair of Y-drive and Y-sink transistors and repeating steps (g) through (j) until all of the Y-drive and Y-sink transistors have been tested.

2. A method as defined in claim 1, wherein: step (d) includes the steps of:
   (k) controlling the address means so that the address of the X-sink transistor is changed to a previous address of an X-sink transistor that has already passed the test performed during steps (b) through (e);
   (l) writing a bit to the magnetic core memory element selected by the addressed X-drive transistor and the newly addressed X-sink transistor;
   (m) controlling the address means to return to the address of the X-sink transistor from which the address change occurred during step (k);
   (n) sensing whether the bit has been successfully written during step (l);
   (o) if the bit has not been successfully written during step (l) as sensed during step (n), setting a drive failure bit in a drive memory status register to indicate the X-drive transistor is defective and returning to step (e);
   (p) if the bit has been successfully written during step (l) as sensed during step (n), controlling the address means so that the address of the X-drive transistor is changed to a previous address of an X-drive transistor that has already passed the test performed during steps (b) through (e);
   (q) writing a bit to the magnetic core memory element selected by the addressed X-sink transistor and the newly addressed X-drive transistor;
   (r) controlling the address means to return to the address of the X-drive transistor from which the address change occurred during step (p);
   (s) sensing whether the bit has been successfully written during step (q);
   (t) if the bit has not been successfully written during step (q) as sensed during step (s), setting a sink failure bit in a sink memory status register to indicate the X-sink transistor is defective and returning to step (e);
   (u) if the bit has been successfully written during step (q) as sensed during step (s), writing another bit to the magnetic core memory element selected by the X-drive transistor and X-sink transistor addressed prior to performing step (d);
   (v) sensing whether the bit has been successfully written during step (u) and returning to step (e) if it has; and
   (w) if the bit has not been successfully written during step (u) as sensed during step (v), setting both the sink and drive failure bits in the respective memory status registers; and
   step (i) includes the steps of repeating steps (k) through (w) with respect to the addressed Y-sink transistor and Y-drive transistor.

3. A method of addressing, with a memory address register means for holding a count defining a memory address within a predetermined number of binary bits, a magnetic core memory having a plurality of magnetic core storage locations, each of which is selectable by a predetermined combination of X-drive, X-sink, Y-drive and Y-sink transistors, said method comprising the steps of:
   (a) determining which ones of the X-drive, X-sink, Y-drive and Y-sink transistors are inoperable;
   (b) constructing an X-drive status map designating which X-drive transistors are inoperable;
   (c) constructing an X-sink status map designating which of the X-sink transistors are inoperable;
   (d) constructing a Y-drive status map designating which of the Y-drive transistors are inoperable;
   (e) constructing a Y-sink status map designating which of the Y-sink transistors are inoperable;
   (f) changing the count held in the memory address register means to specify a new memory address;
   (g) testing the changed address in the memory address register means to determine if the new memory address selects an X-drive transistor or an X-sink transistor or a Y-drive transistor or a Y-sink transistor indicated in any of the status maps constructed in steps (b) through (e) to be inoperable and repeating steps (f) and (g) until an address is provided in the memory address register means selecting only operable transistors.

4. The method as defined in claim 3, wherein the step of testing the changed address includes the steps of:

grouping the predetermined number of binary bits defining the memory address into four groups, each of which groups contains the address of a respective one of the X-drive, X-sink, Y-drive and Y-sink transistors;

converting each inoperable-transistor-designating entry in the status maps into a respective address pattern, each respective pattern representing the address of an inoperable transistor; and comparing each respective address pattern derived from each status map with the address defined by the bits in the corresponding respective one of the four groups of the predetermined number of binary bits defining the new memory address and detecting when a respective address pattern matches the address in the corresponding respective one of the four groups to determine whether an inoperable transistor is addressed by the new memory address.

* * * * *